US010516073B2

(12) United States Patent
Ray et al.

(10) Patent No.: US 10,516,073 B2
(45) Date of Patent: *Dec. 24, 2019

(54) LIGHT EMITTING, PHOTOVOLTAIC OR OTHER ELECTRONIC APPARATUS AND SYSTEM

(71) Applicant: NthDegree Technologies Worldwide Inc., Tempe, AZ (US)

(72) Inventors: William Johnstone Ray, Fountain Hills, AZ (US); Mark D. Lowenthal, Gilbert, AZ (US); Neil O. Shotton, Tempe, AZ (US); Richard A. Blanchard, Los Altos Hills, CA (US); Mark Allan Lewandowski, North Port, FL (US); Kirk A. Fuller, Madison, AL (US); Donald Odell Frazier, Huntsville, AL (US)

(73) Assignee: NthDegree Technologies Worldwide Inc, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/835,944

(22) Filed: Dec. 8, 2017

(65) Prior Publication Data

US 2018/0102457 A1    Apr. 12, 2018

Related U.S. Application Data

(63) Continuation of application No. 14/991,926, filed on Jan. 9, 2016, now Pat. No. 9,865,767, which is a
(Continued)

(51) Int. Cl.
*H01L 33/00* (2010.01)
*H01L 33/08* (2010.01)
(Continued)

(52) U.S. Cl.
CPC .............. *H01L 33/00* (2013.01); *B82Y 20/00* (2013.01); *B82Y 30/00* (2013.01); *H01L 21/30* (2013.01);
(Continued)

(58) Field of Classification Search
CPC ......... H01L 33/00; H01L 33/08; H01L 33/20; H01L 33/30; H01L 33/32; H01L 33/34;
(Continued)

(56) References Cited

U.S. PATENT DOCUMENTS 9,865,767 B2 *   1/2018   Ray ........................ B82Y 20/00

* cited by examiner

*Primary Examiner* — Armando Rodriguez
(74) *Attorney, Agent, or Firm* — Nancy R. Gamburd; Gamburd Law Group LLC

(57) ABSTRACT

The present invention provides an electronic apparatus, such as a lighting device comprised of light emitting diodes (LEDs) or a power generating apparatus comprising photovoltaic diodes, which may be created through a printing process, using a semiconductor or other substrate particle ink or suspension and using a lens particle ink or suspension. An exemplary apparatus comprises a base; at least one first conductor; a plurality of diodes coupled to the at least one first conductor; at least one second conductor coupled to the plurality of diodes; and a plurality of lenses suspended in a polymer deposited or attached over the diodes. The lenses and the suspending polymer have different indices of refraction. In some embodiments, the lenses and diodes are substantially spherical, and have a ratio of mean diameters or lengths between about 10:1 and 2:1. The diodes may be LEDs or photovoltaic diodes, and in some embodiments, have a junction formed at least partially as a hemispherical shell or cap.

20 Claims, 40 Drawing Sheets

Related U.S. Application Data continuation of application No. 13/746,191, filed on Jan. 21, 2013, now Pat. No. 9,236,527, which is a continuation of application No. 12/560,340, filed on Sep. 15, 2009, now Pat. No. 8,384,630, which is a continuation-in-part of application No. 11/756,619, filed on May 31, 2007, now Pat. No. 7,972,031, and a continuation-in-part of application No. 11/756,616, filed on May 31, 2007, now Pat. No. 8,889,216, and a continuation-in-part of application No. 12/560,334, filed on Sep. 15, 2009, now Pat. No. 8,395,568, and a continuation-in-part of application No. 12/560,355, filed on Sep. 15, 2009, now Pat. No. 8,456,392, and a continuation-in-part of application No. 12/560,364, filed on Sep. 15, 2009, now Pat. No. 8,456,393, and a continuation-in-part of application No. 12/560,371, filed on Sep. 15, 2009, now Pat. No. 8,133,768.

(51) Int. Cl.

| | |
|---|---|
| *H01L 21/30* | (2006.01) |
| *B82Y 20/00* | (2011.01) |
| *B82Y 30/00* | (2011.01) |
| *H01L 27/32* | (2006.01) |
| *H01L 51/00* | (2006.01) |
| *H01L 51/44* | (2006.01) |
| *H01L 51/52* | (2006.01) |
| *H01L 51/56* | (2006.01) |
| *H01L 31/0352* | (2006.01) |
| *H01L 33/20* | (2010.01) |
| *H01L 31/05* | (2014.01) |
| *H01L 31/054* | (2014.01) |
| *H01L 31/068* | (2012.01) |
| *H01L 31/0475* | (2014.01) |
| *H01L 27/142* | (2014.01) |
| *H01L 27/15* | (2006.01) |
| *H01L 31/028* | (2006.01) |
| *H01L 31/0304* | (2006.01) |
| *H01L 31/0328* | (2006.01) |
| *H01L 33/30* | (2010.01) |
| *H01L 33/32* | (2010.01) |
| *H01L 33/34* | (2010.01) |
| *H01L 33/58* | (2010.01) |
| *H01L 33/60* | (2010.01) |
| *H01L 33/62* | (2010.01) |

(52) U.S. Cl.
CPC .......... *H01L 27/142* (2013.01); *H01L 27/156* (2013.01); *H01L 27/32* (2013.01); *H01L 27/3281* (2013.01); *H01L 31/028* (2013.01); *H01L 31/0304* (2013.01); *H01L 31/0328* (2013.01); *H01L 31/03044* (2013.01); *H01L 31/0352* (2013.01); *H01L 31/035281* (2013.01); *H01L 31/0475* (2014.12); *H01L 31/05* (2013.01); *H01L 31/0504* (2013.01); *H01L 31/0508* (2013.01); *H01L 31/0512* (2013.01); *H01L 31/0543* (2014.12); *H01L 31/0547* (2014.12); *H01L 31/068* (2013.01); *H01L 33/08* (2013.01); *H01L 33/20* (2013.01); *H01L 33/30* (2013.01); *H01L 33/32* (2013.01); *H01L 33/34* (2013.01); *H01L 33/58* (2013.01); *H01L 33/60* (2013.01); *H01L 33/62* (2013.01); *H01L 51/0096* (2013.01); *H01L 51/447* (2013.01); *H01L 51/52* (2013.01); *H01L 51/5203* (2013.01); *H01L 51/5271* (2013.01); *H01L 51/5275* (2013.01); *H01L 51/56* (2013.01); *H01L 51/5265* (2013.01); *H01L 2251/5369* (2013.01); *H01L 2924/0002* (2013.01); *Y02E 10/52* (2013.01); *Y02E 10/547* (2013.01); *Y02E 10/549* (2013.01); *Y02P 70/521* (2015.11)

(58) Field of Classification Search
CPC .......... H01L 33/58; H01L 33/60; H01L 33/62; H01L 31/0475; H01L 31/0543; H01L 31/0547; H01L 31/028; H01L 31/0304; H01L 31/03044; H01L 31/0328; H01L 31/0352; H01L 31/035281; H01L 31/05; H01L 31/0504; H01L 31/0508; H01L 31/0512; H01L 31/068; H01L 27/30; H01L 27/142; H01L 27/156; H01L 27/32; H01L 27/3281; H01L 51/0096; H01L 51/447; H01L 51/52; H01L 51/5203; H01L 51/5271; H01L 51/5275; H01L 51/56

See application file for complete search history.

LIGHT EMITTING, PHOTOVOLTAIC OR OTHER ELECTRONIC APPARATUS AND SYSTEM

CROSS-REFERENCE TO RELATED APPLICATIONS

This application is a continuation of and claims priority to U.S. patent application Ser. No. 14/991,926, filed Jan. 9, 2016, inventors William Johnstone Ray et al., entitled "Light Emitting, Photovoltaic Or Other Electronic Apparatus and System", which is a continuation of and claims priority to U.S. patent application Ser. No. 13/746,191, filed Jan. 21, 2013 and issued Jan. 12, 2016 as U.S. Pat. No. 9,236,527, inventors William Johnstone Ray et al., entitled "Light Emitting, Photovoltaic Or Other Electronic Apparatus and System", which is a continuation of and claims priority to U.S. patent application Ser. No. 12/560,340, filed Sep. 15, 2009 and issued Feb. 26, 2013 as U.S. Pat. No. 8,384,630, inventors William Johnstone Ray et al., entitled "Light Emitting, Photovoltaic Or Other Electronic Apparatus and System", which is commonly assigned herewith, the entire contents of which are incorporated herein by reference with the same full force and effect as if set forth in their entirety herein, and with priority claimed for all commonly disclosed subject matter.

U.S. patent application Ser. No. 12/560,340 is a continuation-in-part of and claims priority to U.S. patent application Ser. No. 11/756,616, filed May 31, 2007 and issued Nov. 18, 2014 as U.S. Pat. No. 8,889,216, inventors William Johnstone Ray et al., entitled "Method of Manufacturing Addressable and Static Electronic Displays", which is commonly assigned herewith, the entire contents of which are incorporated herein by reference with the same full force and effect as if set forth in their entirety herein, and with priority claimed for all commonly disclosed subject matter.

U.S. patent application Ser. No. 12/560,340 also is a continuation-in-part of and claims priority to U.S. patent application Ser. No. 11/756,619, filed May 31, 2007 and issued Jul. 5, 2011 as U.S. Pat. No. 7,972,031, inventors William Johnstone Ray et al., entitled "Addressable or Static Light Emitting or Electronic Apparatus", which is commonly assigned herewith, the entire contents of which are incorporated herein by reference with the same full force and effect as if set forth in their entirety herein, and with priority claimed for all commonly disclosed subject matter.

U.S. patent application Ser. No. 12/560,340 also is a continuation-in-part of and claims priority to U.S. patent application Ser. No. 12/560,334, filed Sep. 15, 2009 and issued Mar. 12, 2013 as U.S. Pat. No. 8,395,568, inventors William Johnstone Ray et al., entitled "Light Emitting, Photovoltaic Or Other Electronic Apparatus and System", which is commonly assigned herewith, the entire contents of which are incorporated herein by reference with the same full force and effect as if set forth in their entirety herein, and with priority claimed for all commonly disclosed subject matter.

U.S. patent application Ser. No. 12/560,340 also is a continuation-in-part of and claims priority to U.S. patent application Ser. No. 12/560,355, filed Sep. 15, 2009 and issued Jun. 4, 2013 as U.S. Pat. No. 8,456,392, inventors William Johnstone Ray et al., entitled "Method Of Manufacturing A Light Emitting, Photovoltaic Or Other Electronic Apparatus and System", which is commonly assigned herewith, the entire contents of which are incorporated herein by reference with the same full force and effect as if set forth in their entirety herein, and with priority claimed for all commonly disclosed subject matter.

U.S. patent application Ser. No. 12/560,340 also is a continuation-in-part of and claims priority to U.S. patent application Ser. No. 12/560,364, filed Sep. 15, 2009 and issued Jun. 4, 2013 as U.S. Pat. No. 8,456,393, inventors William Johnstone Ray et al., entitled "Method Of Manufacturing A Light Emitting, Photovoltaic Or Other Electronic Apparatus and System", which is commonly assigned herewith, the entire contents of which are incorporated herein by reference with the same full force and effect as if set forth in their entirety herein, and with priority claimed for all commonly disclosed subject matter.

U.S. patent application Ser. No. 12/560,340 also is a continuation-in-part of and claims priority to U.S. patent application Ser. No. 12/560,371, filed Sep. 15, 2009, and issued Mar. 13, 2012 as U.S. Pat. No. 8,133,768, inventors William Johnstone Ray et al., entitled "Method Of Manufacturing A Light Emitting, Photovoltaic Or Other Electronic Apparatus and System", which is commonly assigned herewith, the entire contents of which are incorporated herein by reference with the same full force and effect as if set forth in their entirety herein, and with priority claimed for all commonly disclosed subject matter.

STATEMENT REGARDING FEDERALLY SPONSORED RESEARCH OR DEVELOPMENT

This invention was made with Government support under contract SAA8-094274 awarded by NASA. The government has certain rights in this invention.

FIELD OF THE INVENTION

The present invention in general is related to light emitting and photovoltaic technology and, in particular, is related to light emitting, photovoltaic or other electronic apparatus and system and methods of manufacturing a light emitting, photovoltaic or other electronic apparatus or system.

BACKGROUND OF THE INVENTION

Lighting devices having light emitting diodes ("LEDs") have typically required creating the LEDs on a semiconductor wafer using integrated circuit process steps. The wafer is then divided, individual LEDs are placed in a reflective casing, and bonding wires are individually attached to each LED. This is a time consuming, labor intensive and expensive process, resulting in LED-based lighting devices which are generally too expensive for many consumer applications.

Similarly, energy generating devices such as photovoltaic panels have also typically required creating the photovoltaic diodes on a semiconductor wafer or other substrates using integrated circuit process steps. The resulting wafers or other substrates are then packaged and assembled to create the photovoltaic panels. This is also a time consuming, labor intensive and expensive process, resulting in photovoltaic devices which are also too expensive for widespread use without being subsidized or without other governmental incentives.

Other methods of manufacturing photovoltaic devices are also being developed. For example, Hammerbacher et al. U.S. Patent Publication No. 2008/0289688, published Nov. 27, 2008, entitled "Photovoltaic Apparatus Including Spherical Semiconducting Particles", and Hamakawa et al. U.S. Pat. No. 6,706,959, issued Mar. 16, 2004 and entitled "Photovoltaic Apparatus and Mass Producing Apparatus for Mass Producing Spherical Semiconducting Particles" disclose a method which initially uses spherical diodes having a pn junction formed about the entire sphere, but then introduce manufacturing problems by requiring corresponding micromachining of each individual diode to remove a substantial section of the sphere and its pn junction, to form a recess into an inner, core portion. What was initially a spherical diode is micromachined to become significantly or appreciably aspherical, to create a substantially flat, recessed side having an exposed inner, core portion, in order to access either an n-type (or equivalently, N-type) or p-type (or equivalently, P-type) interior substrate portion of the diode for bonding to an electrode. Once micromachined, the individual aspherical diodes must be properly oriented, individually placed, and bonded to conductors at both the exterior and the recessed interior parts of the diode to produce a resulting device. Again, this is also a time consuming, labor intensive and expensive process, with corresponding difficulties for generating widespread use.

Another method of manufacturing photovoltaic devices, disclosed in Ebert U.S. Pat. No. 4,638,110, issued Jan. 20, 1987, entitled "Methods and Apparatus Relating to Photovoltaic Semiconductor Devices", utilizes a clear, solid sheet having an array of curvatures on a first side of the clear solid sheet, to form an integrally formed array of abutting solar concentrating lenses with a single index of refraction. The lens panel further has a flat, second side coupled and fixed to a prefabricated panel, with the prefabricated panel having solid conducting layers separated by an insulating layer. In this method, a laser is stepped along each individual lens of the sheet, which focuses the laser beam to micromachine and bore a corresponding hole into the prefabricated panel through the solid, preformed conductive and insulating layers. The resulting array has a large number of very small bore holes which are then filled with either a semiconductor material or prefabricated diodes to create a photovoltaic cell, with each concentrating lens designed to be fifty to 100 times larger than the resulting photovoltaic cell. Due to the focusing of the lens array, separate solar tracking assemblies are required, to move the entire device to track solar positions, because light is focused on the solar cells from only a small range of angles, with light incident from other angles being focused on other, non-solar cell portions of the prefabricated panel. This micromachining method did not gain wide acceptance, possibly due to many difficulties which were not addressed, such as problems of orienting, aligning and placing prefabricated diodes into each bore hole; difficulty creating a semiconductor in the bore holes having a crystalline structure of sufficient quality for efficient functioning; difficulty forming a pn junction in the region of the bore hole covered by the lens panel (for exposure to the focused light); fabrication problems due to the small sizes of the bore holes; difficulty with consistent filling of the bore holes; difficulty bonding the applied semiconductor materials or prefabricated diodes to create fully functioning and reliable ohmic contacts with the remaining (non-ablated), solid conductive layers preformed in the panel; the creation of short circuits between conductive layers from the laser machining debris, etc., for example and without limitation. In addition, this method and resulting apparatus is not useable for creating addressable or dynamic LED displays.

With regard to light emitting devices, various other light emitting apparatus and methods have been oriented toward increasing the amount of light actually emitted from the light emitting device. For example, Lu U.S. Patent Application Publication 2007/0108459, published May 17, 2007, entitled "Methods of Manufacturing Light Emitting Devices", discloses various lens and light extraction structures and geometries have been developed in attempting to minimize internal reflection, such that light emitted from LEDs is actually output from the device.

Due to such complexities, among other reasons, material and manufacturing costs for photovoltaic devices and LED-based devices has remained too high for widespread adoption. As a consequence, a need remains for light emitting and/or photovoltaic apparatuses which are designed to be less expensive, in terms of incorporated components and in terms of ease of manufacture. A need also remains for methods to manufacture such light emitting or photovoltaic devices using less expensive and more robust processes, to thereby produce LED-based lighting devices and photovoltaic panels which therefore may be available for widespread use and adoption by consumers and businesses.

SUMMARY OF THE INVENTION

The exemplary embodiments of the present invention provide a new type of LED-based lighting devices and photovoltaic devices, and new methods of manufacturing such devices, using printing and coating technologies. The inventive photovoltaic and/or LED-based lighting devices may be fabricated in a wide variety of sizes, from a size comparable to a mobile telephone display, to that of a billboard display (or larger). The exemplary inventive photovoltaic and/or LED-based lighting devices are also robust and capable of operating under a wide variety of conditions, including outdoor and other stressful environmental conditions. The exemplary inventive methods of manufacturing photovoltaic and/or LED-based lighting devices utilize comparatively low temperature processing and create corresponding diodes in situ as the device is being manufactured, rather than utilizing finished or packaged diodes (post-manufacturing) which are then subsequently individually and separately placed into a product in an additional manufacturing cycle. Exemplary inventive lensing structures of the photovoltaic and/or LED-based lighting devices may also provide for mode coupling and a wider angle of incidence or dispersion without separate tracking or other panel movement. The exemplary inventive methods of manufacturing photovoltaic and/or LED-based lighting devices provide for a significantly reduced cost of a finished product, further enabling the widespread adoption of such energy-producing and energy-conserving devices.

In an exemplary embodiment, an apparatus comprises: a base comprising a plurality of spaced-apart channels; a plurality of first conductors coupled to the base, each first conductor in a corresponding channel of the plurality of spaced-apart channels; a plurality of substantially spherical diodes coupled to the plurality of first conductors; a plurality of second conductors coupled to the plurality of substantially spherical diodes; and a plurality of substantially spherical lenses having at least a first index of refraction, the plurality of substantially spherical lenses suspended in a first polymer having at least a second, different index of refraction.

In various exemplary embodiments, substantially all of the plurality of substantially spherical diodes may have a substantially hemispherical shell pn junction. Also in various exemplary embodiments, about fifteen percent to fifty-five percent of a surface of each diode of substantially all of the plurality of substantially spherical diodes may have a penetration layer or region having a first majority carrier or dopant and the remaining diode substrate may have a second majority carrier or dopant. In additional various exemplary embodiments, each diode of the plurality of substantially spherical diodes may comprise a first part having a substantially hemispherical shell or capped pn junction and a second part having at least partially spheroid substrate.

In several exemplary embodiments, a ratio of a mean diameter of the plurality of substantially spherical lenses to a mean diameter of the plurality of substantially spherical diodes may be substantially about five to one (5:1). In other various exemplary embodiments, a ratio of a mean diameter of the plurality of substantially spherical lenses to a mean diameter of the plurality of substantially spherical diodes may be between about ten to one (10:1) and two to one (2:1). In various exemplary embodiments, the comparative size or spacing of the plurality of substantially spherical lenses may provide a mode coupling to the plurality of substantially spherical diodes. Also in various exemplary embodiments, a mean diameter of the plurality of substantially spherical diodes may be greater than about twenty (20) microns and less than about forty (40) microns.

For any of the various exemplary embodiments, the plurality of substantially spherical diodes may be semiconductor light emitting diodes, organic light emitting diodes, encapsulated organic light emitting diodes, polymer light emitting diodes, or photovoltaic diodes. For example, the plurality of substantially spherical diodes may comprise gallium nitride, gallium arsenide, or silicon.

In any of the various exemplary embodiments, a plurality of third conductors may be coupled to the plurality of second conductors. The base may further comprise a reflector or a refractor, such as a Bragg reflector or a reflective plastic or polyester coating. A plurality of conductive vias may extend between a first side and a second side of the base and correspondingly coupled at the first side to the plurality of first conductors. The base also may further comprise a conductive backplane coupled to the plurality of conductive vias and coupled to or integrated with the second side of the base. In various exemplary embodiments, the plurality of conductive vias may comprise a plurality of substantially randomly distributed, substantially spherical conductors.

Also in various exemplary embodiments, a plurality of insulators may be correspondingly coupled to each of the plurality of substantially spherical diodes and may comprise a plurality of inorganic dielectric particles suspended with a photoinitiator compound in a second polymer or resin, or may comprise a photoinitiator compound and a second polymer or resin.

In various exemplary embodiments, the base has a substantially flat overall form factor with or without surface features and has a thickness of less than about two millimeters. For example, the base may comprise at least one of the following: paper, coated paper, plastic coated paper, embossed paper, fiber paper, cardboard, poster paper, poster board, wood, plastic, rubber, fabric, glass, and/or ceramic. The plurality of spaced-apart channels may be substantially parallel, or may be at least partially hemispherically-shaped and are disposed in an array, or may be at least partially parabolic. The base may further comprise a plurality of angled ridges. The plurality of spaced-apart channels also may further comprise a plurality of integrally formed projections or supports. For such an exemplary embodiment, the plurality of first conductors are coupled to the plurality of integrally formed projections or supports within the plurality of spaced-apart channels and the plurality of substantially spherical diodes are alloyed, or annealed, or chemically coupled to the plurality of first conductors.

The plurality of first conductors may comprise a cured conductive ink or a cured conductive polymer. For example, the plurality of first conductors may comprise at least one of the following types of conductors in a cured form: a silver conductive ink, a copper conductive ink, a gold conductive ink, an aluminum conductive ink, a tin conductive ink, a carbon conductive ink, a carbon nanotube polymer, or a conductive polymer. In other various exemplary embodiments, the plurality of first conductors substantially comprise a sputtered, coated, vapor deposited or electroplated metal, metal alloy, or combination of metals, such as, for example, aluminum, copper, silver, nickel, or gold.

The plurality of second conductors may comprise an optically transmissive conductor or conductive compound suspended in a polymer, resin or other media. For example, the plurality of second conductors may comprise at least one of the following compounds suspended in a polymer, resin or other media: carbon nanotubes, antimony tin oxide, indium tin oxide, or polyethylene-dioxithiophene.

In several exemplary embodiments, the plurality of lenses may comprise borosilicate glass or polystyrene latex.

In various exemplary embodiments, the plurality of substantially spherical diodes are annealed or alloyed to or within the plurality of first conductors. In other various exemplary embodiments, the plurality of substantially spherical diodes are chemically coupled to or within the plurality of first conductors. In another exemplary embodiment, the plurality of diodes are coupled to or within the plurality of first conductors by abutment.

An exemplary apparatus or system may further comprise an interface for insertion into a standardized lighting socket, such as an interface compatible with an E12, E14, E26, E27, or GU-10 lighting standard, or an interface for insertion into a standard Edison-type lighting socket, or an interface for insertion into a standard fluorescent-type lighting socket.

Another exemplary embodiment is an apparatus, comprising: a base; at least one first conductor coupled to the base; a plurality of substantially spherical diodes coupled to the at least one first conductor; at least one second conductor coupled to the plurality of substantially spherical diodes; and a plurality of substantially spherical lenses suspended in a first polymer and coupled to the plurality of substantially spherical diodes. In an exemplary embodiment, the plurality of substantially spherical lenses have at least a first index of refraction and the first polymer has at least a second, different index of refraction.

Another exemplary apparatus comprises: a base; at least one first conductor coupled to the base; a plurality of substantially optically resonant diodes coupled to the at least one first conductor; at least one second conductor coupled to the plurality of substantially optically resonant diodes; and a plurality of lenses suspended in a first polymer and coupled to the plurality of substantially optically resonant diodes, the plurality of lenses having at least a first index of refraction and the first polymer having at least a second, different index of refraction. In various exemplary embodiments, the plurality of substantially optically resonant diodes may be substantially spherical, substantially toroidal, or substantially cylindrical. Also in various exemplary embodiments, the plurality of lenses may be substantially spherical, hemispherical, faceted, elliptical, oblong, cubic, prismatic, trapezoidal, triangular, or pyramidal.

In various exemplary embodiments, the apparatus may be flexible, or foldable, or creasable.

An exemplary system is also disclosed, comprising: an interface for insertion into a standardized lighting socket; a base; at least one first conductor coupled to the base; a plurality of substantially spherical diodes coupled to the at least one first conductor, the plurality of substantially spherical diodes having a mean diameter greater than about twenty (20) microns and less than about forty (40) microns; at least one insulator coupled to the plurality of substantially spherical diodes; at least one second conductor coupled to the plurality of substantially spherical diodes; and a plurality of substantially spherical lenses suspended in a polymer and coupled to the plurality of substantially spherical diodes, the plurality of substantially spherical lenses having at least a first index of refraction and the polymer having at least a second, different index of refraction, wherein a ratio of a mean diameter of the plurality of substantially spherical lenses to the mean diameter of the plurality of substantially spherical diodes is between about ten to one (10:1) and two to one (2:1).

Another exemplary apparatus comprises: a base having a plurality of spaced-apart channels, each channel of the plurality of spaced-apart channels comprising a plurality of integrally formed projections; a conductive backplane coupled to or integrally formed with the base; a plurality of conductive vias within the base and coupled to the conductive backplane; at least one first conductor coupled to the plurality of conductive vias and to the integrally formed projections; a plurality of substantially spherical diodes coupled to the at least one first conductor, about fifteen percent to fifty-five percent of a surface of each diode of substantially all of the plurality of substantially spherical diodes has a penetration layer or region having a first majority carrier or dopant and the remaining diode substrate has a second majority carrier or dopant; at least one second conductor coupled to the plurality of substantially spherical diodes; and a plurality of substantially spherical lenses suspended in a polymer and coupled to the plurality of substantially spherical diodes.

In several exemplary embodiments, an apparatus comprises: a base comprising a plurality of spaced-apart channels; a plurality of first conductors coupled to the base, each first conductor in a corresponding channel of the plurality of spaced-apart channels; a plurality of diodes coupled to the plurality of first conductors; a plurality of second conductors coupled to the plurality of diodes; and a plurality of substantially spherical lenses having at least a first index of refraction, the plurality of substantially spherical lenses suspended in a first polymer having at least a second, different index of refraction. In various exemplary embodiments, the plurality of diodes may be substantially spherical, substantially toroidal, substantially cylindrical, substantially faceted, substantially rectangular, substantially flat, or substantially elliptical.

In another exemplary embodiment, an apparatus comprises: a base; at least one first conductor coupled to the base; a plurality of diodes coupled to the at least one first conductor; at least one second conductor coupled to the plurality of diodes; and a plurality of substantially spherical lenses suspended in a first polymer and coupled to the plurality of diodes. In several exemplary embodiments, the plurality of substantially spherical lenses may have at least a first index of refraction and the first polymer has at least a second, different index of refraction.

An exemplary system also may comprise: an interface for insertion into a standardized lighting socket; a base; at least one first conductor coupled to the base; a plurality of diodes coupled to the at least one first conductor; at least one second conductor coupled to the plurality of diodes; and a plurality of lenses suspended in a first polymer and coupled to the plurality of diodes, the plurality of lenses having at least a first index of refraction and the first polymer having at least a second, different index of refraction. In various exemplary embodiments, the plurality of diodes may be substantially spherical, substantially toroidal, substantially cylindrical, substantially faceted, substantially rectangular, substantially flat, or substantially elliptical, and the plurality of lenses may be substantially spherical, hemispherical, faceted, elliptical, oblong, cubic, prismatic, trapezoidal, triangular, or pyramidal.

In an exemplary embodiment, an apparatus comprises: a base; at least one first conductor coupled to the base; a plurality of diodes coupled to the at least one first conductor, about fifteen percent to fifty-five percent of a surface of each diode of substantially all of the plurality of diodes having a layer or region having a first majority carrier or dopant and the remaining diode substrate having a second majority carrier or dopant; at least one second conductor coupled to the plurality of diodes; and a plurality of lenses suspended in a first polymer and coupled to the plurality of diodes, the plurality of lenses having at least a first index of refraction and the first polymer having at least a second, different index of refraction.

Another exemplary apparatus comprises: a base; at least one first conductor coupled to the base; a plurality of diodes coupled to the at least one first conductor; at least one second conductor coupled to the plurality of diodes; and a lens structure coupled to the plurality of diodes, the lens structure comprising a plurality of lenses and further having a plurality of indices of refraction, wherein a ratio of a mean diameter or length of the plurality of lenses to a mean diameter or length of the plurality of diodes of is between about ten to one (10:1) and two to one (2:1).

Various exemplary embodiments also comprise method of manufacturing an electronic apparatus, with an exemplary method comprising: forming a plurality of first conductors coupled to a base; coupling a plurality of substantially spherical substrate particles to the plurality of first conductors; subsequent to the coupling to the plurality of first conductors, converting the plurality of substantially spherical substrate particles into a plurality of substantially spherical diodes; and forming a plurality of second conductors coupled to the plurality of substantially spherical diodes.

An exemplary method may further comprise depositing a plurality of substantially spherical lenses suspended in a first polymer, and in various exemplary embodiments, the plurality of substantially spherical lenses may have at least a first index of refraction and wherein the first polymer may have at least a second, different index of refraction. The step of depositing may further comprise printing the plurality of substantially spherical lenses suspended in the first polymer over the plurality of substantially spherical diodes and the plurality of second conductors.

An exemplary method embodiment may further comprise attaching a prefabricated layer to the plurality of substantially spherical diodes, the prefabricated layer comprising a plurality of substantially spherical lenses suspended in a first polymer. In various exemplary embodiments, the step of forming the plurality of first conductors may further comprise depositing a first conductive medium within a plurality of channels in the base, such as a conductive ink or a conductive polymer. An exemplary method embodiment may further comprise partially curing the first conductive medium, and the step of coupling the plurality of substantially spherical substrate particles to the plurality of first conductors may further comprise depositing within the plurality of channels the plurality of substantially spherical substrate particles suspended in a carrier medium; and fully curing the first conductive medium.

In several exemplary embodiments, the step of depositing a first conductive medium may comprise sputtering, coating, vapor depositing or electroplating a metal, a metal alloy, or a combination of metals.

In various exemplary embodiments, the step of coupling the plurality of substantially spherical substrate particles to the plurality of first conductors may further comprise depositing within the plurality of channels the plurality of substantially spherical substrate particles suspended in a reactive carrier medium; removing the reactive carrier medium; and curing or re-curing the first conductive medium. In other various exemplary embodiments, the step of coupling the plurality of substantially spherical substrate particles to the plurality of first conductors may further comprise depositing within the plurality of channels the plurality of substantially spherical substrate particles suspended in an anisotropic conductive medium; and compressing the plurality of substantially spherical substrate particles suspended in the anisotropic conductive medium. In other various exemplary embodiments, the step of coupling the plurality of substantially spherical substrate particles to the plurality of first conductors may further comprise depositing within the plurality of channels the plurality of substantially spherical substrate particles suspended in a volatile carrier medium; and evaporating the volatile carrier medium. In yet other various exemplary embodiments, the step of coupling the plurality of substantially spherical substrate particles to the plurality of first conductors may further comprise depositing within the plurality of channels the plurality of substantially spherical substrate particles suspended in a carrier medium; and annealing or alloying the plurality of substantially spherical substrate particles within the plurality of channels.

In several exemplary embodiments, when the plurality of first conductors are coupled to a plurality of integrally formed projections or supports within the plurality of spaced-apart channels, the step of coupling the plurality of substantially spherical substrate particles to the plurality of first conductors may further comprise depositing within the plurality of channels the plurality of substantially spherical substrate particles suspended in a carrier medium; and annealing, or alloying, or chemically coupling the plurality of substantially spherical substrate particles to the plurality of first conductors.

In various exemplary embodiments, when each substantially spherical substrate particle of the plurality of substantially spherical substrate particles comprises a semiconductor, the step of converting the plurality of substantially spherical substrate particles into the plurality of substantially spherical diodes may further comprise forming a pn junction in each substantially spherical substrate particle by depositing a dopant material onto the plurality of substantially spherical substrate particles and annealing or alloying the dopant material with the plurality of substantially spherical substrate particles. For example, the annealing or alloying may be laser or thermal annealing or alloying, and the dopant material may be a substrate liquid or film, or a dopant material may be a dopant element or compound suspended in a carrier. In several exemplary embodiments, the dopant material may be deposited on a first, upper portion of the plurality of substantially spherical substrate particles to form a substantially hemispherical shell or capped pn junction.

In several exemplary embodiments, when the plurality of substantially spherical substrate particles comprise a first organic or polymer compound, the step of converting the plurality of substantially spherical substrate particles into the plurality of substantially spherical diodes may further comprise depositing a second organic or polymer compound onto the plurality of substantially spherical substrate particles.

An exemplary method embodiment may further comprise depositing a plurality of third conductors over or within the plurality of second conductors; or coupling a reflector or a refractor to the base, such as a Bragg reflector or a reflective plastic or polyester coating; or attaching an interface for insertion into a standardized lighting socket. An exemplary method embodiment may further comprise depositing a plurality of inorganic dielectric particles suspended with a photoinitiator compound in a second polymer or resin to form a plurality of insulators correspondingly coupled to each of the plurality of substantially spherical diodes.

In various exemplary embodiments, the step of forming the plurality of second conductors may further comprise depositing an optically transmissive conductor or conductive compound suspended in a polymer, resin or other media. Also in various exemplary embodiments, the forming, coupling and converting steps are performed by or through a printing process.

Another exemplary method of manufacturing an electronic apparatus is also disclosed, with the exemplary method comprising: forming at least one first conductor coupled to a base; coupling a plurality of substantially spherical substrate particles to the at least one first conductor; converting the plurality of substantially spherical substrate particles into a plurality of substantially spherical diodes; and forming at least one second conductor coupled to the plurality of substantially spherical diodes. In several exemplary embodiments, an exemplary method may further comprise depositing a plurality of substantially spherical lenses suspended in a first polymer, wherein the plurality of substantially spherical lenses have at least a first index of refraction and wherein the first polymer has at least a second, different index of refraction. In other various exemplary embodiments, an exemplary method may further comprise attaching a prefabricated layer to the plurality of substantially spherical diodes, with the prefabricated layer comprising a plurality of substantially spherical lenses suspended in a first polymer, wherein the plurality of substantially spherical lenses have at least a first index of refraction and wherein the first polymer has at least a second, different index of refraction.

Also in an exemplary embodiment, the step of forming the at least one first conductor may further comprise depositing a first conductive medium, such as a silver conductive ink, a copper conductive ink, a gold conductive ink, an aluminum conductive ink, a tin conductive ink, a carbon conductive ink, a carbon nanotube polymer, or a conductive polymer. In several exemplary embodiments, the step of depositing a first conductive medium comprises sputtering, coating, vapor depositing or electroplating a metal, a metal alloy, or a combination of metals, such as aluminum, copper, silver, nickel, or gold.

Another exemplary method of manufacturing a light emitting electronic apparatus is disclosed, with the exemplary method comprising: forming at least one first conductor coupled to a base; coupling a plurality of substantially spherical substrate particles to the at least one first conductor; subsequent to the coupling to the at least one first conductor, converting the plurality of substantially spherical substrate particles into a plurality of substantially spherical light emitting diodes, the plurality of substantially spherical light emitting diodes having a mean diameter greater than about twenty (20) microns and less than about forty (40)

microns; forming at least one second conductor coupled to the plurality of substantially spherical light emitting diodes; depositing a plurality of substantially spherical lenses suspended in a polymer, the plurality of substantially spherical lenses having at least a first index of refraction and the polymer having at least a second, different index of refraction, wherein a ratio of a mean diameter of the plurality of substantially spherical lenses to a mean diameter of the plurality of substantially spherical light emitting diodes is between about ten to one (10:1) and two to one (2:1); and attaching an interface for insertion into a standardized lighting socket Another exemplary method of manufacturing an electronic apparatus is disclosed and comprises: forming at least one first conductor coupled to a base; coupling a plurality of substantially spherical substrate particles to the at least one first conductor; subsequent to the coupling to the at least one first conductor, converting the plurality of substantially spherical substrate particles into a plurality of substantially spherical diodes, about fifteen percent to fifty-five percent of a surface of each diode of substantially all of the plurality of substantially spherical diodes having a penetration layer or region having a first majority carrier or dopant and the remaining diode substrate having a second majority carrier or dopant; forming at least one second conductor coupled to the plurality of substantially spherical diodes; and depositing a plurality of substantially spherical lenses suspended in a polymer, the plurality of substantially spherical lenses having at least a first index of refraction and the polymer having at least a second, different index of refraction.

Another exemplary method of manufacturing an electronic apparatus comprises: forming a plurality of first conductors coupled to a base; coupling a plurality of substrate particles to the plurality of first conductors; subsequent to the coupling to the plurality of first conductors, converting the plurality of substrate particles into a plurality of diodes; forming a plurality of second conductors coupled to the plurality of diodes; and depositing a plurality of substantially spherical lenses suspended in a first polymer, the plurality of substantially spherical lenses having at least a first index of refraction and the first polymer having at least a second, different index of refraction. In several exemplary embodiments, the plurality of diodes may be substantially spherical, substantially toroidal, substantially cylindrical, substantially faceted, substantially rectangular, substantially flat, or substantially elliptical. The step of depositing may further comprise printing the plurality of substantially spherical lenses suspended in the first polymer over the plurality of diodes and the plurality of second conductors.

Yet another exemplary method of manufacturing an electronic apparatus comprises: forming at least one first conductor coupled to a base; coupling a plurality of substrate particles to the at least one first conductor; subsequent to the coupling to the at least one first conductor, converting the plurality of substrate particles into a plurality of diodes; forming at least one second conductor coupled to the plurality of substantially spherical diodes; and depositing a plurality of substantially spherical lenses suspended in a first polymer, wherein the plurality of substantially spherical lenses have at least a first index of refraction and wherein the first polymer has at least a second, different index of refraction.

Another exemplary method embodiment for manufacturing an electronic system is also disclosed and comprises: forming at least one first conductor coupled to a base; coupling a plurality of substrate particles to the at least one first conductor; converting the plurality of substrate particles into a plurality of substantially optically resonant diodes; forming at least one second conductor coupled to the plurality of substantially optically resonant diodes; depositing a plurality of lenses suspended in a first polymer, wherein the plurality of lenses have at least a first index of refraction and wherein the first polymer has at least a second, different index of refraction; and attaching an interface for insertion into a standardized lighting socket.

In various exemplary embodiments, a method of manufacturing an electronic apparatus may comprise: depositing a first conductive medium within a plurality of channels of a base to form a plurality of first conductors; depositing within the plurality of channels a plurality of semiconductor substrate particles suspended in a carrier medium; forming an ohmic contact between each semiconductor substrate particle of the plurality of semiconductor substrate particles and a first conductor of the plurality of first conductors; converting the plurality of semiconductor substrate particles into a plurality of semiconductor diodes; depositing a second conductive medium to form a plurality of second conductors coupled to the plurality of semiconductor diodes; and depositing a plurality of lenses suspended in a first polymer over the plurality of diodes. For example, the deposition steps may further comprise at least one of the following types of deposition: printing, coating, rolling, spraying, layering, sputtering, lamination, screen printing, inkjet printing, electro-optical printing, electroink printing, photoresist printing, thermal printing, laser jet printing, magnetic printing, pad printing, flexographic printing, hybrid offset lithography, or Gravure printing. Also for example, the step of depositing the first conductive medium may further comprise coating the plurality of channels with the first conductive medium and removing excess first conductive medium by scraping a first surface of the base using a doctor blade, and similarly, the step of depositing the plurality of semiconductor substrate particles may further comprise coating the plurality of channels with the plurality of semiconductor substrate particles suspended in a carrier medium and removing excess plurality of spherical substrate particles by scraping a first surface of the base using a doctor blade.

Yet another exemplary method of manufacturing an electronic apparatus comprises: depositing a first conductive medium on a base to form at least one first conductor; depositing a plurality of semiconductor substrate particles suspended in a carrier medium; forming an ohmic contact between the plurality of semiconductor substrate particles and the at least one first conductor; forming a pn junction in each semiconductor substrate particle by depositing a dopant onto the plurality of semiconductor substrate particles and annealing the plurality of semiconductor substrate particles to form a plurality of semiconductor diodes; depositing a second conductive medium to form at least one second conductor coupled to the plurality of semiconductor diodes; and depositing a plurality of substantially spherical lenses suspended in a first polymer over the plurality of diodes, the plurality of substantially spherical lenses having at least a first index of refraction and the first polymer having at least a second, different index of refraction.

In another exemplary embodiment, a method of manufacturing an electronic apparatus comprises: printing a first conductive medium within a plurality of cavities of a base to form a plurality of first conductors; printing within the plurality of cavities a plurality of substantially spherical substrate particles suspended in a carrier medium; printing a dopant on first, upper portion the plurality of substantially spherical semiconductor substrate particles; annealing the doped plurality of substantially spherical semiconductor substrate particles to form a plurality of substantially spherical diodes having at least a partially hemispherical shell pn junction; printing an electrically insulating medium over a first portion of the plurality of substantially spherical diodes; printing a second conductive medium over a second portion of the plurality of substantially spherical diodes to form a plurality of second conductors; and printing a plurality of substantially spherical lenses suspended in a first polymer over the plurality of substantially spherical diodes, the plurality of substantially spherical lenses having at least a first index of refraction and the first polymer having at least a second, different index of refraction.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF EXEMPLARY EMBODIMENTS

Figure 1:
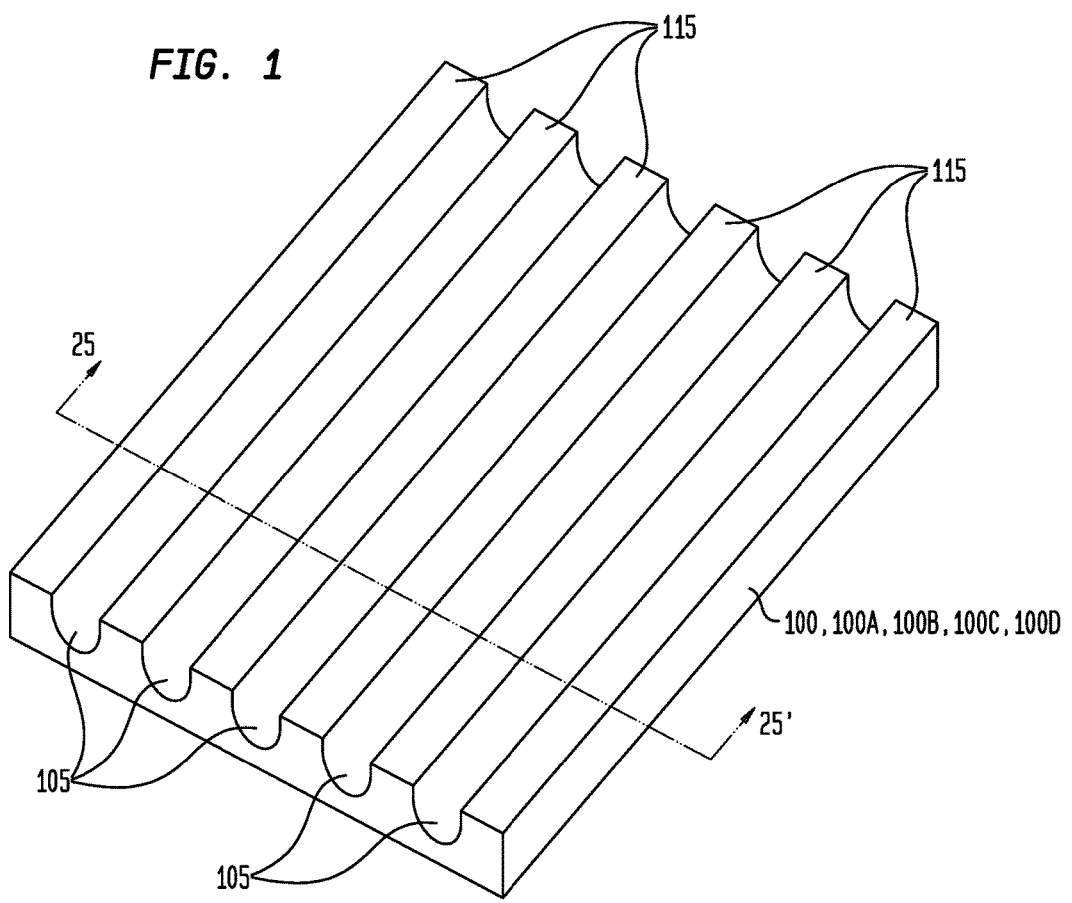
FIG. 1 is a perspective view of an exemplary base for an apparatus embodiment in accordance with the teachings of the present invention.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Figure 2:
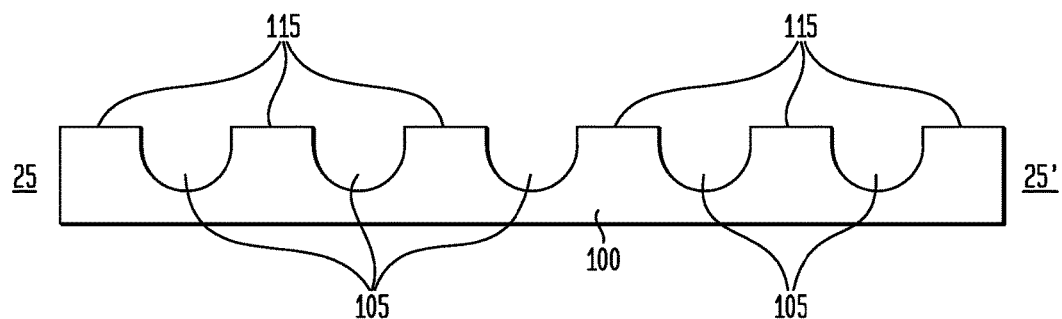
FIG. 2 is a cross-sectional view of a first exemplary base for an apparatus embodiment in accordance with the teachings of the present invention.
Figure 3:
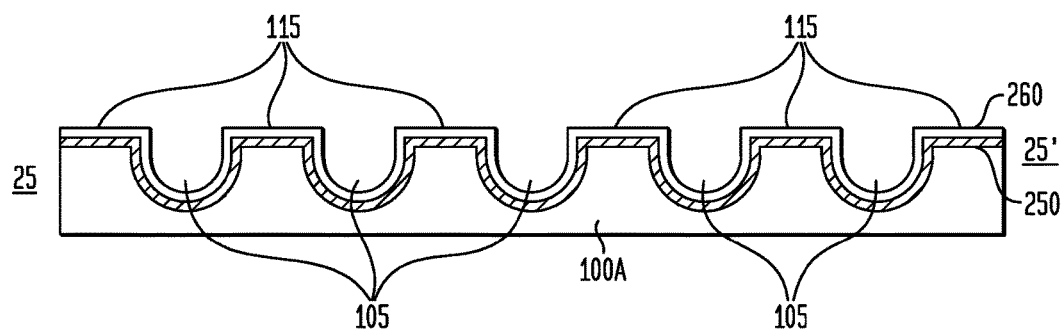
FIG. 3 is a cross-sectional view of a second exemplary base for an apparatus embodiment in accordance with the teachings of the present invention.
Figure 4:
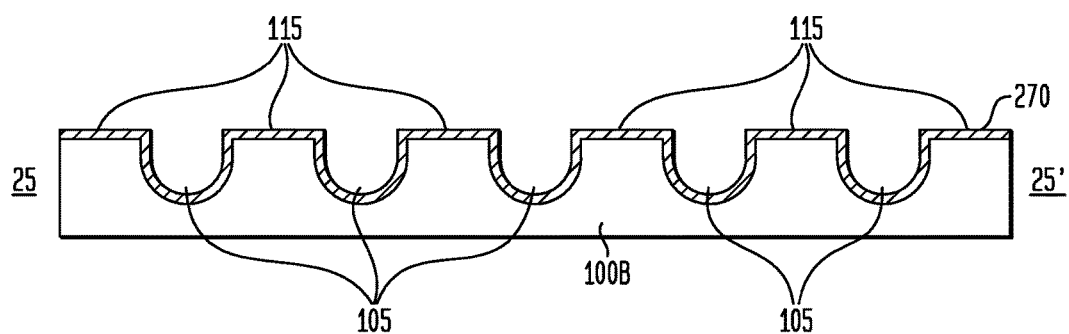
FIG. 4 is a cross-sectional view of a third exemplary base for an apparatus embodiment in accordance with the teachings of the present invention.
Figure 5:
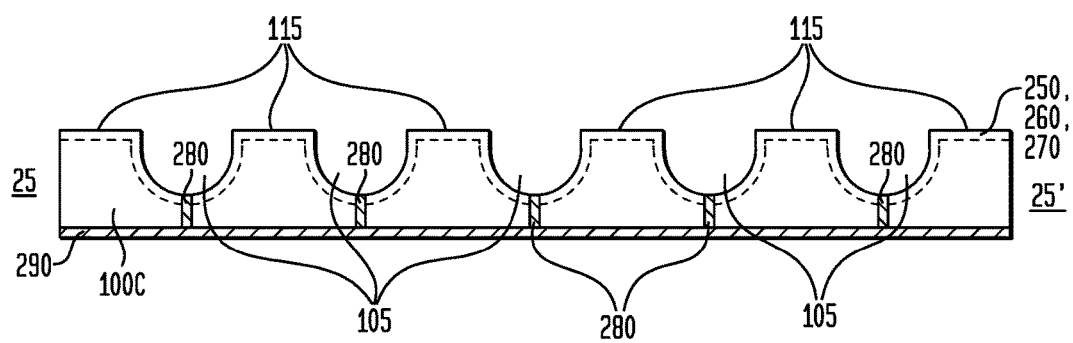
FIG. 5 is a cross-sectional view of a fourth exemplary base for an apparatus embodiment in accordance with the teachings of the present invention.

For selected embodiments, the invention disclosed herein is related to U.S. patent application Ser. No. 11/756,616, filed May 31, 2007, inventors William Johnstone Ray et al., entitled "Method of Manufacturing Addressable and Static Electronic Displays" and to U.S. patent application Ser. No. 11/756,619, filed May 31, 2007, inventors William Johnstone Ray et al., entitled "Addressable or Static Light Emitting or Electronic Apparatus" (the "related applications"), which are commonly assigned herewith, the con- FIG. 1 is a perspective view of an exemplary base 100, 100A, 100B, 100C, 100D for an apparatus embodiment in accordance with the teachings of the present invention. FIG. 2 is a cross-sectional view (through the 25-25' plane) of a first exemplary base 100 for an apparatus embodiment in accordance with the teachings of the present invention. FIG. 3 is a cross-sectional view (through the 25-25' plane) of a second exemplary base 100A for an apparatus embodiment in accordance with the teachings of the present invention. FIG. 4 is a cross-sectional view (through the 25-25' plane) of a third exemplary base 100B for an apparatus embodiment in accordance with the teachings of the present invention. FIG. 5 is a cross-sectional view (through the 25-25' plane) of a fourth exemplary base 100C for an apparatus embodiment in accordance with the teachings of the present invention. It should be noted that in many of the various perspective or lateral views (such as FIGS. 1, 6, 11, 13, 16, 18, 21, 26, 28, 34, 35), any one or more corresponding bases 100 may be utilized, with various cross sections (such as FIGS. 2-5, 7, 8, 12, 14, 15, 17, 19, 20, 22, 27, 29) considered particular exemplary instances or instantiations when that corresponding base is utilized as shown in a corresponding perspective view. It also should be noted that any reference to apparatus, such as an apparatus 200, 300, 400, 500, 600 and/or 700, should be understood to mean and include its or their variants, and vice-versa, including apparatuses 200A, 200B, 300A, 300B, 400A, 400B, 500A, 500B, 600A, 600B, 700A, and 700B discussed below. In addition, it should be noted that apparatuses 200, 200A, 200B, 300, 300A, 300B, 400, 400A, 400B, 500, 500A, 500B, 600, 600A, 600B, 700A, and 700B may differ from one another concerning any one or more of the following, as discussed in greater detail below: (1) the existence of and/or shape of any cavities, channels or grooves 105 within their corresponding bases 100; (2) the shape of the substrate (or semiconductor) particles 120 and/or lenses 150; (3) having single layers of conductors and insulators, rather than pluralities; (4) inclusion of integrally formed or other conductive vias 280, 285; (5) inclusion of a backplane 290; (6) deposition methods utilized to create the corresponding apparatuses; etc. Further, apparatuses 200A, 300A, 400A, 500A, 600A, 700A, differ from apparatuses 200B, 300B, 400B, 500B, 600B, 700B insofar as incorporated diodes 155 are light emitting diodes for apparatuses 200A, 300A, 400A, 500A, 600A, 700A and photovoltaic diodes for apparatuses 200B, 300B, 400B, 500B, 600B, 700B, also as discussed in greater detail below. Otherwise, any reference to any feature or element of any of an apparatus 200, 300, 400, 500, 600 and/or 700 should be understood to be equally applicable to any of the other apparatus 200, 300, 400, 500, 600 and/or 700 embodiments, individually and/or with combinations of such features or elements, such that any apparatus 200, 300, 400, 500, 600 and/or 700 may include or comprise any of the elements of any of the other apparatus 200, 300, 400, 500, 600 and/or 700 embodiments, in any combination. In addition, any and all of the various deposition, process and/or other manufacturing steps are applicable to any of the various apparatuses 200, 300, 400, 500, 600 and/or 700.

It should also be noted that the term "substrate" may utilized to refer to two different components, a base (supporting or foundational substrate) 100 (including 100A-100H) which forms a base or support for other components, and which may be referred to herein equivalently as a "substrate" in the related applications, such as for printing various layers on a substrate, and a plurality of substrate particles 120, such as a plurality of semiconductor, polymer, or organic light emitting or photovoltaic substrate particles utilized to form corresponding diodes 155. Those having skill in the art will recognize that these various substrates are different based upon both the context and the corresponding reference numerals, and to avoid confusion, a supporting- or foundational-type substrate will be referred to herein as a "base", with "substrate" utilized in the typical sense of the electronics and/or semiconductor art to mean and refer to the material comprising substrate particles 120.

As illustrated in FIGS. 1 through 5, an exemplary base 100, 100A, 100B, 100C, 100D (and 100E-100G discussed below) includes a plurality of cavities (channels, trenches or voids) 105, which for the selected embodiment, are formed as elongated cavities, effectively forming channels, grooves or slots (or, equivalently, depressions, valleys, bores, openings, gaps, orifices, hollows, slits, passages, or corrugations), which are separated from each other by a corresponding plurality of ridges (peaks, raised portions or crests) 115 of the exemplary base 100, 100A-100G. While the cavity, channel or groove 105 for bases 100, 100A, 100B, 100C, 100D is illustrated as curved (semi-circular or semi-elliptical) and extending substantially straight (in the direction perpendicular to the 25-25' plane), any and all cavities, channels or grooves 105 of any shape and/or size and extending in any one or more directions are considered equivalent and within the scope of the invention as claimed, including without limitation square, rectangular, curvilinear, wavy, irregular, differently sized, etc., with additional exemplary shapes of cavities, channels or grooves 105 illustrated in other Figures and discussed below. The plurality of cavities, channels or grooves 105 are spaced-apart, and as illustrated separated from each other by the ridges (peaks, raised portions or crests) 115, and will be utilized to shape and define a plurality of first conductors 110 for selected embodiments, as discussed below. While the cavities or channels 105 are illustrated in FIG. 1 and other Figures as substantially parallel and oriented in substantially the same direction, those having skill in the art will recognize that innumerable variations are available, including depth and width of the channels, channel direction or orientation (e.g., circular, elliptical, curvilinear, wavy, sinusoidal, triangular, fanciful, artistic, irregular, etc.), spacing variations, type of void or cavity (e.g., channel, depression or bore), etc., and all such variations are considered equivalent and within the scope of the present invention. Bases 100 having additional forms are also illustrated and discussed below with reference to FIGS. 9, 10, 23-25, 30-33, and 37-39. For example, an exemplary base 100H which has a substantially flat overall form factor and is without any significant surface variation (i.e., does not have any cavities, channels or grooves 105) is illustrated and discussed below with reference to FIGS. 37-39.

A base 100, 100A, 100B, 100C, 100D (and the other bases 100E, 100F, 100G, 100H discussed below) may be formed from or comprise any suitable material, such as plastic, paper, cardboard, or coated paper or cardboard, for example and without limitation. In an exemplary embodiment, a base 100 (including 100A, 100B, 100C, 100D, 100E, 100F and/or 100G) comprises an embossed and coated paper or plastic having the plurality of cavities 105 formed integrally therein, such as through a molding process, including an embossed paper or embossed paper board commercially available from Sappi, Ltd., for example. Also in an exemplary embodiment, base 100 (including 100A, 100B, 100C, 100D, 100E, 100F, 100G and/or 100H) comprises a material having a dielectric constant capable of or suitable for providing substantial electrical insulation. A base 100, 100A, 100B, 100C, 100D, 100E, 100F, 100G, 100H may comprise, also for example, any one or more of the following: paper, coated paper, plastic coated paper, fiber paper, cardboard, poster paper, poster board, books, magazines, newspapers, wooden boards, plywood, and other paper or wood-based products in any selected form; plastic or polymer materials in any selected form (sheets, film, boards, and so on); natural and synthetic rubber materials and products in any selected form; natural and synthetic fabrics in any selected form; glass, ceramic, and other silicon or silica-derived materials and products, in any selected form; concrete (cured), stone, and other building materials and products; or any other product, currently existing or created in the future. In a first exemplary embodiment, a base 100, 100A, 100B, 100C, 100D, 100E, 100F, 100G, 100H may be selected which provides a degree of electrical insulation (i.e., has a dielectric constant or insulating properties sufficient to provide electrical insulation of the one or more first conductors 110 deposited or applied on a first (front) side of the base 100 (including 100A, 100B, 100C, 100D, 100E, 100F, 100G and/or 100H), either electrical insulation from each other or from other apparatus or system components. For example, while comparatively expensive choices, a glass sheet or a silicon wafer also could be utilized as a base 100, 100A, 100B, 100C, 100D, 100E, 100F, 100G, 100H. In other exemplary embodiments, however, a plastic sheet or a plastic-coated paper product is utilized to form the base 100, 100A, 100B, 100C, 100D, 100E, 100F, 100G, 100H such as the patent stock and 100 lb. cover stock available from Sappi, Ltd., or similar coated papers from other paper manufacturers such as Mitsubishi Paper Mills, Mead, and other paper products. In additional exemplary embodiments, any type of base 100, 100A, 100B, 100C, 100D, 100E, 100F, 100G, 100H may be utilized, including without limitation, those with additional sealing or encapsulating layers (such as plastic, lacquer and vinyl) deposited to one or more surfaces of the base 100, 100A, 100B, 100C, 100D, 100E, 100F, 100G, 100H.

The exemplary bases 100 as illustrated in the various Figures have a form factor which is substantially flat in an overall sense, such as comprising a sheet of a selected material (e.g., paper or plastic) which may be fed through a printing press, for example and without limitation, and which may have a topology on a first surface (or side) which includes cavities, channels or grooves 105 (e.g., reticulated, substantially flat bases 100, 100A, 100B, 100C, 100D, 100E, 100F, 100G) or having a first surface which is substantially smooth (substantially smooth and substantially flat base 100H) within a predetermined tolerance (and does not include cavities, channels or grooves 105). Those having skill in the art will recognize that innumerable, additional shapes and surface topologies are available, are considered equivalent and within the scope of the claimed invention.

Referring to FIG. 3, a second exemplary base 100A further comprises two additional components or features, any of which may be integrally formed as part of second exemplary base 100A, or which may be deposited over another material, such as a base 100, to form a second exemplary base 100A. As illustrated, the second exemplary base 100A further comprises a reflector, refractor or mirror 250, such as an optical grating, a Bragg reflector or mirror, which may be covered by a coating 260, such as a substantially clear plastic coating (e.g., polyester, mylar, etc.), or having any suitable index of refraction, such that the interior of the cavities, channels or grooves 105 is substantially smooth (particularly when the reflector, refractor or mirror 250 may be implemented as a refractive grating, for example). The reflector, refractor or mirror 250 is utilized to reflect incident light either back toward the cavities, channels or grooves 105 (and any incorporated diodes 155, discussed below, such as for photovoltaic applications) or toward the (first) surface of an apparatus (200, 300, 400, 500, 600 and/or 700) having the cavities, channels or grooves 105.

Referring to FIG. 4, a third exemplary base 100B further comprises a reflective coating 270, such as an aluminum or silver coated polyester or plastic, for example, which may be integrally formed as part of third exemplary base 100B, or which may be deposited over another material, such as a base 100, to form a third exemplary base 100B. The reflective coating 270 is also utilized to reflect incident light either back toward the cavities, channels or grooves 105 (and any incorporated diodes 155, discussed below, such as for photovoltaic applications) or toward the surface of the apparatus (200, 300, 400, 500, 600 and/or 700) having the cavities, channels or grooves 105. The reflector, refractor or mirror 250 or the reflective coating 270 is generally selected to reflect or refract light at a wavelength appropriate for a selected bandgap of the plurality of diodes 155 discussed below, depending upon the selected application.

Referring to FIG. 5, a fourth exemplary base 100C may include any of the coatings and/or reflectors discussed above (250, 260, 270), and also further comprises any of two additional components or features, a plurality of conductive vias 280 and a conductive backplane 290, any of which may be integrally formed as part of fourth exemplary base 100C, or which may be deposited or applied over or within another material, such as a base 100, to form a fourth exemplary base 100C. For example, exemplary conductive vias 280 may be formed by filling a corresponding void in the fourth exemplary base 100C with a conductive ink or polymer, such as during deposition of the first plurality of conductors 110 discussed below. Also for example, the conductive vias 280 may be integrally formed with the fourth exemplary base 100C, such as formed of metal, carbon or other conductive pins or wires which are embedded within a plastic sheet to form the fourth exemplary base 100C. Another variation of conductive vias (as distributed (randomly or regularly), substantially spherical conductive vias 285) is illustrated and discussed below with reference to FIGS. 10 and 33. Also for example, there may be one or more conductive vias 280, 285 for each corresponding first conductor 110. As another example, a conductive backplane 290 may be formed integrally with the base 100C or deposited over a base (100), such as by coating or printing the second (back) side or surface of the base 100 with a conductive ink or polymer, such as the exemplary conductive inks or polymers described below. As illustrated, either or both a plurality of conductive vias 280 (and/or conductive vias 285) and/or a conductive backplane 290 may be formed from any conductive substance of any kind or type, such as a metal, a conductive ink or polymer, or various other conductive materials, such as carbon or carbon nanotubes, including any of the materials which may comprise the first, second and/or third conductors (110, 140, 145, respectively) described below, for example and without limitation. The conductive vias 280 (and/or conductive vias 285) are utilized to couple, connect, and otherwise conduct to and/or from the one or more first conductors 110 (discussed below). The conductive backplane 290 provides a convenient electrical coupling or connection between the conductive vias 280, 285 and other system (350, 375) components, and may also function as an electrode, for example, to apply a voltage or current to the apparatus 200, 300, 400, 500, 600, 700 or to receive a voltage or current generated by the apparatus 200, 300, 400, 500, 600, 700. In other exemplary embodiments, separate wires, leads or other connections may be provided to each, some or all of the vias 280, in lieu of or in addition to a conductive backplane 290, such as for different types of addressability, as discussed in greater below. (In other exemplary embodiments implemented without vias 280 (285) and/or a conductive backplane 290, other types of contacts may be made to the plurality of first conductors 110, such as from the sides or edges of the apparatus 200, 300, 400, 500, 600, 700, as discussed below.) Conductive vias 280 and/or a conductive backplane 290 may also be included within any of the other bases 100, 100A, 100B, 100D, 100E, 100F, 100G, 100H, and all such variations are considered equivalent and within the scope of the claimed invention.

Figure 8:
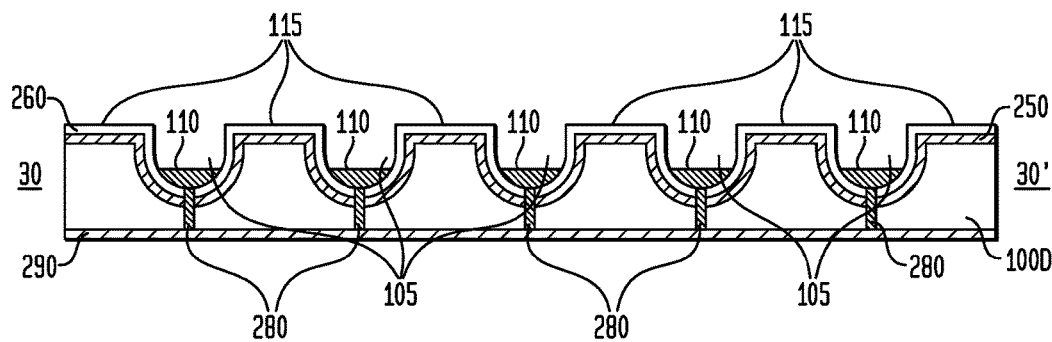
FIG. 8 is a cross-sectional view of a fifth exemplary base with a plurality of first conductors for an apparatus embodiment in accordance with the teachings of the present invention.

A fifth exemplary base 100D is discussed below with reference to FIG. 8, and combines the various features of the second exemplary base 100A and the fourth exemplary base 100C. Additional sixth, seventh and eighth bases 100G, 100E and 100F are also discussed below, having different forms for cavities, channels or grooves 105, such as semicircular channels 105 with interior projections (or supports) 245, off-axis parabolic (paraboloid) shaped channels 105A, and substantially hemispherical cavities 105B, with a ninth exemplary base 100H with a first side or surface having a substantially smooth surface topology without cavities, channels or grooves 105.

The various cavities, channels or grooves 105 may have any type or kind of spacing between or among them. For example, in an exemplary embodiment, pairs of cavities, channels or grooves 105 are spaced comparatively closer together, with a comparatively larger spacing between each such pair of cavities, channels or grooves 105, providing corresponding spacing for one or more first conductors 110 deposited within the cavities, channels or grooves 105, as discussed in greater detail below.

Figure 6:
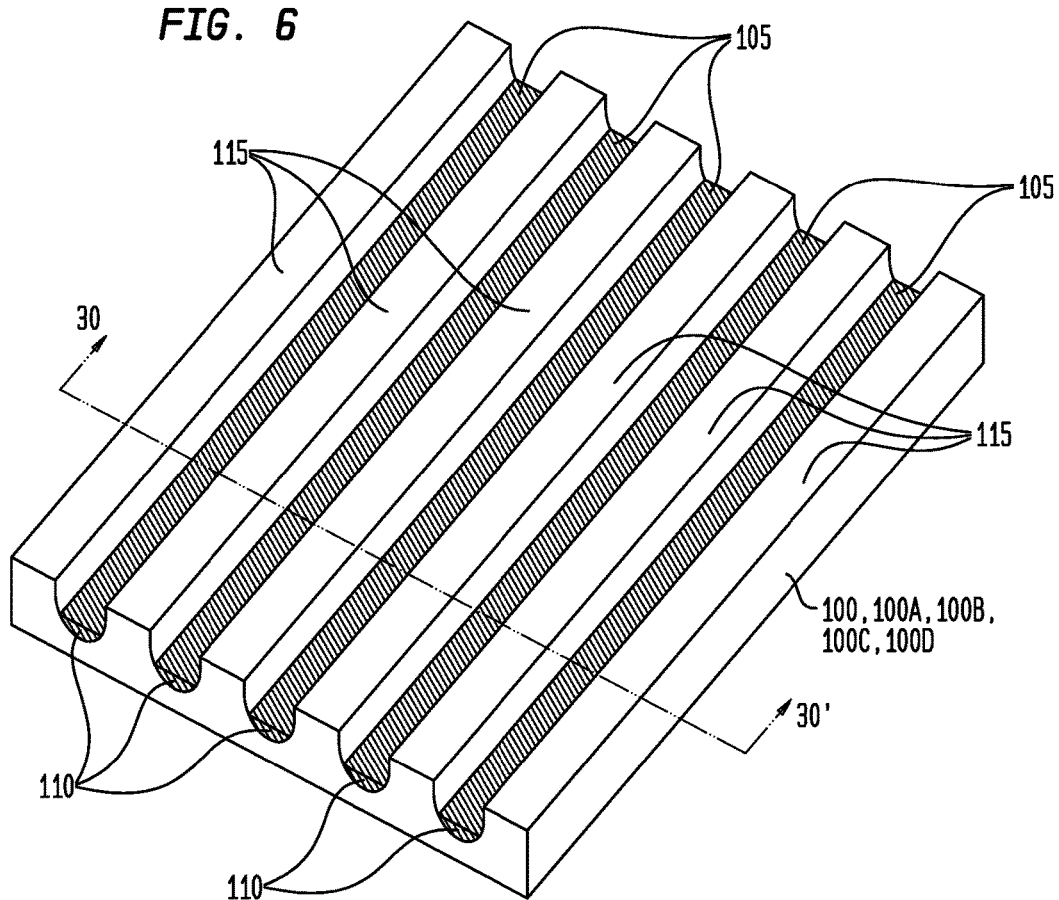
FIG. 6 is a perspective view of an exemplary base with a plurality of first conductors for an apparatus embodiment in accordance with the teachings of the present invention.
Figure 7:
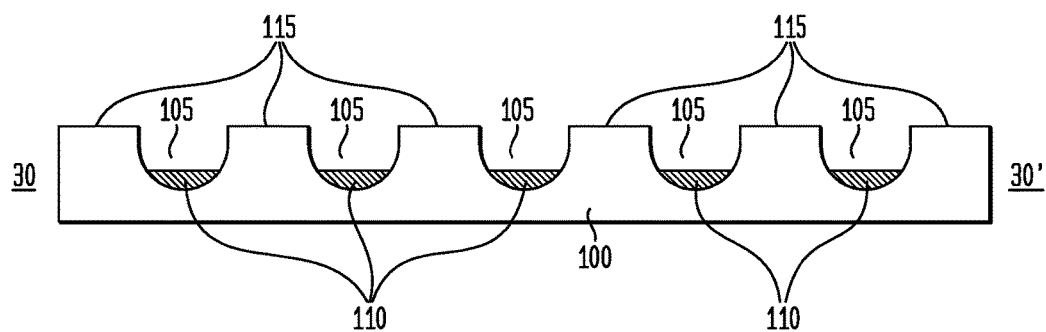
FIG. 7 is a cross-sectional view of an exemplary base with a plurality of first conductors for an apparatus embodiment in accordance with the teachings of the present invention.

In accordance with the claimed invention, one or more first conductors 110 are then applied or deposited (on a first side or surface of the base 100) within the corresponding plurality of cavities, channels or grooves 105, or over all or part of the first surface or side or the base 100, such as through a printing process. FIG. 6 is a perspective view of an exemplary base 100, 100A, 100B, 100C, 100D with a plurality of first conductors 110 for an apparatus embodiment in accordance with the teachings of the present invention. FIG. 7 is a cross-sectional view (through the 30-30' plane) of an exemplary base 100 with a plurality of first conductors 110 for an apparatus embodiment in accordance with the teachings of the present invention. FIG. 8 is a cross-sectional view (through the 30-30' plane) of a exemplary base 100D with a plurality of first conductors 110 for an apparatus embodiment in accordance with the teachings of the present invention. As mentioned above, exemplary base 100D further comprises cavities, channels or grooves 105 (which are illustrated in FIG. 8 as partially filled with one or more first conductors 110), a reflector, refractor or mirror 250, a coating 260, one or more conductive vias 280 (or 285), and a conductive backplane 290.

In an exemplary method of manufacturing the exemplary apparatuses 200, 300, 400, 500, 600 and/or 700, a conductive ink, polymer, or other conductive liquid or gel (such as a silver (Ag) ink or polymer or a carbon nanotube ink or polymer) is deposited on a base 100, 100A, 100B, 100C, 100D, 100E, 100F, 100G, 100H, such as through a printing or other deposition process, and may be subsequently cured or partially cured (such as through an ultraviolet (uv) curing process), to form the one or more first conductors 110 (and such conductive inks or polymers also may be utilized to form any of the other conductors, such as the conductive vias 280, 285 or the conductive backplane 290). In another exemplary embodiment, the one or more first conductors 110, the conductive vias 280, 285, and/or the conductive backplane 290 may be formed by sputtering, spin casting (or spin coating), vapor deposition, or electroplating of a conductive compound or element, such as a metal (e.g., aluminum, copper, silver, gold, nickel). Combinations of different types of conductors and/or conductive compounds or materials (e.g., ink, polymer, elemental metal, etc.) may also be utilized to generate one or more composite first conductors 110. Multiple layers and/or types of metal or other conductive materials may be combined to form the one or more first conductors 110, the conductive vias 280, 285, and/or the conductive backplane 290, such as first conductors 110 comprising gold plate over nickel, for example and without limitation. In various exemplary embodiments, a plurality of first conductors 110 are deposited in corresponding cavities, channels or grooves 105, and in other embodiments, a first conductor 110 may be deposited as a single conductive sheet (FIGS. 34-40) or otherwise attached (e.g., a sheet of aluminum coupled to a base 100H). Also in various embodiments, conductive inks or polymers which may be utilized to form the plurality of first conductors 110 may not be cured or may be only partially cured prior to deposition of a plurality of substrate (or semiconductor) particles 120, and then fully cured while in contact with the plurality of substrate (or semiconductor) particles 120, such as for creation of ohmic contacts with the plurality of substrate (or semiconductor) particles 120 as discussed below.

Other conductive inks or materials may also be utilized to form the first conductors 110, conductive vias 280, 285, conductive backplane 290, second conductors 140, third conductors 145, and any other conductors discussed below, such as copper, tin, aluminum, gold, noble metals, carbon, carbon nanotube ("CNT"), or other organic or inorganic conductive polymers, inks, gels or other liquid or semi-solid materials. In addition, any other printable or coatable conductive substances may be utilized equivalently to form the first conductors 110, conductive vias 280, 285, conductive backplane 290, second conductors 140 and/or third conductors 145, and exemplary conductive compounds include: (1) from Conductive Compounds (Londonberry, N.H., USA), AG-500, AG-800 and AG-510 Silver conductive inks, which may also include an additional coating UV-10065 ultraviolet curable dielectric (such as part of a first dielectric layer 125); (2) from DuPont, 7102 Carbon Conductor (if overprinting 5000 Ag), 7105 Carbon Conductor, 5000 Silver Conductor (also for bus 310, 315 of FIG. 42 and any terminations), 7144 Carbon Conductor (with UV Encapsulants), 7152 Carbon Conductor (with 7165 Encapsulant), and 9145 Silver Conductor (also for bus 310, 315 of FIG. 42 and any terminations); (3) from SunPoly, Inc., 128A Silver conductive ink, 129A Silver and Carbon Conductive Ink, 140A Conductive Ink, and 150A Silver Conductive Ink; (4) from Dow Corning, Inc., PI-2000 Series Highly Conductive Silver Ink; and (5) from Henckel/Emerson & Cumings, 725A. As discussed below, these compounds may also be utilized to form other conductors, including the plurality of second conductors 140 and any other conductive traces or connections. In addition, conductive inks and compounds may be available from a wide variety of other sources.

Conductive polymers which are substantially optically transmissive may also be utilized to form the one or more first conductors 110, conductive vias 280, 285, conductive backplane 290, and also the plurality of second conductors 140 and/or third conductors 145. For example, polyethylenedioxithiophene may be utilized, such as the polyethylenedioxithiophene commercially available under the trade name "Orgacon" from AGFA Corp. of Ridgefield Park, N.J., USA, in addition to any of the other transmissive conductors discussed below and their equivalents. Other conductive polymers, without limitation, which may be utilized equivalently include polyaniline and polypyrrole polymers, for example. In another exemplary embodiment, carbon nanotubes which have been suspended or dispersed in a polymerizable ionic liquid are utilized to form various conductors which are substantially optically transmissive or transparent, such as one or more second conductors 140.

Various textures may be provided for the one or more first conductors 110, such as having a comparatively rough or spiky surface, to facilitate subsequent forming of ohmic contacts with a plurality of substrate particles 120 discussed below. One or more first conductors 110 may also be given a corona treatment prior to deposition of the plurality of substrate particles 120, which may tend to remove any oxides which may have formed, and also facilitate subsequent forming of ohmic contacts with the plurality of substrate particles 120.

In an exemplary embodiment, an embossed base 100, 100A, 100B, 100C, 100D, 100E, 100F, 100G is utilized, such that the base 100, 100A, 100B, 100C, 100D, 100E, 100F, 100G has an alternating series of ridges forming (generally smooth) peaks (crests) and valleys (cavities, channels or grooves 105), generally having a substantially parallel orientation (as an example), respectively illustrated as raised (or non-channel) portions or crests 115 and cavities (e.g., channels) 105. Conductive inks, polymers or other conductors may then be deposited to remain in the embossed valleys, creating a plurality of first conductors 110 which are not only substantially parallel, but which also have a physical separation from each other determined by the ridges (peaks, raised portions or crests) 115 provided through an embossing process, for example. Indeed, when the conductive inks or polymers are deposited to the embossed valleys (cavities, channels or grooves 105), the corresponding first plurality of conductors 110 are also separated from each other by the embossed ridges (peaks, raised portions or crests) 115 of the base 100, creating both a physical separation and electrical insulation (insulated through a corresponding dielectric constant), in addition to being spaced apart. For example, conductive inks or polymers may be coated or otherwise deposited to an embossed base in its entirety, and then utilizing a "doctor blade", the conductive inks or polymers are removed from all of the peaks (crests or raised portions 115), such as by scraping the blade across the surface of the base 100, 100A, 100B, 100C, 100D, 100E, 100F, 100G having a coating of a conductive ink, leaving the conductive inks or polymers within the cavities, channels or grooves 105 to form a first plurality of conductors 110 having a substantially parallel orientation. The amount of conductive ink or polymer remaining in the cavities, channels or grooves 105 depends on the type of doctor blade and the applied pressure. Alternatively, conductive inks or polymers also may be deposited (using negligible or zero pressure) on the embossed peaks (crests or raised portions 115), such as by tip printing, leaving the conductive inks or polymers to form a plurality of conductors having a substantially parallel orientation, such as for forming the plurality of second conductors 140 or a plurality of third conductors 145. Such printing may be performed as a separate manufacturing step discussed below.

For example, a conductive ink may be coated or otherwise deposited in excess over the entire or most of the first side or surface of the base 100, 100A, 100B, 100C, 100D, 100E, 100F, 100G, with the excess conductive ink subsequently removed using a "doctor blade" or other type of scraping as known in the printing arts, followed by uv curing of the conductive ink within the plurality of cavities, channels or grooves 105. Using such a doctor blade, the conductive ink within the plurality of cavities, channels or grooves 105 is allowed to remain in place, with the balance of the conductive ink (such as covering the non-channel portions of the base (crests or raised portions 115) being removed by the scraping process, such as due to contact from the doctor blade. Depending upon the type of printing, including the stiffness of the doctor blade and the applied pressure, the conductive ink may form a meniscus within each of the plurality of cavities, channels or grooves 105 or may bow upward instead, for example. Those having skill in the electronic or printing arts will recognize innumerable variations in the ways in which the plurality of first conductors 110 may be formed, with all such variations considered equivalent and within the scope of the present invention. For example, the one or more first conductors 110 may also be deposited through sputtering or vapor deposition, without limitation. In addition, for other various embodiments, the first conductor(s) 110 may be deposited as a single or continuous layer, such as through coating, printing, sputtering, or vapor deposition, such as for the exemplary embodiments illustrated and discussed below with reference to FIGS. 34-40.

As a consequence, as used herein, "deposition" means, refers to and includes any and all printing, coating, rolling, spraying, layering, sputtering, plating, spin casting (or spin coating), vapor deposition, lamination, affixing and/or other deposition processes, whether impact or non-impact, currently known or developed in the future, and "printing" means, refers to and includes any and all printing, coating, rolling, spraying, layering, spin coating, lamination and/or affixing processes, whether impact or non-impact, currently known or developed in the future, including without limitation screen printing, inkjet printing, electro-optical printing, electroink printing, photoresist and other resist printing, thermal printing, laser jet printing, magnetic printing, pad printing, flexographic printing, hybrid offset lithography, Gravure and other intaglio printing, for example. All such processes are considered deposition processes herein, may be utilized equivalently, and are within the scope of the present invention. Also significant, the exemplary deposition or printing processes do not require significant manufacturing controls or restrictions. No specific temperatures or pressures are required. No clean room or filtered air is required beyond the standards of known printing or other deposition processes. For consistency, however, such as for proper alignment (registration) of the various successively deposited layers forming the various embodiments, relatively constant temperature (with a possible exception, discussed below) and humidity may be desirable. In addition, the various compounds utilized may be contained within various polymers, binders or other dispersion agents which may be heat-cured or dried, air dried under ambient conditions, or uv cured, for example, and all such variations are within the scope of the present invention.

A particular advantage of use of a base 100, 100A, 100B, 100C, 100D, 100E, 100F, 100G having a plurality of cavities 105 is that printing registration is not required to be exact, and a one-dimensional or relative registration may be sufficient for the successive applications of the different materials and layers forming the apparatus 200, 300, 400, 500, 600 and/or 700.

Depending upon the selected embodiment, the depth of the plurality of cavities, channels or grooves 105 may vary from comparatively deep (e.g., one-half or more of the diameter of a substrate (semiconductor) particle 120) to comparatively shallow (e.g., less than one-half of the diameter of a substrate (semiconductor) particle 120). In addition, as previously mentioned, a base (100H) may have a surface topology which is substantially flat, smooth or even, without a plurality of cavities, channels or grooves 105 integrally formed therein, such as for application of the one or more first conductors 110 as a unitary conductive sheet or layer, without being spaced apart or electrically insulated from each other. In other exemplary embodiments, a base may have a substantially flat, smooth or even surface, without a plurality of cavities, channels or grooves 105 integrally formed therein, and instead having ridges (crests or raised portions 115) or other forms of separation built or deposited onto the base which in turn form cavities, channels or grooves 105, or no ridges (crests or raised portions 115).

It should also be noted, generally for any of the applications of various compounds herein, such as through printing or other deposition, the surface properties or surface energies may also be controlled, such as through the use of resist coatings or by otherwise modifying the "wetability" of such a surface, for example, by modifying the hydrophilic, hydrophobic, or electrical (positive or negative charge) characteristics, for example, of surfaces such as the surface of the base 100 (including 100A, 100B, 100C, 100D, 100E, 100F, 100G and/or 100H), the surfaces of the various first, second and/or third conductors (110, 140, 145, respectively), and/or the surfaces of the plurality of substrate particles 120 discussed below. In conjunction with the characteristics of the compound, suspension, polymer or ink being deposited, such as the surface tension, the deposited compounds may be made to adhere to desired or selected locations, and effectively repelled from other areas or regions.

Figure 9:
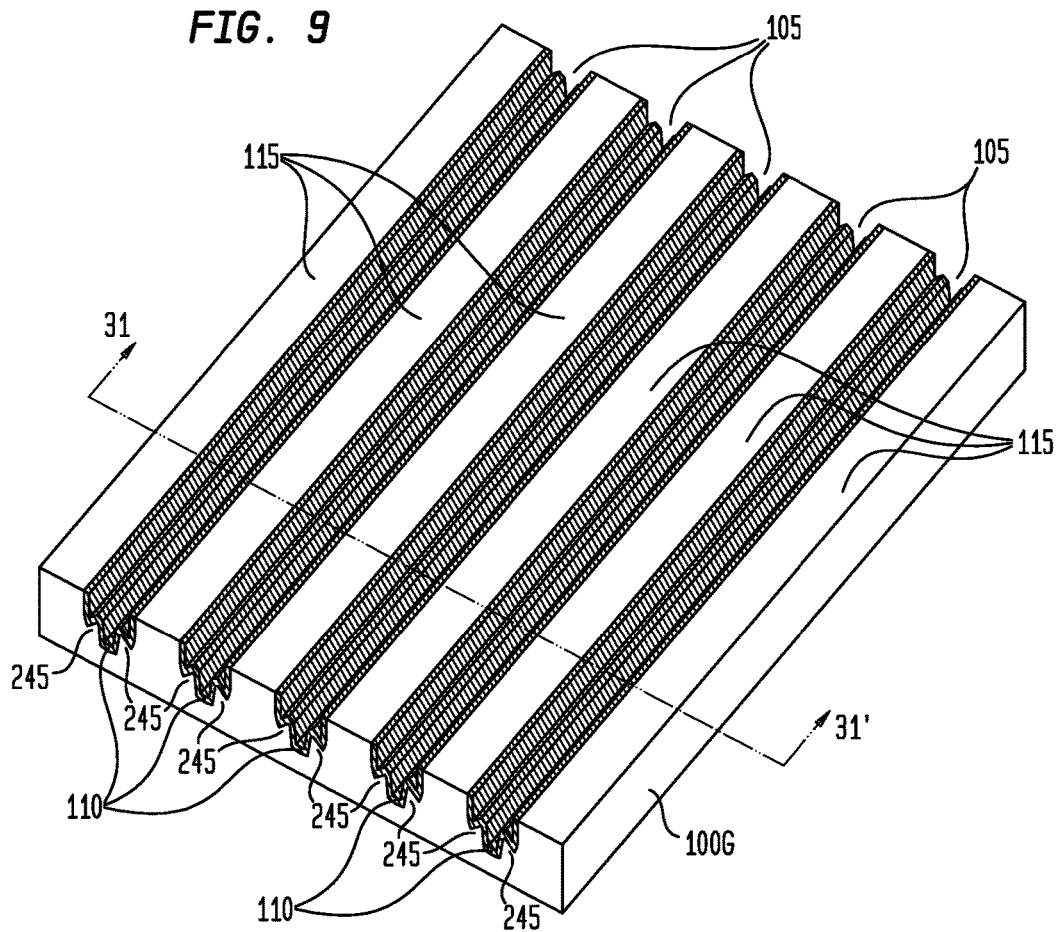
FIG. 9 is a cross-sectional view of a sixth exemplary base with a plurality of first conductors for an apparatus embodiment in accordance with the teachings of the present invention.
Figure 10:
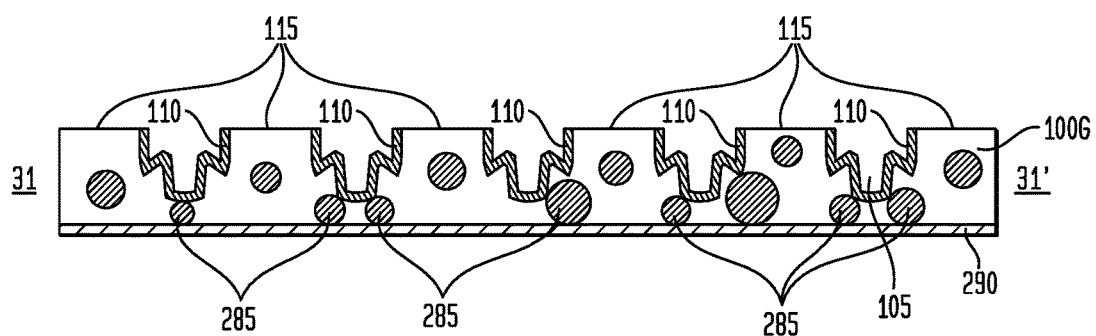
FIG. 10 is a cross-sectional view of a sixth exemplary base with a plurality of first conductors for an apparatus embodiment in accordance with the teachings of the present invention.

FIG. 9 is a cross-sectional view of a sixth exemplary base 100G with a plurality of first conductors 110 for an apparatus embodiment in accordance with the teachings of the present invention. FIG. 10 is a cross-sectional view (through the 31-31' plane) of the sixth exemplary base 100G with a plurality of first conductors 110 for an apparatus embodiment in accordance with the teachings of the present invention. The sixth exemplary base 100G differs from the other exemplary bases 100-100F insofar as the sixth exemplary base 100G also comprises a plurality of integrally formed projections or supports (equivalently, extensions, protrusions, protuberances, etc.) 245 and a plurality of integrally formed conductive vias 285 (as a variation of the vias 280). As illustrated, each of the projections (or supports) 245 are continuous and extend as a solid, raised rail down the entire length of the channel 105; in other embodiments not separately illustrated, the projections (or supports) 245 may be discrete and discontinuous, such as projections (or supports) 245 having the shape of individual horns or spikes which are spaced apart and located at intervals (regular or irregular) down the length of a channel 105, for example and without limitation. The projections (or supports) 245 may have any suitable form, including being smooth and continuous or sharp and discontinuous, with all such variations considered equivalent and within the scope of the claimed invention. In an exemplary embodiment, the projections (or supports) 245 are shaped to allow them to be integrally formed as part of the base 100G, such as by a casting or other molding method, also for example and without limitation.

Also as illustrated, the plurality of first conductors 110 have been deposited to be conformal and track the shape of the channels 105 with a substantially uniform thickness (i.e., a substantially even coating substantially following the contour of the first side (surface) of the base 100G). In an exemplary embodiment, a conductor (such as a metal) may be deposited (at a comparatively low temperature), such as by sputtering, spin casting (or spin coating), coating, or vapor deposition, over the entire first surface (side) of the base 100G, followed by substantially removing any conductor on the ridges (peaks, raised portions or crests) 115, such as by grinding or sanding the ridges (peaks, raised portions or crests) 115 of the base 100G, leaving the plurality of first conductors 110 remaining within the channels 105. In another exemplary embodiment, a resist coating is deposited to the ridges (peaks, raised portions or crests) 115, and a conductor (such as a metal) may be deposited, such as by sputtering, spin casting (or spin coating), or vapor deposition, over the entire first surface of the base 100G, followed by substantially removing any conductor on the ridges (peaks, raised portions or crests) 115, such as by dissolving the resist or by lifting off the conductor on the resist over the ridges (peaks, raised portions or crests) 115, and dissolving any remaining resist. In this latter method, the conductor may be deposited directionally, so that the deposited conductor is discontinuous at the edges of the ridges (peaks, raised portions or crests) 115, enabling the conductor on the ridges (peaks, raised portions or crests) 115 to be removed without affecting the remaining conductor deposited within the channels 105. When the selected conductor is aluminum, the first conductors 110 are also significantly reflective and capable of functioning as a reflective or mirror coating, in addition to providing conductance.

Figure 33:
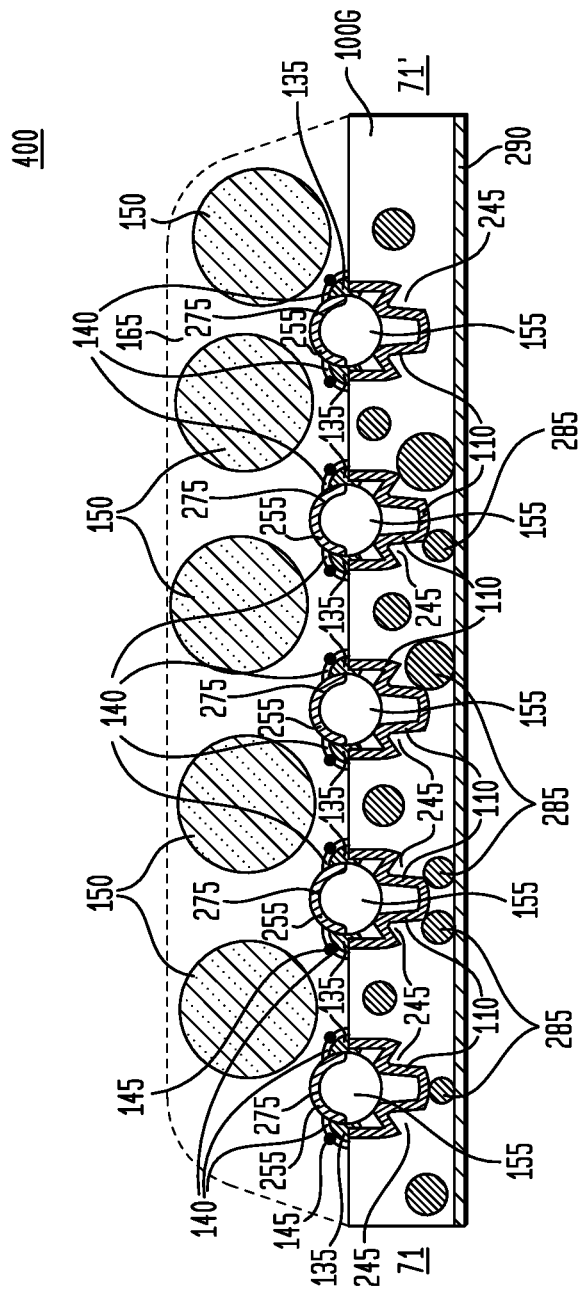
FIG. 33 is a cross-sectional view of the sixth exemplary base with a plurality of first conductors, a plurality of substantially spherical diodes, a plurality of insulators, a plurality of second conductors, a plurality of third conductors, and a plurality of lenses suspended in a polymer for an apparatus embodiment in accordance with the teachings of the present invention.

As discussed in greater detail below with reference to FIGS. 11, 12 and 33, the projections (or supports) 245 serve to elevate (or support) a plurality of substrate particles 120 above the bottom or remaining portion of the channel 105. As the plurality of substrate particles 120 are suspended in a carrier (liquid or gel, for example) for deposition within the channels 105, the elevation by the projections 245 provides for physically supporting and/or separating the plurality of substrate particles 120 from the suspending carrier (which at least initially remains at the bottom of the channel 105 and/or which may be dissipated or removed (such as through evaporation)). The first conductors 110 (on the projections 245) then form ohmic contacts with the supported and elevated substrate particles 120, without interference (or with diminished interference) from any suspending carrier (or polymers or resins) which may be remaining.

The plurality of integrally formed conductive vias 285, as illustrated, may comprise any type of conductor or conductive medium, as previously discussed and without limitation, and may have any suitable shape or form. In an exemplary embodiment, the conductive vias 285 are formed as substantially spherical metal balls or other conductive beads or pellets, and incorporated into the base 100G as it is being formed, such as during a molding process. The plurality of conductive vias 285 may then be distributed randomly (as illustrated), or periodically or otherwise regularly, within the base 100G. As the base 100G is being formed, at least some of the plurality of integrally formed conductive vias 285 will make physical contact with both a first conductor 110 and the conductive backplane 290, thereby providing electrical coupling between the first conductors 110 and the conductive backplane 290. For such an exemplary embodiment, a sufficient number of conductive vias 285 are provided during fabrication, such that when randomly distributed within the base 100G, every first conductor 110 is in contact with at least one conductive via 285 which also is in contact with the conductive backplane 290. In other exemplary embodiments, the conductive vias 285 are (non-randomly) distributed in predetermined locations, also so that every first conductor 110 is in contact with at least one conductive via 285 which also is in contact with the conductive backplane 290.

Figure 11:
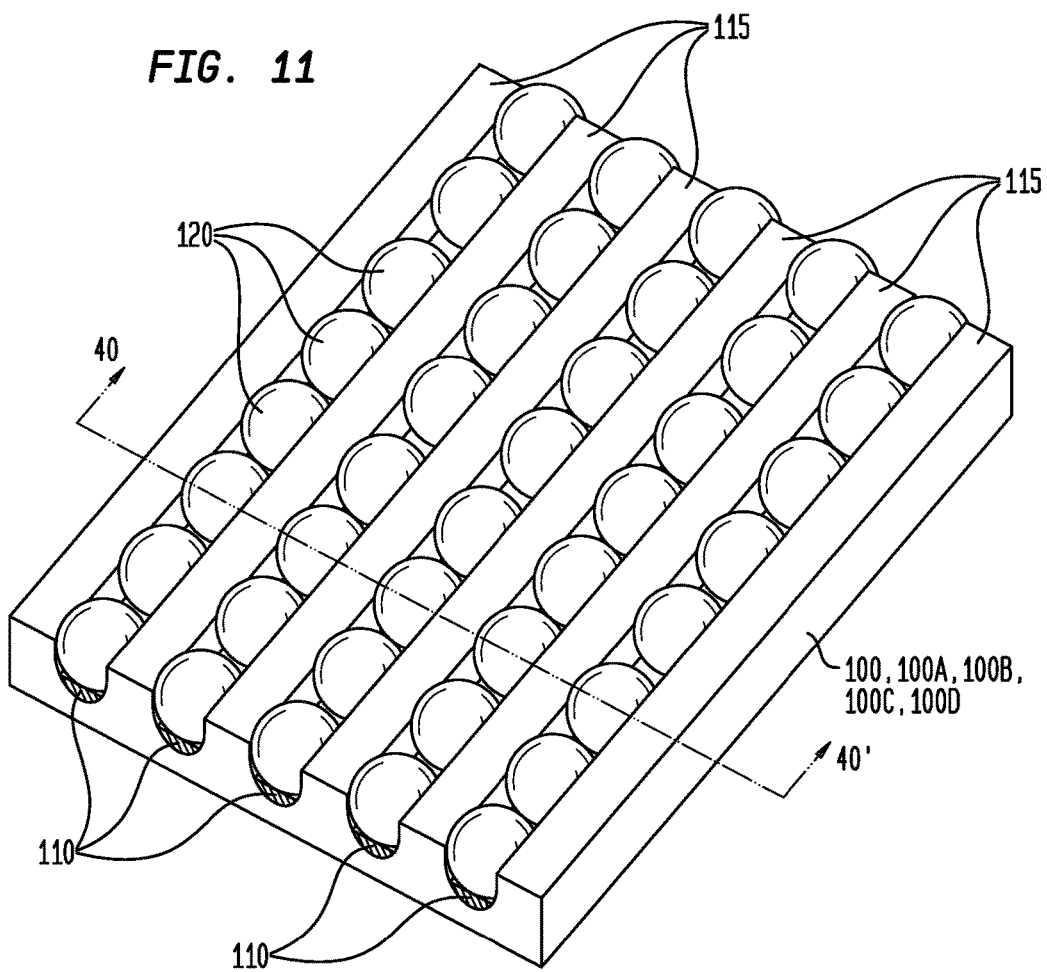
FIG. 11 is a perspective view of an exemplary base with a plurality of first conductors and a plurality of substrate particles for an apparatus embodiment in accordance with the teachings of the present invention.
Figure 12:
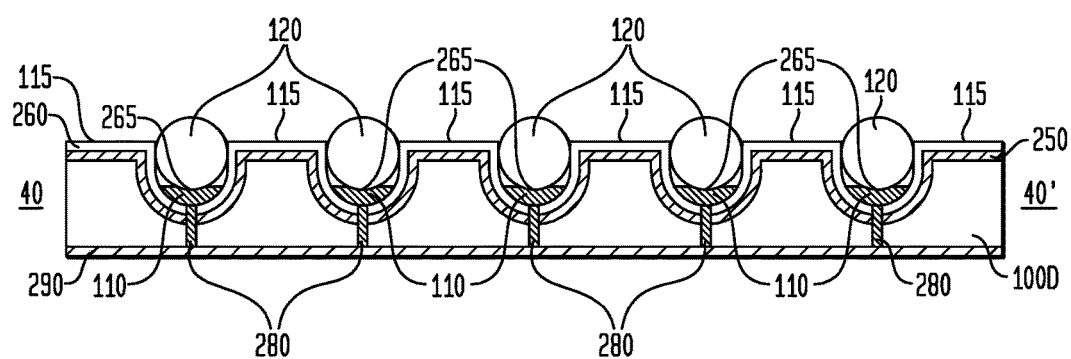
FIG. 12 is a cross-sectional view of the fifth exemplary base with a plurality of first conductors and a plurality of substrate particles for an apparatus embodiment in accordance with the teachings of the present invention.

FIG. 11 is a perspective view of an exemplary base 100, 100A, 100B, 100C, 100D with a plurality of first conductors 110 and a plurality of substrate particles 120 for an apparatus embodiment in accordance with the teachings of the present invention. FIG. 12 is a cross-sectional view (through the 40-40' plane) of the fifth exemplary base 100D with a plurality of first conductors 110 and a plurality of substrate particles 120 for an apparatus embodiment in accordance with the teachings of the present invention. Following deposition of the one or more first conductors 110, the material (such as a conductive ink or polymer) may be cured or partially cured, to form a solid or semi-solid. In other embodiments, the one or more first conductors 110 may remain in a liquid or partially-cured form and be cured subsequently. Following the deposition of the one or more first conductors 110, with any such curing, partial curing, or non-curing, a suspension of a plurality of substrate particles 120 is deposited over the one or more first conductors 110 in the cavities, channels or grooves 105, and (most) form an ohmic contact 265 with a corresponding first conductor 110.

In many exemplary embodiments, the plurality of substrate particles 120 are comprised of a semiconductor substrate, such as a p+ silicon or GaN substrate, and so may be referred to as a plurality of semiconductor particles 120. In other exemplary embodiments, the plurality of substrate particles 120 may comprise other organic, inorganic, or polymeric materials, such as compounds or mixtures suitable for creating organic or polymer light emitting diodes, as discussed below, and so also may be referred to as a plurality of light emitting substrate particles 120 or photovoltaic substrate particles 120. A wide variety of suitable types of substrates for use as substrate particles 120 are discussed in greater detail below. Accordingly, any reference herein to a plurality of substrate particles 120 or, equivalently, a plurality of substrate (semiconductor) particles 120 should be understood to mean and include any organic or inorganic substrate in a particulate form of some kind which is suitable for use in light emitting, photovoltaic, or other electronic applications of any kind, currently known or developed in the future, with any and all such substrates considered equivalent and within the scope of the claimed invention.

The suspension of a plurality of substrate particles 120 may be deposited, for example, through a printing or coating process, such as by printing within the plurality of cavities 105 having the plurality of first conductors 110, or by printing over a first conductor 110 which has been deposited as a layer (FIGS. 34-40) or sheet. As illustrated in FIGS. 37-40, a conductive adhesive 110A has been deposited prior to deposition of the substrate particles 120, as another mechanism for bonding an created ohmic contacts between the substrate particles 120 and the one or more first conductors 110. Also for example, the suspension of a plurality of substrate particles 120 may be coated over the base 100, 100A, 100B, 100C, 100D, 100E, 100F, 100G, 100H and plurality of first conductors 110, with any excess removed using a doctor blade or other scraping process, as previously described.

For example and without limitation, the plurality of substrate particles 120 may be suspended in a liquid, semi-liquid or gel carrier using any evaporative or volatile organic or inorganic compound, such as water, an alcohol, an ether, etc., which may also include an adhesive component, such as a resin, and/or a surfactant or other flow aid. In an exemplary embodiment, for example and without limitation, the plurality of substrate particles 120 are suspended in deionized water as a carrier, with water soluble thickeners such as methyl cellulose, guar gum or fumed silica (such as Cabosil), may also utilize a surfactant or flow aid such as octanol, methanol, isopropanol, or deionized octanol or isopropanol, and may also use a binder such as an anisotropic conductive binder containing substantially or comparatively small nickel beads (e.g., 1 micron) (which provides conduction after compression and curing (as discussed below) and may serve to improve or enhance creation of ohmic contact 265, for example), or any other uv, heat or air curable binder or polymer, including those discussed in greater detail below (and which also may be utilized with dielectric compounds, lenses, and so on). The volatile or evaporative components are dissipated, such as through a heating, uv cure or any drying process, for example, to leave the substrate particles 120 substantially or at least partially in contact with and adhering to the one or more first conductors 110. The suspending material may also include reflective, diffusing or scattering particles, for example, to aid in light transmission in a direction normal to a base 100, 100A, 100B, 100C, 100D, 100E, 100F, 100G, 100H for light emitting applications.

Additional steps or several step processes may also be utilized for deposition of the plurality of substrate particles 120 over the plurality of first conductors 110 and within the cavities, channels or grooves 105. Also for example and without limitation, a binder such as a methoxylated glycol ether acrylate monomer (which may also include a water soluble photoinitiator such TPO (triphosphene oxides)) or an anisotropic conductive binder may be deposited first, followed by deposition of the plurality of substrate particles 120 which have been suspended in any of the carriers discussed above.

For example, when the plurality of first conductors 110 have only been cured partially or are uncured when the plurality of substrate particles 120 are deposited, the plurality of substrate particles 120 may become slightly or partially embedded within the plurality of first conductors 110, helping to form an ohmic contact 265, as illustrated in the various Figures. Additional embedding or contact creation may also occur through an application of pressure (as discussed below with reference to FIG. 13), thermal (heat) processing, uv curing, etc.

In an exemplary embodiment, the suspending medium for the plurality of substrate particles 120 also comprises a dissolving or other reactive agent, which initially dissolves or re-wets some of the one or more first conductors 110. When the suspension of the plurality of substrate particles 120 is deposited and the surfaces of the one or more first conductors 110 then become partially dissolved or uncured, the plurality of substrate particles 120 may become slightly or partially embedded within the one or more first conductors 110, also helping to form an ohmic contact 265, and creating a "chemical bonding" or "chemical coupling" between the plurality of substrate particles 120 and the one or more first conductors 110. As the dissolving or reactive agent dissipates, such as through evaporation, the plurality of first conductors 110 re-hardens (or re-cures) in substantial contact with the plurality of substrate particles 120. An exemplary dissolving or reactive agent, for example and without limitation, is proplyene glycol monomethyl ether acetate ($C_6H_{12}O_3$) (sold by Eastman under the name "PM Acetate"), used in an approximately 1:8 molar ratio (or 22:78 by weight) with isopropyl alcohol (or isopropanol) to form the suspending medium for the plurality of substrate particles 120. Other exemplary dissolving or reactive agents, also for example and without limitation, include a variety of dibasic esters, and mixtures thereof, such as dimethyl succinate, dimethyl adipate and dimethyl glutarate (which are available in varying mixtures from Invista under the product names DBE, DBE-2, DBE-3, DBE-4, DBE-5, DBE-6, DBE-9 and DBE-IB). In an exemplary embodiment, DBE-9 in an approximately 1:10 molar ratio with isopropanol also has been utilized.

The plurality of substrate particles 120 may be comprised of any type of semiconductor element, material or compound, such as silicon, gallium arsenide (GaAs), gallium nitride (GaN), or any inorganic or organic semiconductor material, and in any form, including GaP, InAlGaP, InAlGaP, AllnGaAs, InGaNAs, AllnGASb, for example and without limitation. For example, to form semiconductor substrate particles 120, silicon may be utilized as a monocrystal, as polysilicon, amorphous silicon, and so on, and does not require the epitaxial crystal growth of semiconductor integrated circuits and conventional diodes, with a similar variety of crystal structures and amorphous forms also available for gallium arsenide, gallium nitride, and other semiconductor compounds. The plurality of substrate particles 120 also may be comprised of any type of organic or inorganic compound or polymer utilized for light emission or energy absorption (photovoltaics), such as the various polymers and compounds utilized for light emitting diodes ("OLEDs"), phosphorescent OLEDs ("PHOLEDs"), polymer light emitting diodes ("PLEDs"), light emitting polymers ("LEPs"), including for example and without limitation polyacetylene compounds, polypyrrole compounds, polyaniline compounds, poly(p-phenylene vinylene), polyfluorene, conjugated dendrimers, organo-metallic chelates (e.g., Alq3), and any and all of their corresponding derivatives, substituted side chains, etc., which also may have encapsulated forms, such as encapsulated in a micelle or other container. As mentioned above, "substrate particles" may include any inorganic or organic semiconductor, energy emitting, energy absorbing, light emitting, photovoltaic, or other electronic material, and any and all such elements, compounds, mixtures and/or suspensions are within the scope of the claimed invention.

In FIGS. 11-24 and 32-40, the substrate particles 120 are illustrated as being substantially spherical. In addition, while the substrate particles 120 (and diodes 155 and lenses 150) are or may be referred to as "spherical" for one or more exemplary embodiments, it should be understood that as used herein, "spherical" means and includes "substantially spherical", i.e., substantially or mostly spherical to the extent of being within a predetermined or other selected variance, tolerance or other specification, as virtually no actual object is perfectly spherical in a theoretical or textbook sense. For example and without limitation, the various spherical particles (substrate particles, diodes, lenses) utilized in the exemplary embodiments typically will lack at least some uniformity (1) within each such sphere (i.e., there will be some variation in its radius from the center to different points of the surface, and will be slightly aspherical to some degree), (2) from sphere to sphere, with variations in sizes of spheres, (3) in the various shapes and sizes of particles, with some or many being substantially spherical (and others significantly aspherical and/or misshapen, depending upon the tolerances of the supplier, for example), and (4) in surface properties, with substrate particles 120 having substantially smooth or polished surfaces and others having more surface variation or roughness. The substrate particles 120 may be formed as spherical particles, beads or pellets as known or becomes known in the art, such as disclosed for silicon (semiconductor) particles in Hamakawa et al. U.S. Pat. No. 6,706,959, issued Mar. 16, 2004, entitled "Photovoltaic Apparatus and Mass-Producing Apparatus for Mass-Producing Spherical Semiconductor Particles", which is incorporated by reference herein with the same full force and effect as if set forth in its entirety herein. Other aspherical or otherwise irregular substrate particles may be formed into substantially spherical substrate particles through any of various types of polishing methods, such as in a ball mill, for example and without limitation.

In various exemplary embodiments, the plurality of substrate particles 120 are subsequently converted in situ into corresponding diodes 155, as discussed in greater detail below. Accordingly, the plurality of substrate particles 120 are sized to provide one or more selected sizes of the resulting plurality of diodes 155, such as resulting diodes 155 in the range of about 10-40 microns (μm), for example, which is considerably smaller (by orders of magnitude) than prior art light emitting or photovoltaic diodes. In another exemplary embodiment, the diodes 155 are in the range of about 25-40 microns (μm), also for example and without limitation. Use of such small substrate and diode sizes are possible due to the novel methods of manufacturing herein, including the use of suspensions of the plurality of substrate particles 120 and the use of deposition techniques such as printing, which allow handling of the substrate particles as a group, en masse, rather than requiring individual placement of each particle 120. In addition, also as discussed in greater detail below, the very small size of the resulting diodes 155 is especially advantageous, providing an increased amount of a (pn) junction per amount of substrate material, enabling higher efficiencies of light output (for LED applications) or conversion of light into electrical energy (for photovoltaic applications).

In various exemplary embodiments, the plurality of substrate particles 120 are selected or designed to have a shape which facilitates or creates optical resonance at one or more selected frequencies, such as substantially spherical, substantially toroidal (or ring) shaped, cylindrical or rod shaped, etc., and which are referred to individually and collectively herein as substantially optically "resonant" diodes 155 and/or semiconductor or substrate particles 120. In addition, a plurality of substrate particles 120 may also be selected or designed to have a shape which may facilitate mode coupling with the plurality of lenses 150, as discussed in greater detail below.

In other exemplary embodiments, the plurality of substrate particles 120 may have other shapes and forms, such as faceted, oblong (elliptical), substantially rectangular, substantially flat, or substantially irregular or aspherical, as illustrated in FIGS. 26-31, for example and without limitation. For example, faceted substrate particles 120 may be useful for light emission. Also for example, a substantially rectangular or substantially flat substrate particles 120, such as the shape and size of a prior art, conventional diode, may also be utilized in selected exemplary embodiments. In addition, the plurality of substrate particles 120 may have any of myriad sizes and shapes, with a variety of sizes utilized, such as to provide emission, absorption or optical resonance at a plurality of wavelengths of light or other electromagnetic (EM) waves. For example and without limitation, in an exemplary embodiment, the substrate particles 120 are substantially spherical (within a predetermined tolerance) and in a range of about 10-40 microns, and potentially in the range of about 25-40 or 25-30 microns. In an exemplary embodiment, silicon, GaAs or GaN is utilized which has been doped (e.g., with Boron or another element) to be a p or p+(equivalently referred to as P or P+) semiconductor, to facilitate forming corresponding ohmic contacts with the one or more first conductors 110. In other embodiments, n or n+(equivalently referred to as N or N+) dopant levels also may be utilized.

Of special interest, it should be noted that other than suspending them into a carrier (a suspending medium), the plurality of substrate particles 120 do not require any processing prior to depositing them over the one or more first conductors 110 in the plurality of cavities, channels or grooves 105. For example, the plurality of substrate particles 120 do not require any micromachining to change their shape or to expose interior portions, in sharp contrast to the prior art.

In addition, at this point in the process of creating an apparatus (200, 300, 400, 500, 600 and/or 700), the plurality of substrate particles 120 are substantially isotropic and do not have and do not require any orientation during or prior to depositing them over the one or more first conductors 110 (in the plurality of cavities, channels or grooves 105). Rather, also in sharp contrast with the prior art, an orientation or difference in the substrate (e.g., semiconductor) material is created subsequently when the plurality of substrate particles 120 are formed into diodes in situ, with the subsequent formation of a corresponding pn (or equivalent) junction in a substrate (e.g., semiconductor) particle 120 which has already been fixed in place during the manufacturing and creation of an apparatus 200, 300, 400, 500, 600, 700

As an option, provided sufficient ohmic contacts may be created between the plurality of substrate particles 120 and the one or more first conductors 110, the carrier or suspending material for the plurality of substrate particles 120 may also include an insulating (or dielectric) binder or other polymer, which may be comprised of any curable compound having a reasonably high dielectric constant sufficient to provide electrical insulation between the plurality of first conductors 110 and the plurality of second conductors 140 discussed below. As discussed in greater detail below, a wide variety of dielectric compounds may be utilized, any and all or which are within the scope of the present invention, and may be included within air, heat- or uv-curable binders or other polymers, for example, to form part or all of the suspending liquid, semi-liquid or gel carrier.

Those having skill in the art will also recognize that various removable or etchable compounds may also be utilized. For example, once the plurality of substrate particles 120 have been embedded within or make sufficient electrical contact with the plurality of first conductors 110, followed by curing, all or part of the suspending material or binder may be removed, such as through an acid or ion etching process. Such an etching or washing process may also facilitate providing additional electrical contacts with the plurality of semiconductor spherical particles 120, such as the subsequent formation of electrical contacts with the one or more second conductors 140.

In another variation, the substrate particles 120 are suspended in a carrier such as an organic or inorganic solvent. The carrier is then allowed to evaporate, such as through the application of heat, air, or other methods to facilitate evaporation, and the plurality of substrate particles 120 are bonded to the one or more first conductors 110, such as through use of a dissolving or reactive agent (as discussed above), pressure, laser, uv or thermal annealing or alloying, or another application of energy in some form. Accordingly, electrical coupling between the plurality of substrate particles 120 and the one or more first conductors 110 may occur in any of a plurality of ways, any and all of which are within the scope of the claimed invention. For example and without limitation, such coupling may occur by abutment, pressure, laser, uv or thermal annealing or alloying, by partially embedding the plurality of substrate particles 120 within one or more first conductors 110 (such as when the conductive ink or polymer forming the one or more first conductors 110 was uncured or only partially cured prior to depositing the plurality of substrate particles 120, or has been dissolved or re-wetted using a reactive suspending agent during the substrate particle deposition process), or by using anisotropic conductive polymers, which create an electrical connection following compression and curing, for example and without limitation. In an exemplary embodiment, the substrate particles 120 are annealed with or to one or more aluminum-based first conductors 110 through thermal annealing between about 350-450 degrees C. or any lower temperature sufficient for forming a desired or selected degree of ohmic contact(s) without adversely affecting other parts of the device, such as depending upon the composition of the base 100.

Figure 13:
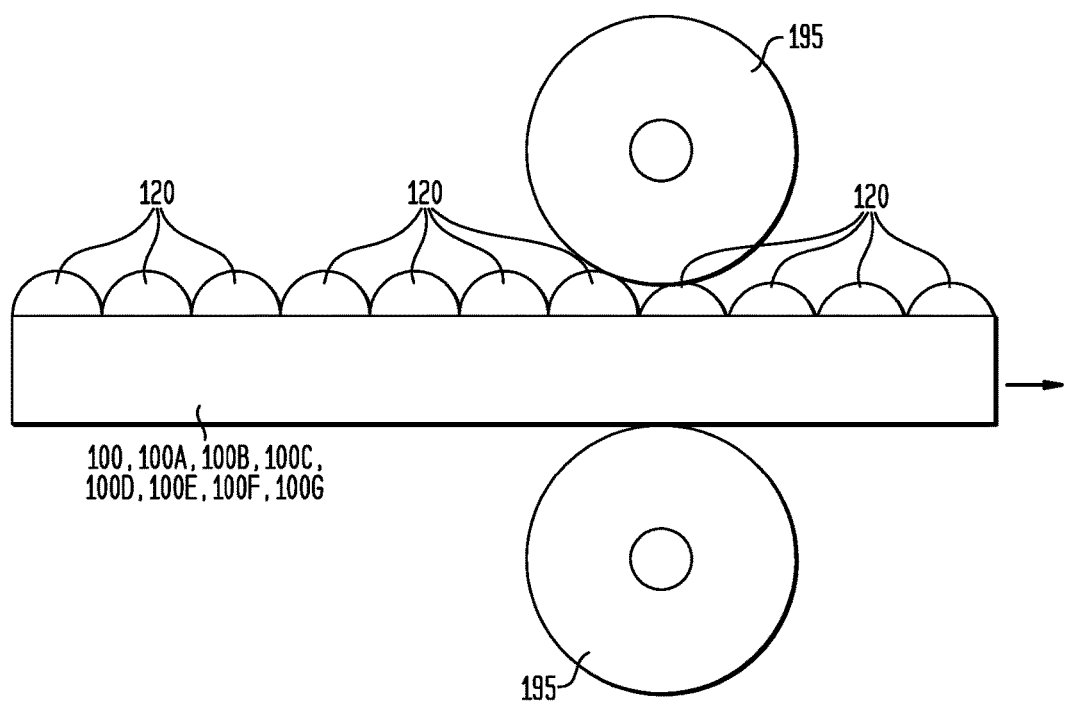
FIG. 13 is a lateral view of the fifth exemplary base with the plurality of substrate particles passing through compressive rollers for an optional step in an exemplary method of forming an apparatus embodiment in accordance with the teachings of the present invention.

FIG. 13 is a lateral view of the fifth exemplary base 100D with the plurality of substrate particles 120 passing through compressive rollers 195 for an optional step in an exemplary method of forming an apparatus embodiment in accordance with the teachings of the present invention. In such an exemplary embodiment, the plurality of first conductors 110 may remain in a liquid, gel, or partially-cured form. Following deposition of the plurality of substrate particles 120, the plurality of substrate particles 120 may be pressed into the uncured or partially cured plurality of first conductors 110, such as by moving the base 100, 100A, 100B, 100C, 100D, 100E, 100F, 100G and/or 100H having the plurality of first conductors 110 and the plurality of substrate particles 120 through such compressive rollers 195, or any other means of applying pressure to or seating the plurality of substrate particles 120 in or against the plurality of first conductors 110 to help form an ohmic contact (265) between a semiconductor particle 120 and a first conductor 110.

Figure 14:
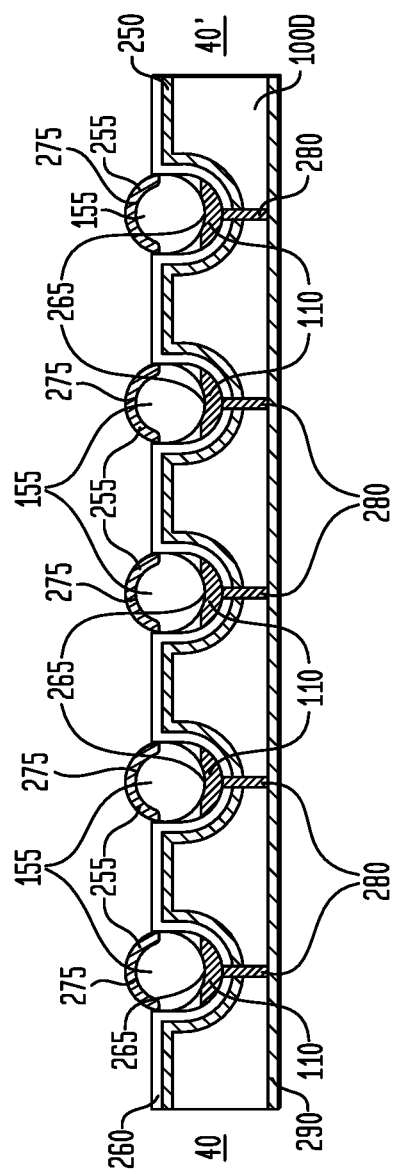
FIG. 14 is a cross-sectional view of the fifth exemplary base with a plurality of first conductors and a plurality of diodes for an apparatus embodiment in accordance with the teachings of the present invention.

FIG. 14 is a cross-sectional view (through the 40-40' plane) of the fifth exemplary base 100D with a plurality of first conductors 110 and a plurality of substrate particles 120 having a junction 275 formed therein and thereby comprising diodes 155 for an apparatus embodiment in accordance with the teachings of the present invention. For semiconductor substrate particles 120, the junction 275 is generally a pn (or PN) junction 275, while for organic or polymer substrate particles 120, the junction 275 may be considered a junction between the organic or polymer layers utilized to create OLEDs or PLEDs, for example and without limitation. As an example, for a plurality of substrate particles 120 comprising a semiconductor having a first majority carrier (e.g., p+ or n+), a layer or region 255 is created which has a second majority carrier (e.g., correspondingly n+ or p+), forming junction 275. As part of a printing process, for a p or p+ semiconductor substrate type, an n-type dopant, such as a phosphorus or phosphorous and silicon in a carrier or binder, is deposited in a liquid, semi-liquid, gel, or film form, such as an ink or polymer, to a first or upper portion of the plurality of substrate particles 120, and heated, or subject to laser energy, or subject to another form of curing, annealing or alloying, such that the n-type dopant or n-type material diffuses into or bonds with the upper portion of the plurality of substrate particles 120 to a sufficient degree, forming a penetration layer or region 255 which, in this case, is an n-type penetration layer or region 255 which defines a corresponding junction 275 (in this case, a pn junction 275) with a p-type semiconductor substrate particle 120. In an exemplary embodiment, the (n-type) penetration layer or region 255 (and corresponding pn junction 275) is substantially curved and shell-shaped, such as hemispherical shell-shaped when the plurality of substrate particles 120 are substantially spherical, with the n-type layer 255 (and corresponding pn junction 275) typically extending slightly below the level of the outer coating 260, and is in sharp contrast to typical prior art diodes having a substantially planar and flat pn junction or a substantially planar and flat pn junction within a well of a semiconductor substrate. Conversely, a p-type penetration layer or region 255 may be formed within an n-type semiconductor particle 120, and is considered equivalent and also within the scope of the present invention. Also in an exemplary embodiment, an n-type dopant, such as a phosphorus, is suspended in a comparatively volatile carrier or binder which then dissipates upon the application of laser energy. A rapid laser pulse is utilized, or heat applied (such as with a tungsten heating element or bar or uv lamps, at 800-1200 degrees C. for a period of time which may be a few tenths of a second up to 15-30 minutes,) on the first or top portion of the plurality of substrate particles 120, such that any heat dissipates quickly without adversely affecting other portions of the device. In exemplary embodiments, a resist may also be utilized, such that the remaining portions of the apparatus are not exposed to the deposited dopant material or the deposited dopant material does not adhere to those regions. In addition, various surface characteristics (such as wetting) may also be adjusted, as discussed above.

Figure 15:
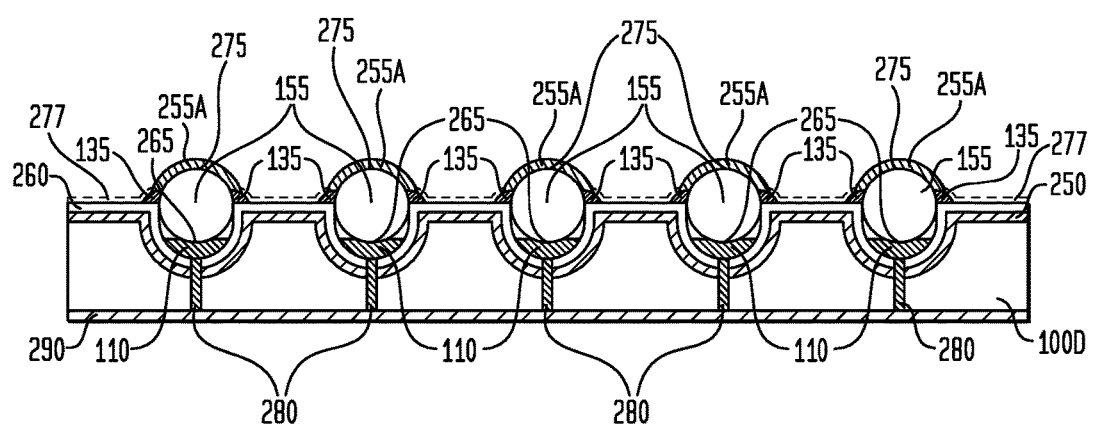
FIG. 15 is a cross-sectional view of the fifth exemplary base with a plurality of first conductors and a plurality of diodes for an apparatus embodiment in accordance with the teachings of the present invention.

In another exemplary embodiment, various "spin-on" materials may be deposited, through spinning, spraying or printing, to provide such n-type doping. For such an embodiment, a film of phosphorus, arsenic, or antimony doped glass, for example and without limitation, is deposited on the surface of the plurality of substrate particles 120, such as silicon particles, and heated, either forming an additional layer over (and a pn junction at the interface with) the substrate particles 120 (as illustrated in FIG. 15), or causing diffusion to occur from this film into the plurality of semiconductor (silicon) particles 120. Exemplary n-type dopants or spin-on materials include, for example and without limitation, dopants available from the Emulsitone Company of Whippany, N.J., USA, such as Emulsitone Emitter Diffusion Source N-250, Arsenosilicafilm and Antimonysilicafilm for buried layers, Phosphorosilicafilm $5 \times 10^{20}$, and Phosphorofilm for solar cells. These exemplary dopants or spin-on materials are deposited, and depending on the application and dopants, such as for Emulsitone Emitter Diffusion Source N-250, may be initially heated to 150-200 degrees C. for 15 minutes to harden the film, followed by heating at 800-1200 degrees C. for 15-30 minutes or any lower temperature capable of forming a junction 275 and/or layer or region 255 degree with the desired or selected characteristics (such as a desired penetration depth) and without adversely affecting other parts of the device at that point in its manufacture, such as temperatures as low as or lower than 200-300 degrees C.

FIG. 15 is a cross-sectional view of a fifth exemplary base 100D with a plurality of first conductors 110 and a plurality of substrate particles 120 following deposition of a layer or region 255A, which also forms a junction 275, and thereby comprising diodes 155 for an apparatus embodiment in accordance with the teachings of the present invention, and serves to illustrate another variation for the manufacture of diodes 155 in situ, also in accordance with the teachings of the present invention. For such an exemplary embodiment, a diode 155 comprises a layer or region 255A coupled to a substrate particle 120 to form a junction 275. (FIG. 15 may also be considered a variation of a cross-sectional view (through the 40-40' plane) of FIG. 12, following deposition of one or more insulators 135 and a layer or region 255A, which is not separately illustrated in a perspective view. FIG. 15 may also be considered a variation of a cross-sectional view (through the 50-50' plane) of FIG. 16, following deposition of a layer or region 255A, which also is not separately illustrated in a perspective view.)

As discussed in greater detail below with reference to FIGS. 16 and 17, one or more insulators (or insulating layers) 135 may be deposited, to provide electrical isolation between one or more second conductors 140 and one or more first conductors 110. For this exemplary embodiment, following deposition of the plurality of substrate particles 120, one or more insulators (or insulating layers) 135 may be deposited, followed by deposition of a layer or region 255A. In other exemplary embodiments, the one or more insulators (or insulating layers) 135 may be deposited after the in situ creation of diodes 155, as discussed below.

Also as an example, for a plurality of substrate particles 120 comprising a semiconductor having a first majority carrier (e.g., p+ or n+), a layer or region 255A is created which has a second majority carrier (e.g., correspondingly n+ or p+), also forming junction 275. For semiconductor substrate particles 120, the junction 275 is generally a pn (or PN) junction 275, while for organic or polymer substrate particles 120, the junction 275 may be considered a junction between the organic or polymer layers utilized to create OLEDs or PLEDs, for example and without limitation. As part of a deposition process, such as using plasma deposition or sputtering, for semiconductor substrate type having a first majority carrier (e.g. p+ silicon), a semiconductor material having a second majority carrier (e.g., an n-type dopant, such as a phosphorus-doped silicon) is deposited over (on top of) a first or upper portion of the plurality of substrate particles 120 and any one or more insulators 135. In addition, in various embodiments, the semiconductor material having a second majority carrier may be deposited over the first surface (or side), covering a first or upper portion of the plurality of substrate particles 120, one or more insulators 135, and ridges or crests 115 (illustrated as region 277). The corresponding deposited second majority carrier (n-type) semiconductor material forms a continuous semiconductor body with each of the substrate particles 120, such as forming a continuous crystal or other bond with the upper portion of a substrate particle 120, forming a deposited layer or region 255A which, in this case, is an n-type layer or region 255A which defines a corresponding junction 275 (in this case, a pn junction 275) with a first majority carrier (p-type) semiconductor substrate particle 120. In an exemplary embodiment, the (n-type) layer or region 255A (and corresponding pn junction 275) is formed as a "cap" over the substrate particle 120, and is also substantially curved and shell-shaped, such as hemispherical shell-shaped when the plurality of substrate particles 120 are substantially spherical, and also is in sharp contrast to typical prior art diodes having a substantially planar and flat pn junction or a substantially planar and flat pn junction within a well of a semiconductor substrate. In another embodiment, when the second majority carrier (n-type) semiconductor material is deposited as a layer which also covers the insulators 135 and ridges 115, the junction 275 is also formed as a "cap" at the interface with the substrate particle 120, and is also substantially curved and shell-shaped, such as hemispherical shell-shaped when the plurality of substrate particles 120 are substantially spherical. Conversely, a first majority carrier (p-type) layer or region 255A may be formed over a second majority carrier (n-type) semiconductor particle 120, and is considered equivalent and also within the scope of the present invention. Following deposition of one or more insulators 135 and formation of layers or regions 255A, one or more second conductors 140 and other features and elements may be deposited as discussed below (beginning with FIG. 18 and following). An exemplary apparatus 700 embodiment created using this methodology is illustrated and discussed below with reference to FIGS. 37-40.

In an exemplary embodiment, a layer or region 255A may be deposited using a plasma deposition process, such as using a vacuum chamber having a few Torrs, which may be process chamber that is a module of an overall printing process, for example and without limitation. After deposition of one or more insulators 135 (described in greater detail below), the first side or surface may be treated, such as with a gas containing fluorine, which may slightly etch the plurality of substrate particles 120 when comprised of a semiconductor such as a doped silicon, and which may further create a surface of the insulators 135 which has comparatively poor adhesion characteristics (e.g., Teflon-like). The plasma deposition process then deposits the semiconductor material, such as silicon, which adheres to the first majority carrier substrate particles 120, but does not substantially adhere to the fluorinated surface of the insulators 135 (and can be removed subsequently), and deposits the second majority carrier (n-type), which becomes incorporated into the deposited semiconductor material and may also further diffuse into the substrate particles 120, forming layer or region 255A. The deposited, second majority carrier (n-type) doped semiconductor material is then in intimate contact with the substrate particles 120 having the first majority carrier, forming a continuous semiconductor (e.g., silicon) body having a junction 275, such as a n+p junction.

In another exemplary embodiment, a layer or region 255A may be deposited using a sputtering process. After deposition of one or more insulators 135 (described in greater detail below), the first side or surface may be cleaned or treated, such as using a back sputtering process. The sputtering process then deposits the semiconductor material doped with a second majority carrier, such as phosphorus-doped silicon from an n+ silicon source, which adheres to the first majority carrier substrate particles 120, the insulators 135, and ridges 115, with the second majority carrier (e.g., n-type) incorporated into the deposited semiconductor material, forming layer or region 255A. The deposited, second majority carrier (n-type) doped semiconductor material is then in intimate contact with the substrate particles 120 having the first majority carrier, forming a continuous semiconductor (e.g., silicon) body having a junction 275, such as a n+p junction.

In exemplary embodiments, for both the plasma deposition and sputter processes, a resist may also be utilized, such that the remaining portions of the apparatus are not exposed to the deposited dopant material or the deposited dopant material does not adhere to those regions. In addition, various surface characteristics (such as wetting) may also be adjusted, as discussed above.

Referring to both FIGS. 14 and 15, in various or selected exemplary embodiments, the (pn) junction 275 may encompass varying percentages of a shell region about the plurality of substrate particles 120. For example, using percentages based upon the amount of surface area covered by a penetration layer or region 255 forming a corresponding junction 275, when the plurality of substrate particles 120 are substantially spherical, each substantially hemispherical, shell-shaped (pn) junction 275 may encompass 15-60 percent of a semiconductor particle 120; in other exemplary embodiments, a shell-shaped pn junction 275 may encompass 15-55 percent of a semiconductor particle 120; and in various exemplary embodiments of substantially spherical substrate particles 120, may encompass about or approximately 20-50 percent, or 30-40 percent (plus or minus some small percentage (A)) of a semiconductor particle 120. This is also in sharp contrast to the prior art, in which the (pn) junction initially covers the entire spherical semiconductor, which subsequently requires micromachining to expose one of the substrate types. For example, in an exemplary embodiment, about 15 percent to 55 percent of each diode surface and corresponding penetration or diffusion region (255, 255A) of substantially all of the plurality of substantially spherical diodes has a second majority carrier (second dopant type) (n-type or p-type) (i.e. has the second dopant type over part, most or all of a first, primarily upper surface of each diode 155, with the potential for some additional diffusion of the second dopant type to the second, lower surface of the diode), and the remaining diode surface and interior has a first majority carrier (or first dopant type) (p-type or n-type) (i.e., most, part or all of a second, lower surface of each diode comprises the original substrate that has not been covered by the deposited second dopant type and corresponding diffusion), with a pn junction formed correspondingly within each such substantially spherical diodes.

Because the (n-type) penetration layer or region 255 does not fully encompass the semiconductor substrate particle 120, no further processing is needed to expose a p-type region, also in contrast with the prior art. Accordingly, ohmic contacts with a p-type (or n-type) region may be made directly on the unaltered, non-recessed, exterior of the semiconductor substrate particle 120, without any need for micromachining and exposing an interior, recessed portion. In addition, because the resulting diode 155 has been created in situ, no alignment of the pn junction and no placement of an oriented diode is required, with proper alignment and placement occurring automatically due to the novel method of manufacturing a diode 155 in place within an exemplary apparatus 200, 300, 400, 500, 600 and/or 700. Furthermore, ohmic contacts between the substrate particles 120 and the one or more first conductors 110 have been created prior to diode 155 formation, also in sharp contrast to typical semiconductor fabrication techniques. Accordingly, a junction 275 has been created in a diode 155 which is substantially curved and shell-shaped (and, for exemplary embodiments, substantially hemispherically shell-shaped or cap-shaped), and further simultaneously or concurrently having an "exposed" semiconductor substrate (e.g., a p-type region bonded or available for bonding to a conductor) and, for exemplary embodiments, an exposed and substantially hemispherically-shaped semiconductor substrate, which at least in part has already been coupled to one or more first conductors 110. Stated another way, a (pn) junction 275 has been created which is substantially curved and shell or cap-shaped (which covers a predetermined percentage of the semiconductor substrate particle 120 and which does not, at any time, encompass an entire semiconductor substrate particle 120), in a semiconductor substrate particle 120 which has already been bonded, attached or otherwise coupled to a conductor such as a first conductor 110.

Following diode 155 creation (with either a region or layer 255 or 255A), a passivating or passivation layer may be formed, such as using a plasma deposition process, creating a comparatively tough and durable coating on the diodes 155, which in various embodiments, may also be flexible. For example, plasma deposition may be utilized to In various exemplary embodiments, as mentioned above, the plurality of substrate particles 120 are sized to provide one or more selected sizes of the resulting plurality of diodes 155, such as resulting diodes 155 in the range of about 10-40 or 25-40 microns (μm), for example. This very small size of the resulting diodes 155 is especially advantageous, providing an increased amount of a (pn) junction 275 per amount of substrate material, enabling higher efficiencies of light output (for LED applications) or conversion of light into electrical energy (for photovoltaic applications), among other things.

In addition, for photovoltaic applications, when the plurality of substrate particles 120 are substantially spherical, it is also significant that the pn junction 275 that has been formed is or will be generally fully exposed to (and in some cases normal to) the incident light, coming from any corresponding direction on the first or upper portion of the apparatus 200, 300, 400, 500, 600, 700. This additional feature enables incoming light from a wide variety of directions to be utilized for energy generation, without an additional prior art requirement of moving or orienting photovoltaic panels to track solar movement or locations (using the earth as a frame of reference).

When the plurality of substrate particles 120 are comprised of organic or inorganic compounds and polymers (such as those utilized for OLEDs or PLEDs), there are additional available variations. Depending upon the type of compound utilized, the OLED may be comprised of a single layer, in this case the substrate particle 120, and, if so, the formation of layer 255 is not required. For other, multiple layer OLEDs, the formation of layer or region 255 may be accomplished by the coating, printing, or other addition of the compounds and/or polymers utilized for the selected OLED and/or OLED layer, with the layer 255 then comprising the corresponding OLED layer, and with a corresponding inter-layer junction (275) formed (comparable or equivalent to a pn junction, for example) (and with the organic substrate particles also becoming corresponding (organic) diodes 155, also for example and as discussed below). For multiple layer OLEDs, this process may be repeated, creating a plurality of regions 255, one on top of the other, also forming an OLED in position in an exemplary apparatus 200, 300, 400, 500, 600, 700 and after coupling the substrate particle 120 to a conductor (first conductor 110).

Through this use of deposited carriers (dopants) and/or coatings, over a plurality of substrate particles 120, with the formation of a pn or equivalent junction in situ, the plurality of substrate particles 120 have now been converted into a corresponding plurality of diodes 155, and may be any type or kind of diode, such as for photovoltaic ("PV" diodes) applications or for light emitting applications (light emitting diodes or "LEDs"). Stated another way, when deposited, the substrate particles 120 are not diodes, but are just substrate particles without junctions, followed by forming the junctions 275 in place.

In addition, in exemplary embodiment, substrate particles 120 and corresponding dopants and coatings, to form light emitting diodes ("LEDs"), may be differentially deposited, such as printing a first row/cavity of red LEDs, a second first row/cavity of green LEDs, a third first row/cavity of blue LEDs, a fourth first row/cavity of red LEDs, etc., creating a light emitting apparatus having control over color temperature, for example and without limitation. As mentioned above, connections or couplings, such as wires or leads, may be connected to corresponding vias 280, 285, without a conductive backplane 290, to provide the capability for individual selection of such rows, through the application of a corresponding voltage or current. As described in greater detail below with reference to FIG. 20, additional coatings may also be utilized, such as coatings of one or more types of phosphors for LED applications.

Figure 16:
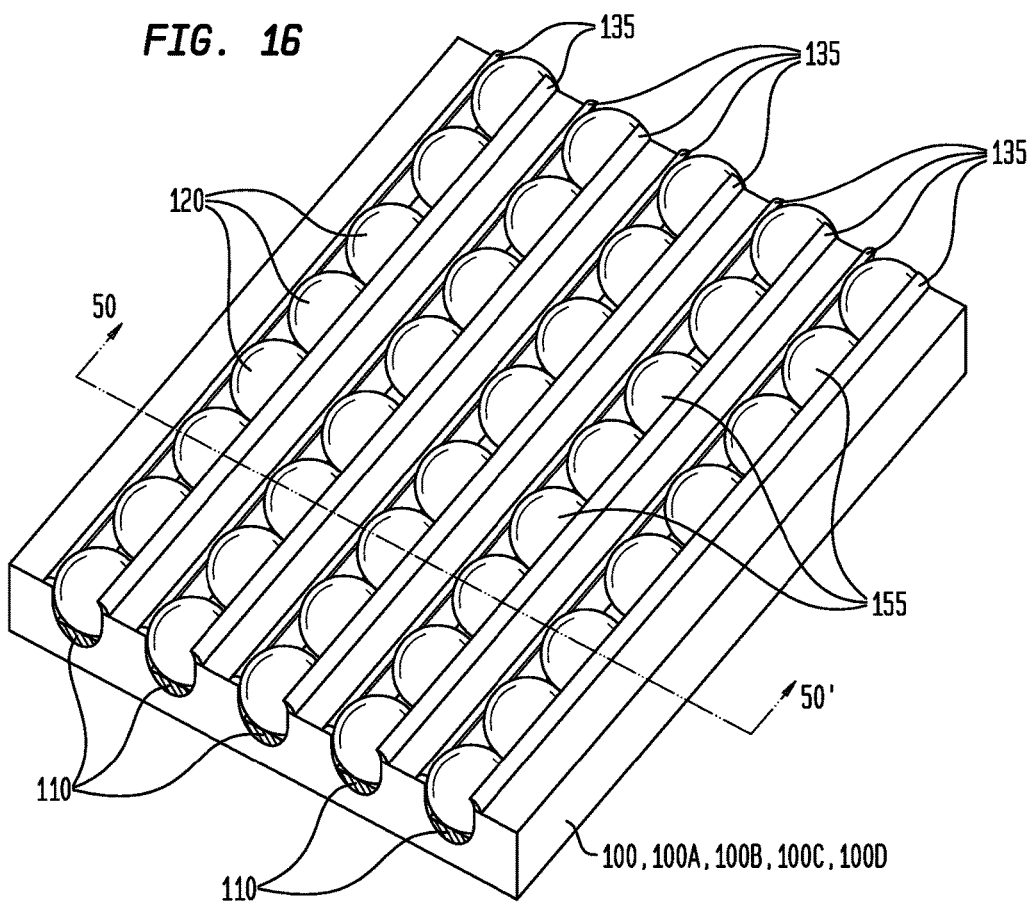
FIG. 16 is a perspective view of an exemplary base with a plurality of first conductors, a plurality of diodes, and a plurality of insulators for an apparatus embodiment in accordance with the teachings of the present invention.
Figure 17:
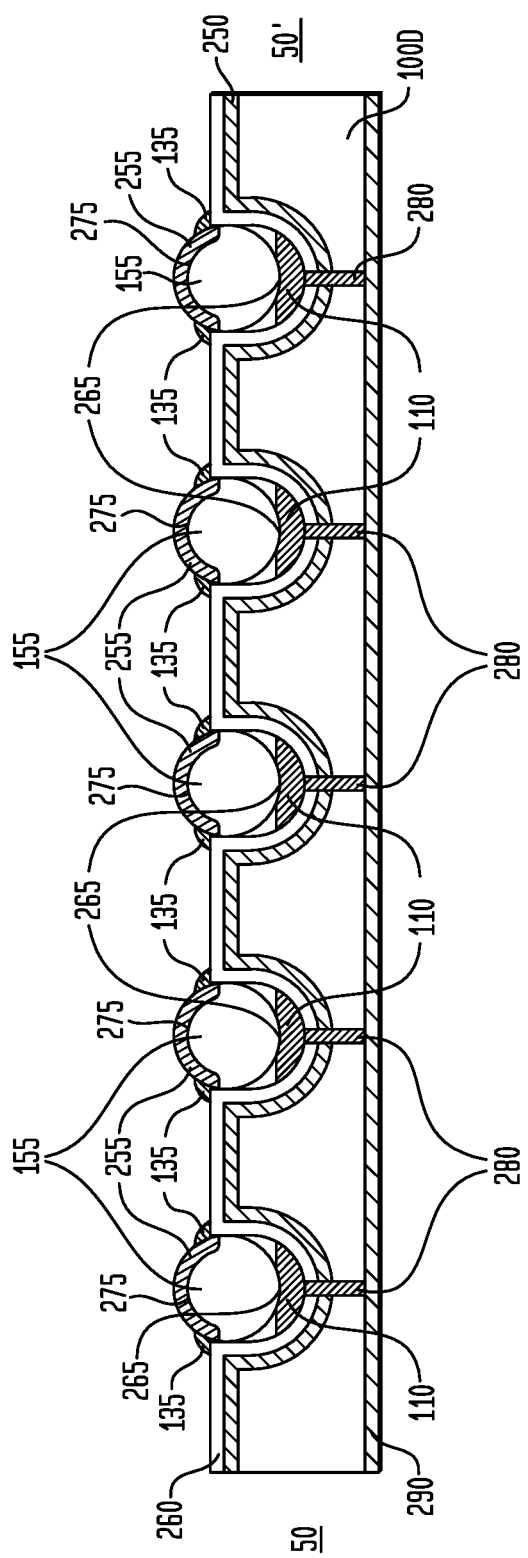
FIG. 17 is a cross-sectional view of the fifth exemplary base with a plurality of first conductors, a plurality of diodes, and a plurality of insulators for an apparatus embodiment in accordance with the teachings of the present invention.

FIG. 16 is a perspective view of an exemplary base 100, 100A, 100B, 100C, 100D with a plurality of first conductors 110, a plurality of diodes 155, and a plurality of insulators 135 having been deposited for an apparatus embodiment in accordance with the teachings of the present invention. FIG. 17 is a cross-sectional view (through the 50-50' plane) of the fifth exemplary base 100D with a plurality of first conductors 110, a plurality of diodes 155, and a plurality of insulators 135 having been deposited for an apparatus embodiment in accordance with the teachings of the present invention. As an option, an insulating material has been deposited over the peripheral or lateral portions of the first (top or upper) portions of the plurality of diodes 155 to form a corresponding plurality of insulators 135, such as through a printing or coating process, prior to deposition of a plurality of second conductors 140 or a single second conductor 140 (e.g., a second conductive layer), or may be deposited as a single, continuous insulating layer (as illustrated and discussed below with reference to FIGS. 34, 35 and 36). The optional insulators 135 may be utilized to help prevent any contact between a second conductor 140 and the second or lower (in this case, p-type) portion of a diode 155. In addition, in exemplary embodiments, an insulator 135 may be deposited as a layer, provided enough of the diodes 155 remain exposed both for contact with one or more second conductors 140 and exposure of the first, upper portions of the diodes 155 for light emission or absorption. As mentioned above with reference to FIG. 15, one or more insulators 135 may also be deposited prior to diode 155 creation.

In addition, the plurality of insulators 135 may be comprised of any of the insulating or dielectric compounds suspended in any of various media, as discussed above and below, such as inorganic dielectric particles suspended in a polymeric media having a photoinitiator, for example and without limitation. In the illustrated embodiments, one or more dielectric suspensions, of inorganic dielectric particles suspended in polymeric media having a photoinitiator, such as a uv-curable polymeric binder, are deposited separately from or in addition to the plurality of substrate particles 120 to form one or more insulators 135. Exemplary dielectric compounds utilized to form an insulating (or dielectric) suspension include, for example and without limitation: organic or inorganic dielectric particles (e.g., barium titanate, titanium dioxide, in powder or other particulate form, etc.) suspended in solvents or polymers such as deionized water, diethylene glycol, isopropanol, butanol, ethanol, PM acetate (propylene glycol monomethyl ether acetate), dibasic esters (e.g., Invista DBE-9); water soluble resins such as polyvinyl alcohol ("PVA"), polyvinyl butyral ("PVB"), polyvinyl pyrrolidone, polyethylene glycol; and flow aids or surfactants such as octanol and Emerald Performance Materials Foamblast 339, for example. In other exemplary embodiments, one or more insulators 135 may polymeric, such as comprising PVA or PVB in deionized water, typically less than 12 percent. Other commercially available, exemplary dielectric compounds utilized to form an insulating (or dielectric) suspension, polymer, or carrier include, without limitation: (1) from Conductive Compounds, a barium titanate dielectric; (2) from DuPont, 5018A Clear UV Cure Ink, 5018G Green UV Cure Ink, 5018 Blue UV Cure Ink, 7153 High K Dielectric Insulator, and 8153 High K Dielectric Insulator; (3) from SunPoly, Inc., 305D UV Curable dielectric ink and 308D UV Curable dielectric ink; and (4) from various suppliers, Titanium Dioxide-filled UV curable inks.

Figure 18:
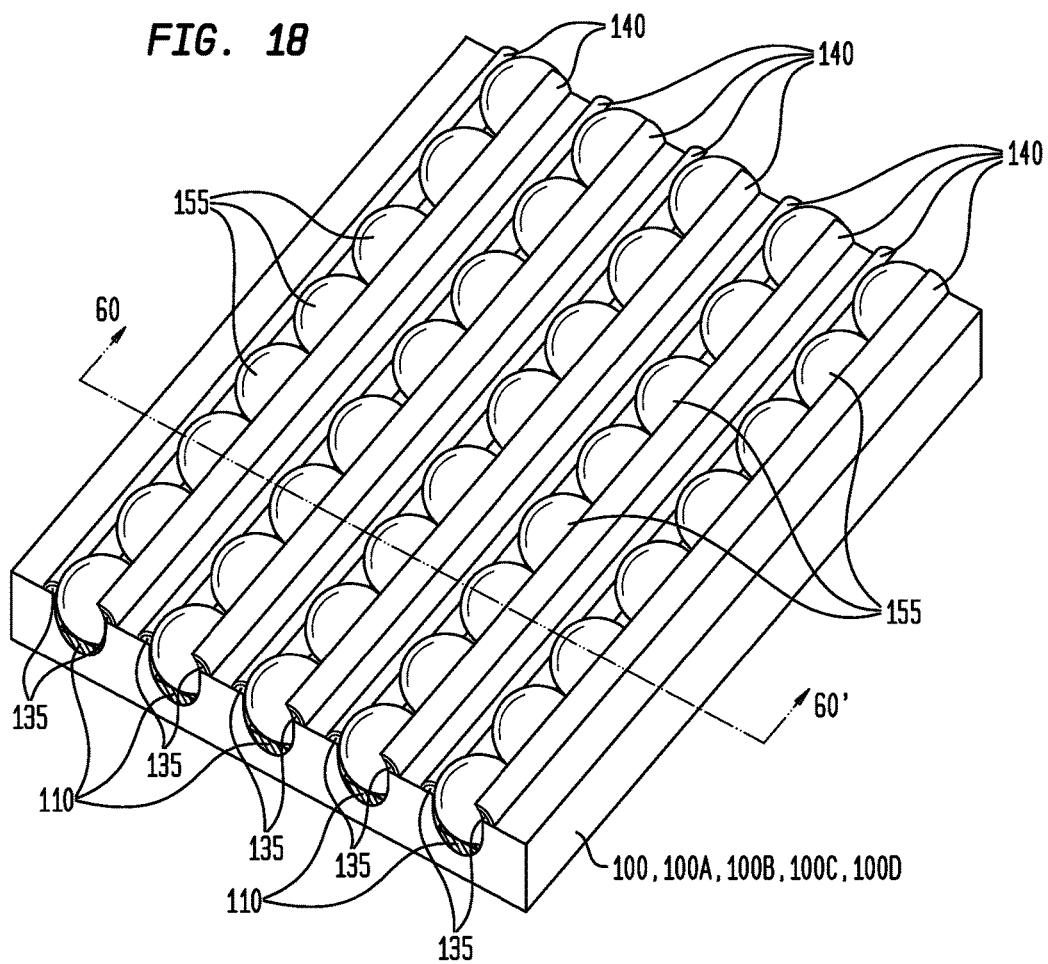
FIG. 18 is a perspective view of an exemplary base with a plurality of first conductors, a plurality of diodes, a plurality of insulators, and a plurality of second conductors for an apparatus embodiment in accordance with the teachings of the present invention.
Figure 19:
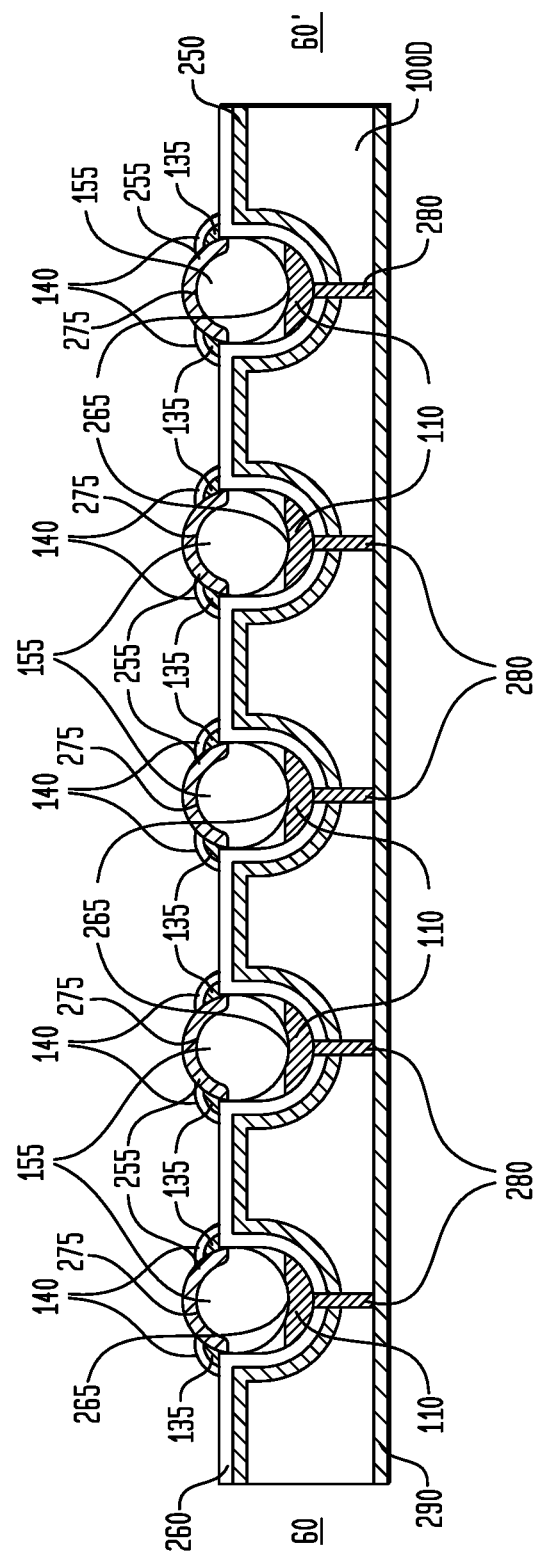
FIG. 19 is a cross-sectional view of the fifth exemplary base with a plurality of first conductors, a plurality of diodes, a plurality of insulators, and a plurality of second conductors for an apparatus embodiment in accordance with the teachings of the present invention.

FIG. 18 is a perspective view of an exemplary base 100, 100A, 100B, 100C, 100D with a plurality of first conductors 110, a plurality of diodes 155, a plurality of insulators 135, and a plurality of second conductors 140 having been deposited for an apparatus embodiment in accordance with the teachings of the present invention. FIG. 19 is a cross-sectional view (through the 60-60' plane) of the fifth exemplary base 100D with a plurality of first conductors 110, a plurality of diodes 155, a plurality of insulators 135 and a plurality of second conductors 140 having been deposited for an apparatus embodiment in accordance with the teachings of the present invention.

Referring to FIGS. 18 and 19, following either formation of the pn or other junction 275 and/or deposition of plurality of insulators 135, or vice-versa, one or more second conductors 140 are deposited (e.g., through printing a conductive ink, polymer, or other conductor such as metal), which may be any type of conductor, conductive ink or polymer discussed above, or may be an optically transmissive (or transparent) conductor, to form an ohmic contact with exposed or non-insulated portions of the first or upper (in this case, n-type) penetration layer or region (255) of the diodes 155. While illustrated as a plurality of second conductors 140, an optically transmissive second conductor also may be deposited as a single continuous layer (forming a single electrode), such as for lighting or photovoltaic applications (as illustrated and discussed below with reference to FIGS. 34, 35 and 36). An optically transmissive second conductor(s) 140 may be comprised of any compound which: (1) has sufficient conductivity to energize or receive energy from the first or upper portions of the apparatus 200, 300, 400, 500, 600, 700 in a predetermined or selected period of time; and (2) has at least a predetermined or selected level of transparency or transmissibility for the selected wavelength(s) of electromagnetic radiation, such as for portions of the visible spectrum. For example, when the present invention is utilized for lighting or photovoltaic applications, the conductivity time or speed in which a transmissive second conductor(s) 140 provides or receives energy to or from the plurality of diodes 155 is comparatively less significant than for other applications. As a consequence, the choice of materials to form the optically transmissive or non-transmissive second conductor(s) 140 may differ, depending on the selected application of the apparatus 200, 300, 400, 500, 600, 700 and depending upon the utilization of optional one or more third conductors 145 (discussed below). The one or more second conductor(s) 140 are deposited over exposed and/or non-insulated portions of the plurality of diodes 155, and/or also over any of the plurality of insulators 135 and/or ridges 115, such as by using a printing or coating process as known or may become known in the printing or coating arts, with proper control provided for any selected alignment or registration, as may be necessary or desirable. Depending upon the selected embodiment, and whether the second conductor 140 is substantially transparent, the one or more second conductor(s) 140 may be deposited over all or merely part of the exposed portions of the plurality of diodes 155 and/or any plurality of insulators 135, such as about the sides or edges of the periphery of the diodes 155, as illustrated.

In an exemplary embodiment, in addition to the conductors described above, carbon nanotubes (CNTs), polyethylene-dioxithiophene (e.g., AGFA Orgacon), a polyaniline or polypyrrole polymer, indium tin oxide (ITO) and/or antimony tin oxide (ATO) (with the ITO or ATO typically suspended as particles in any of the various binders, polymers or carriers previously discussed) may be utilized to form optically transmissive second conductor(s) 140. In an exemplary embodiment, carbon nanotubes are suspended in a polymerizable ionic liquid, such as an aqueous hydrazine with a polymerizable acrylate or other polymerizable compound (and may further include additional surfactants), with the resulting conductor (110, 140, 145) comprising carbon nanotubes suspended in a (cured) acrylic, plastic or polymer. While ITO and ATO provide sufficient transparency for visible light, their impedance or resistance is comparatively high (e.g., 20 k $\Omega$), generating a correspondingly comparatively high (i.e., slow) time constant for electrical transmission. Other compounds having comparatively less impedance may also be utilized, such as polyethylene-dioxithiophene. As a consequence, in some of the exemplary embodiments, one or more third conductors 145 (illustrated in FIGS. 22, 24, 26, 27, 33, 41) having a comparatively lower impedance or resistance is or may be incorporated into corresponding transmissive second conductor(s) 140, to reduce the overall impedance or resistance of this layer, decrease conduction time, and also increase the responsiveness of the apparatus. As indicated above, for lighting or photovoltaic applications having larger form factors, such one or more third conductors 145 may be utilized to provide more rapid illumination, enabling the energizing of the more central portions of the area to be illuminated, which might otherwise remain non-energized and dark, due to the insufficient conduction of many types of compounds which may be selected for use in optically transmissive second conductor(s) 140. For example, to form one or more third conductors 145, one or more fine wires may be formed using a conductive ink or polymer (e.g., a silver ink, CNT or a polyethylene-dioxithiophene polymer) printed over corresponding strips or wires of the transmissive second conductor(s) 140, or one or more fine wires (e.g., having a grid pattern) may be formed using a conductive ink or polymer printed over a larger, unitary transparent second conductor 140 in larger displays, to provide for increased conduction speed throughout the transparent second conductor 140, and is discussed in greater detail in the related applications. Use of such third conductors 145 is illustrated in various Figures and discussed further below.

Other compounds which may be utilized equivalently to form substantially optically transmissive second conductor(s) 140 include indium tin oxide (ITO) as mentioned above, and other transmissive conductors as are currently known or may become known in the art, including one or more of the conductive polymers discussed above, such as polyethylene-dioxithiophene available under the trade name "Orgacon", and various carbon and/or carbon nanotube-based transparent conductors. Representative transmissive conductive materials are available, for example, from DuPont, such as 7162 and 7164 ATO translucent conductor. Transmissive second conductor(s) 140 may also be combined with various binders, polymers or carriers, including those previously discussed, such as binders which are curable under various conditions, such as exposure to ultraviolet radiation (uv curable).

Referring again to FIGS. 18 and 19, when the first (110) and second (140) conductor(s) are energized, resulting in the provision of power to the plurality of diodes 155 such as LEDs, light is emitted in the visible spectrum. The resulting apparatus 200, 300, 400, 500, 600 and/or 700 (correspondingly referred to as a light emitting apparatus 200A, 300A, 400A, 500A, 600A, 700A), therefore, has particular usefulness for lighting applications and for static display applications. Similarly, when the plurality of diodes 155 are photovoltaic diodes (forming a photovoltaic apparatus correspondingly referred to as an apparatus 200B, 300B, 400B, 500B, 600B and/or 700B), when exposed to light, a voltage is generated across the one or more first conductors 110 and the one or more second conductors 140. As the one or more first conductors 110 are located between the diodes 155 and the base (100-100H), the corresponding voltages may be provided or obtained through the conductive backplane 290, through the conductive vias 280 or 285, through exposed edges of the one or more first conductors 110 about the periphery of the apparatus 200, 300, 400, 500, 600 and/or 700, or through any other connections coupled to the vias 280, 285 or conductors 110. Access to the one or more second conductors 140 also may be made through exposed edges about the periphery of the apparatus 200, 300, 400, 500, 600, or from the first or upper side of the apparatus 200, 300, 400, 500, 600, 700.

Figure 20:
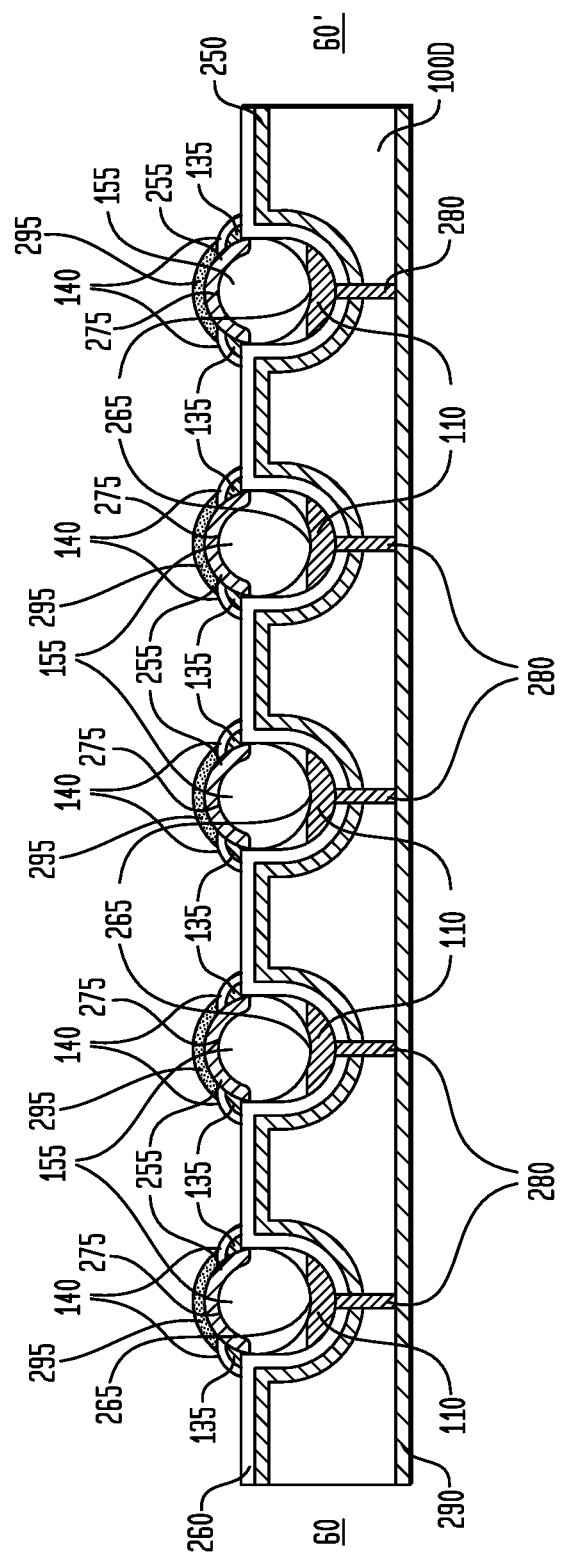
FIG. 20 is a cross-sectional view of the fifth exemplary base with a plurality of first conductors, a plurality of diodes, a plurality of insulators, a plurality of second conductors, and an emissive layer for an apparatus embodiment in accordance with the teachings of the present invention.

FIG. 20 is a cross-sectional view of the fifth exemplary base 100D with a plurality of first conductors 110, a plurality of diodes 155, a plurality of insulators 135, a plurality of second conductors 140, and one or more emissive layers 295 (e.g., comprising one or more phosphor layers or coatings), forming for an apparatus embodiment in accordance with the teachings of the present invention. In an exemplary embodiment, such as an LED embodiment, one or more emissive layers 295 may be deposited, such as through printing or coating processes discussed above, over the diodes 155 (and may also be deposited over other selected areas or the entire surface). The one or more emissive layers 295 may be formed of any substance or compound capable of or adapted to emit light in the visible spectrum (or other electromagnetic radiation at any selected frequency) in response to light (or other electromagnetic radiation) emitted from diodes 155. For example, a yellow phosphor-based emissive layer 295 may be utilized with a blue light emitting diode 155 to produce a substantially white light. Such electroluminescent compounds include various phosphors, which may be provided in any of various forms and with any of various dopants, such as a zinc sulfide or a cadmium sulfide doped with copper, magnesium, strontium, cesium, rare earths, etc. One such exemplary phosphor is a zinc sulfide (ZnS-doped) phosphor, which may be provided in an encapsulated (particulate) form for ease of use, such as the micro-encapsulated ZnS-doped phosphor encapsulated powder from the DuPont™ Luxprint® electroluminescent polymer thick film materials. While not combined with a dielectric in the exemplary embodiments, this phosphor may also be combined with a dielectric such as barium titanate or titanium dioxide, to adjust the dielectric constant of this layer. The EL compounds or particles forming the one or more emissive layers 295 may be utilized in or suspended in a polymer form having various binders, and also may be separately combined with various binders (such as phosphor binders available from DuPont or Conductive Compounds), both to aid the printing or other deposition process, and to provide adhesion of the phosphor to the underlying and subsequent overlying layers. The one or more emissive layers 295 may also be provided in either uv-curable or heat-curable forms. A wide variety of equivalent electroluminescent compounds are available, are within the scope of the present invention.

A wide variety of equivalent electroluminescent compounds are available and are within the scope of the present invention, including without limitation: (1) From DuPont, 7138) White Phosphor, 7151) Green-Blue Phosphor, 7154) Yellow-Green Phosphor, 8150 White Phosphor, 8152 Blue-Green Phosphor, 8154 Yellow-Green Phosphor, 8164 High-Brightness Yellow-Green and (2) From Osram, the Glacier-Glo series, including blue GGS60, GGL61, GGS62, GG65; blue-green GGS20, GGL21, GGS22, GG23/24, GG25; green GGS40, GGL41, GGS42, GG43/44, GG45; orange type GGS10, GGL11, GGS12, GG13/14; and white GGS70, GGL71, GGS72, GG73/74. In addition, depending upon the selected embodiment, colorants, dyes and/or dopants may be included within any such emissive layer 295. In addition, the phosphors or phosphor capsules utilized to form an emissive layer 295 may include dopants which emit in a particular spectrum, such as green or blue. In those cases, the emissive layer may be printed to define pixels for any given or selected color, such as RGB or CMYK, to provide a color display.

As such one or more emissive layers 295 are utilized for light emitting applications, they are not separately illustrated in FIGS. 21-40. Those having skill in the art will recognize that any of the devices illustrated in FIGS. 21-40 may also comprise such one or more emissive layers 295 coupled to or deposited over the illustrated diodes 155. For example and without limitation, as discussed below, a plurality of lenses 150 (suspended in a polymer (resin or other binder) 165) also may be deposited directly over the one or more emissive layers 295 and other features, to create any of the various light emitting apparatus embodiments 200A, 300A, 400A, 500A, 600A and/or 700A.

Figure 21:
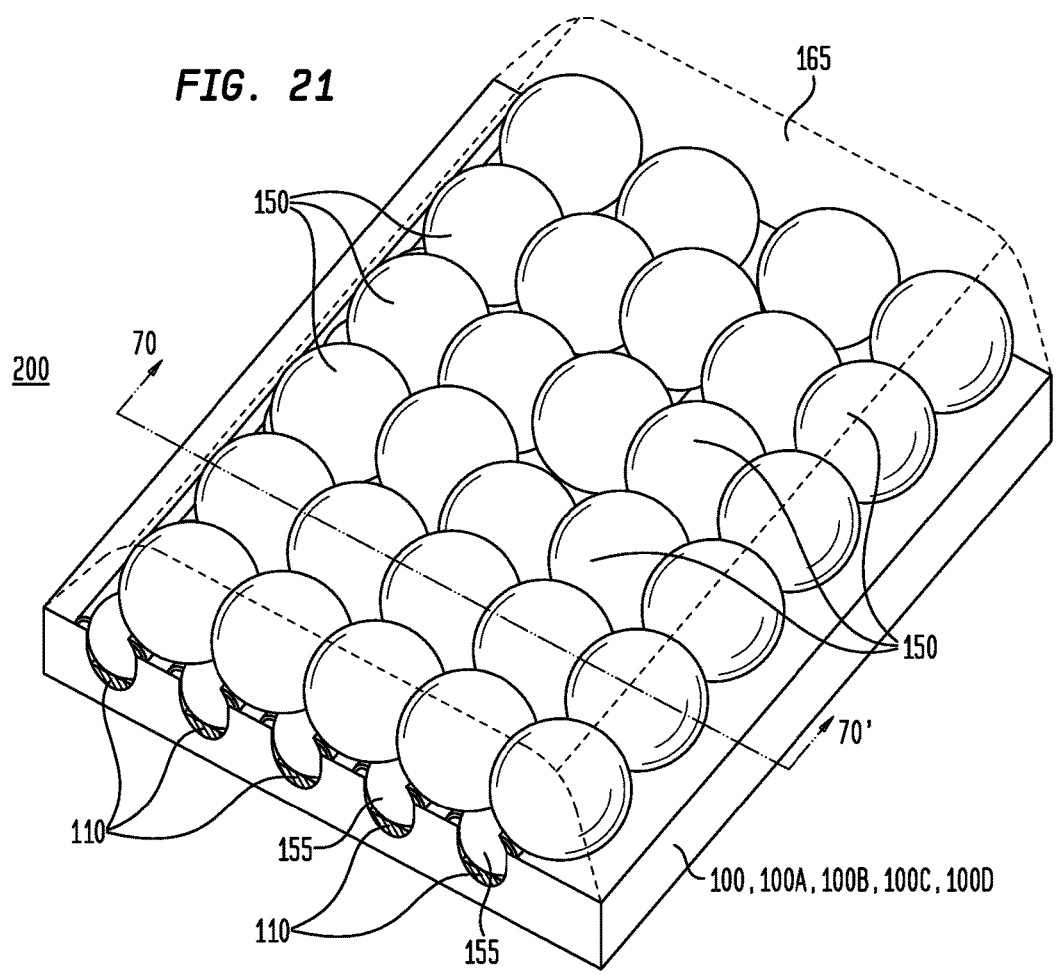
FIG. 21 is a perspective view of an exemplary base with a plurality of first conductors, a plurality of diodes, a plurality of second conductors, and a plurality of lenses suspended in a polymer for an apparatus embodiment in accordance with the teachings of the present invention.
Figure 22:
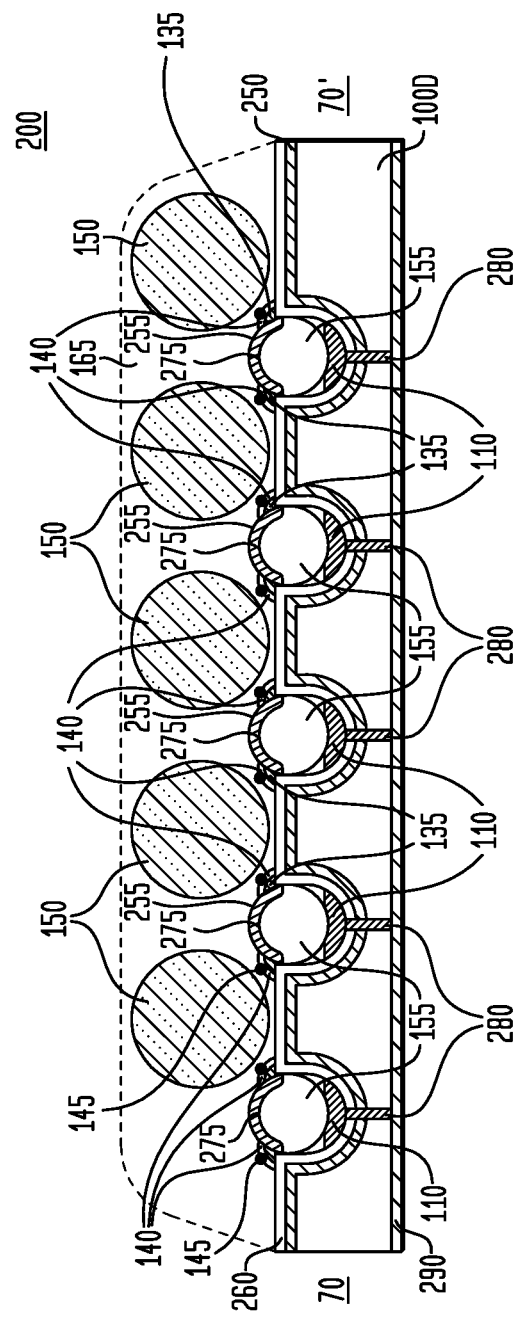
FIG. 22 is a cross-sectional view of the fifth exemplary base with a plurality of first conductors, a plurality of diodes, a plurality of insulators, a plurality of second conductors, a plurality of third conductors, and a plurality of lenses suspended in a polymer for an apparatus embodiment in accordance with the teachings of the present invention.

FIG. 21 is a perspective view of an exemplary base 100, 100A, 100B, 100C, 100D with a plurality of first conductors 110, a plurality of diodes 155, a plurality of insulators 135, a plurality of second conductors 140, and a plurality of lenses 150 (suspended in a polymer (resin or other binder) 165) having been deposited for an apparatus 200 embodiment in accordance with the teachings of the present invention. FIG. 22 is a cross-sectional view (through the 70-70' plane) of the fifth exemplary base with a plurality of first conductors 110, a plurality of diodes 155, a plurality of insulators 135, a plurality of second conductors 140, a plurality of third conductors 145 (not visible in FIG. 21 as covered by lenses 150), and a plurality of lenses 150 (suspended in a polymer (resin or other binder) 165) having been deposited for an apparatus 200 embodiment in accordance with the teachings of the present invention. Not separately illustrated, the apparatus (200, 300, 400, 500, 600, 700) may also include one or more emissive layers 295, and/or may also include a protective coating, such as a substantially clear plastic or other polymer, for protection from various elements, such as weather, airborn corrosive substances, etc., or such a sealing and/or protective function may be provided by the polymer (resin or other binder) 165.

(For ease of illustration, FIG. 21 illustrates such a polymer (resin or other binder) 165 using the dotted lines to indicate substantial transparency.)

In exemplary embodiments, the plurality of lenses 150 may be comprised of a borosilicate glass or other silicate glass, or a plastic such as polystyrene latex, although any of myriad types of materials may be utilized, including without limitation, other types of glass, plastic, other polymers, crystals or polycrystalline silicate glass, and/or mixes of different types of materials, in any shape or size. While illustrated as substantially spherical, the plurality of lenses 150 may also have other shapes and forms, such as substantially hemispherical, faceted, elliptical (or oblong), irregular, cubic, or various prismatic shapes (e.g., trapezoidal, triangular, pyramidal, etc.), for example and without limitation, and may also have any of the variations and/or tolerances discussed above with reference to the plurality of substrate particles 120, such as with respect to shape, size, etc. The plurality of lenses 150 (having at least a first index of refraction) are suspended as particles in a substantially transparent, optically clear polymer (resin or other binder) 165 (such as various types of urethane, for example and without limitation), which may be uv, heat or air curable or dryable, also for example and without limitation, and further which has at least a second, different index of refraction (different than the first index of refraction of the plurality of lenses 150).

The plurality of lenses 150 may have a wide variety of spatial relationships to the plurality of diodes 155, and may have a wide variety of sizes. No particular spatial relationships (e.g., such as regular or irregular spacing, abutting relationships, etc.) should be inferred from FIGS. 21-22 (or the other FIGS. 23, 24, 30-33, 35, and 36), particularly as these Figures are not drawn to scale. For example, as mentioned below, the lenses 150 may be considerably larger than the diodes 155, such as five times as large in an exemplary embodiment.

Figure 31:
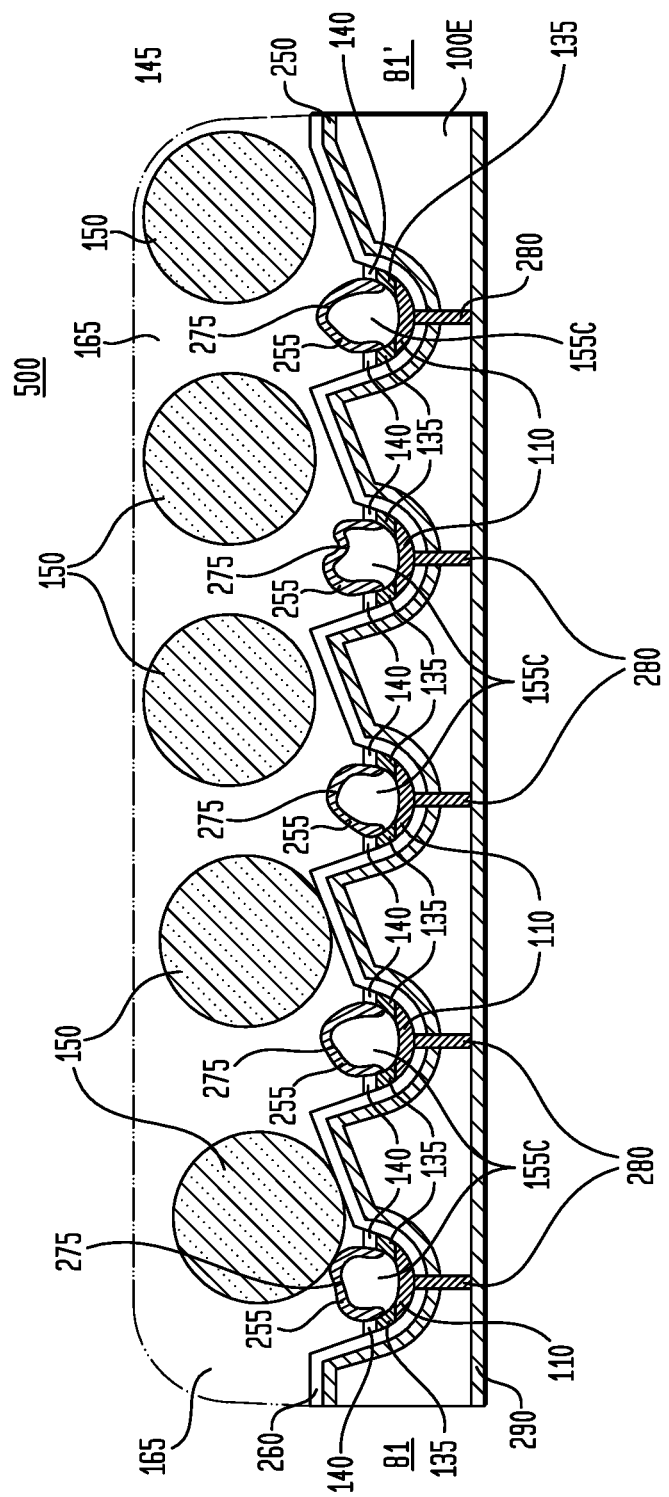
FIG. 31 is a cross-sectional view of the fifth exemplary base with a plurality of first conductors, a plurality of substantially irregular diodes, a plurality of insulators, a plurality of second conductors, and a plurality of lenses suspended in a polymer for an apparatus embodiment in accordance with the teachings of the present invention.

In an exemplary embodiment, a polymer (resin or other binder) 165 or other polymer may be utilized having a viscosity which also may provide at least some spacing between the plurality of lenses 150 and between the plurality of lenses 150 and the diodes 155, such that the plurality of lenses 150 and plurality of diodes 155 are not in immediate or direct, abutting contact, but with each lens 150 being surrounded at least by a thin film or coating of a polymer (resin or other binder) 165. In another exemplary embodiment, a comparatively less viscous binder is utilized, and any, some or all of the plurality of lenses 150 and plurality of diodes 155 are allowed to be in direct, abutting contact with each other or with other apparatus components (as illustrated in FIG. 31). The polymer (resin or other binder) 165 is considered optically clear or transparent (in its cured or dried form) depending on the selected wavelength of interest, such as visible, infrared and ultraviolet light, may be considered optically opaque for other wavelengths, and vice-versa. In addition to various types of urethane polymers, any and all other polymers, resins or binders (including any incorporated solvents, flow aids, surfactants, etc.) may be utilized which are substantially transparent at the selected wavelengths in their cured or dried form and which have an appropriately selected second index of refraction for the selected wavelengths, including those discussed previously, for example and without limitation deionized water, diethylene glycol, isopropanol, butanol, ethanol, PM acetate (propylene glycol monomethyl ether acetate), methoxylated glycol ether acrylate monomer (which may also include a water soluble photoinitiator such TPO (triphosphene oxides)), dibasic esters (e.g., Invista DBE-9); water soluble resins such as polyvinyl alcohol, polyvinyl butyral, polyvinyl pyrrolidone, polyethylene glycol; and flow aids or surfactants such as octanol and Emerald Performance Materials Foamblast 339.

Following deposition of the one or more second conductors 145 (and/or third conductors 145) (and/or one or more emissive layers 295), in an exemplary embodiment, the plurality of lenses 150 suspended in a polymer (resin or other binder) 165 may be deposited, such as through a printing process, over the diodes 155 (and/or one or more emissive layers 295), one or more second conductors 145 (and/or third conductors 145), any exposed base (100-100H), and so on. In another exemplary embodiment, the plurality of lenses 150 are suspended in a polymer (resin or other binder) 165 in a sheet, panel or other form and cured, with the resulting sheet or panel then attached to the remainder of the apparatus 200, 300, 400, 500, 600 and/or 700 (i.e., over the diodes 155 (and/or one or more emissive layers 295), one or more second conductors 145 (and/or third conductors 145), any exposed base (100-100H), and so on), such as through a lamination process, for example and without limitation, and all such variations are within the scope of the claimed invention.

Accordingly, whether the plurality of lenses 150 suspended in a polymer (resin or other binder) 165 are deposited directly over the diodes 155 (and/or one or more emissive layers 295), one or more second conductors 145 (and/or third conductors 145), and any exposed base (100-100H), or whether the plurality of lenses 150 suspended in a polymer (resin or other binder) 165 are formed as a separate structure and subsequently attached over the diodes 155 (and/or one or more emissive layers 295), one or more second conductors 145 (and/or third conductors 145), and any exposed base (100-100H), the combination of the plurality of lenses 150 suspended in a polymer (resin or other binder) 165 defines a lens (or lensing) structure 150, 165 having a plurality of indexes (or indices) of refraction, namely, a plurality of lenses 150 having at least a first index of refraction and a polymer (resin or other binder) having at least a second index of refraction. This is also in sharp contrast with the prior art, in which lens or diffusion panels are comprised of a singular prefabricated material, typically plastic or another polymer, having a single index of refraction, and typically having a lens size several orders of magnitude larger than the plurality of lenses 150 utilized in various exemplary embodiments, as discussed in greater detail below (e.g., having a mean diameter between about 40-400 microns).

The plurality of lenses 150, particularly when implemented as substantially spherical lenses, provide several functions, including a concentrating function, for collection of light and concentrating such light on plurality of diodes 155 for higher efficiency coupling for photovoltaic applications, and also for widening the angle of incidence (or acceptance) for the apparatus 200, 300, 400, 500, 600, 700 and/or 200B, 300B, 400B, 500B, 600B, 700B, as light incident from many angles will nonetheless be focused on the plurality of diodes 155. In addition, the plurality of lenses 150 also perform a dispersion function, for spreading light provided by the plurality of spherical diodes 155 (and/or one or more emissive layers 295) when formed to be LEDs 155, for the apparatus 200, 300, 400, 500, 600, 700 and/or 200A, 300A, 400A, 500A, 600A, 700A, for example. Another advantage of the plurality of lenses 150 is that no particular alignment or registration is necessary, that they do not need to have any specific position with respect to the spherical diodes 155, with any given lens 150 either concentrating light upon or dispersing light from several diodes 155. Indeed, as a measure or indicia of comparative sizes, the ratio of the diameter (or radius) of a spherical lens 150 to the diameter (or radius) of a spherical diode 155 has been modeled to be significant from approximately 10:1 to 2:1, with a potentially optimum ratio of 5:1 for comparatively higher or more significant mode coupling or otherwise significantly greater light concentration (or dispersion). The mean diameter of the plurality of substantially spherical lenses is generally about 20 to 400 microns (corresponding to diodes 155 in about the 10-40 micron range), and more particularly is about 80 to 140 microns. The typical or mean diameter(s) of the plurality of diodes 155 (and any space between the ridges (peaks, raised portions or crests) 115 of the exemplary base 100 (or, equivalently, the width of the ridges (peaks, raised portions or crests) 115 of the exemplary base 100-100G) may be selected or otherwise predetermined such that the plurality of lenses 150 may be a specific or predetermined distance apart from each other and/or to form a substantially or relatively full layer of lenses 150.

The use of the plurality of lenses 150 to widen the angle of incidence for incoming light for an apparatus 200, 300, 400, 500, 600, 700 is particularly significant for photovoltaic applications. In the prior art, as the angle of the photovoltaic (PV) device changes with respect to the incoming sunlight, the efficiency correspondingly varies as well, and the prior art PV device panels either must be moved to coincide with the changing angle of incidence, or lose efficiency. In accordance with the exemplary embodiments, no such movement of the apparatus 200B, 300B, 400B, 500B, 600B, 700B is required, due to the concentrating effect of the plurality of lenses 150 with its significantly wider angle of incidence (or acceptance) when implemented as spherical lenses.

While illustrated using a plurality of substrate particles 120 (to form a corresponding plurality of diodes 155) which are spherical and a plurality of lenses 150 which are also spherical, other shapes and forms of such substrate particles 120 and/or lenses 150, in addition to spherical, are within the scope of the claimed invention. Exemplary pluralities of substrate particles 120 having other shapes, such as faceted, elliptical or elongated, and irregular, for example, are illustrated and discussed below with reference to FIGS. 26-31. Also for example, a spherical or other shape may be selected to provide optical resonance of any trapped light within a diode 155, potentially increasing the amount of time in which the light is within a diode 155 and thereby increasing the efficiency of photovoltaic diodes 155. Other optically resonant forms or shapes for diodes 155 are also feasible, including cylindrical or rod shapes, toroidal or ring shapes, for example and without limitation. Similarly, other lens 150 shapes (such as faceted, elliptical (or oblong) and/or irregular shapes, also for example and without limitation) are also within the scope of the claimed invention.

For example, the various pluralities of diodes 155 may also be comprised of different sized spherical diodes 155, for potential optical resonance corresponding to different wavelengths of light, and similarly, the plurality of lenses 150 may also be comprised of different sized spherical and other shaped lenses 150, to create a plurality of different focal points, mode coupling and diffusion capabilities. This may serve to increase the spectral density of the light absorbed or emitted. The various lenses 150 of the plurality of lenses 150 may also have different indexes (or indices) of refraction, providing a plurality of different refractive indexes.

Figure 30:
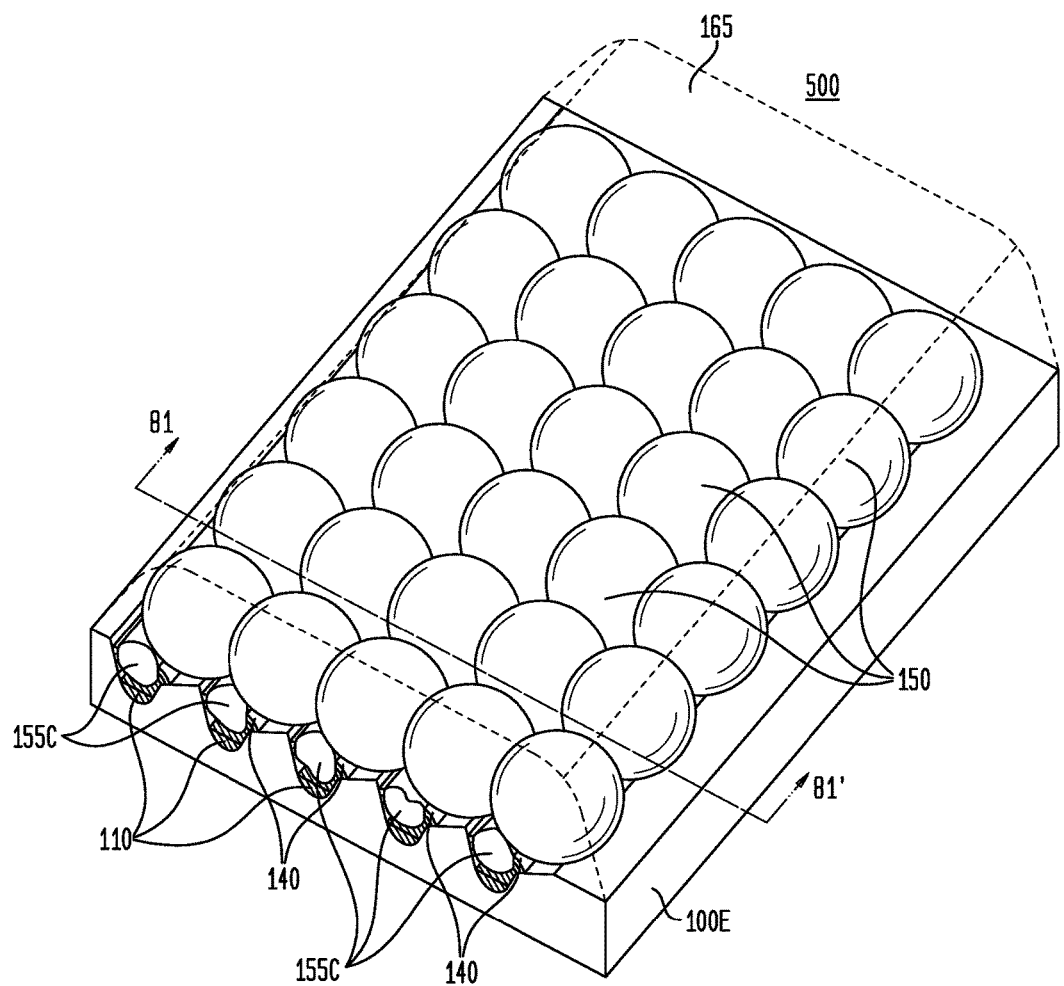
FIG. 30 is a perspective view of an exemplary base with a plurality of first conductors, a plurality of substantially irregular diodes, a plurality of insulators, a plurality of second conductors, and a plurality of lenses suspended in a polymer for an apparatus embodiment in accordance with the teachings of the present invention.

For any of these various applications, such as light emitting applications, the substrate particles 120 may have any shape or size, in addition to spherical. For example, diodes 155 may be formed which are faceted or have other surface textures and shapes, to potentially increase light output, as illustrated in FIGS. 26, 27, 30 and 31. Also for example, irregularly shaped diodes 155, as illustrated in FIGS. 30 and 31, also may be useful for creating multiple focal points (based on multiple angles of incidence) and for increasing the comparative or relative size of the junction 275, to have a bigger target area both laterally and vertically.

Not separately illustrated, there may be a plurality of layers of diodes 155 and/or lenses 150. For example, a plurality of diodes 155 may be stacked, one on top of another, or side-by side along the width of a cavity or channel 105, or may be nested, with larger diodes 155 on a layer beneath smaller diodes 155. Also not separately illustrated, any selected apparatus 200, 300, 400, 500, 600, 700 may have any selected mixture of different shaped and/or sized diodes 155 and/or lenses 150. In addition, the plurality of lenses 150 suspended in a polymer (resin or other binder) 165 may have any of various locations with respect to the remainder of the apparatus 200, 300, 400, 500, 600, 700, including regularly spaced, randomly spaced, irregularly spaced, abutting, spaced apart, stacked, and so on, with some of this variation illustrated in FIG. 31.

Figure 23:
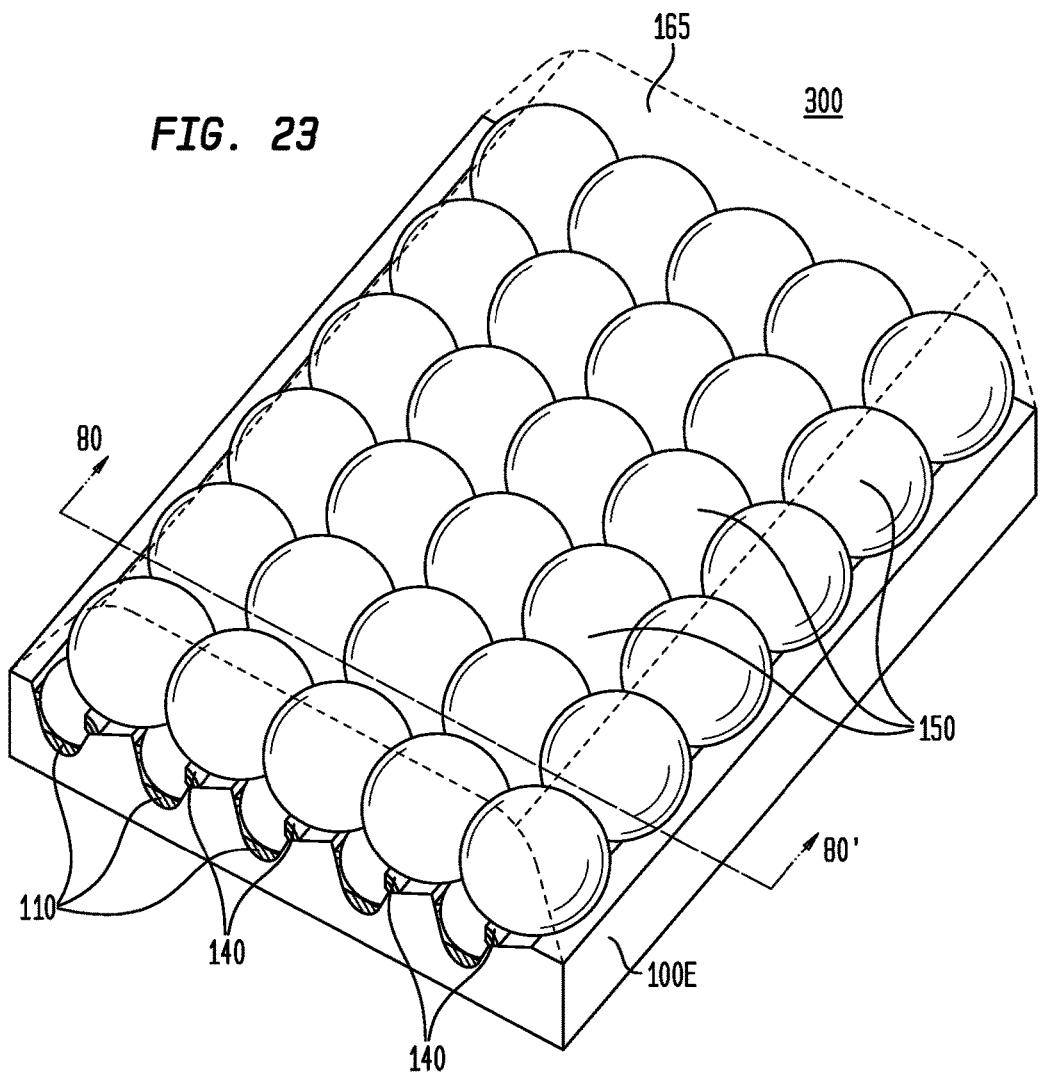
FIG. 23 is a perspective view of an exemplary seventh base with a plurality of first conductors, a plurality of diodes, a plurality of insulators, a plurality of second conductors, and a plurality of lenses suspended in a polymer for an apparatus embodiment in accordance with the teachings of the present invention.
Figure 24:
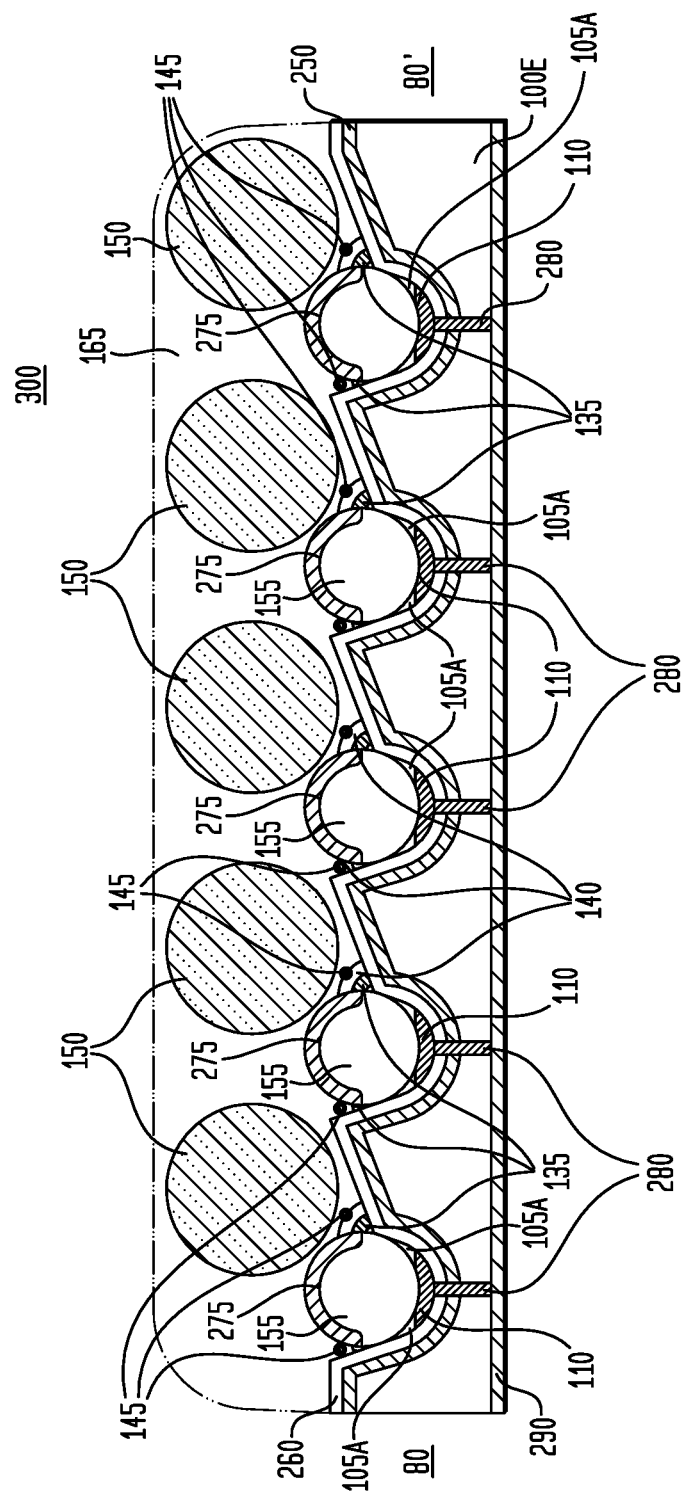
FIG. 24 is a cross-sectional view of the seventh exemplary base with a plurality of first conductors, a plurality of diodes, a plurality of insulators, a plurality of second conductors, a plurality of third conductors, and a plurality of lenses suspended in a polymer for an apparatus embodiment in accordance with the teachings of the present invention.

FIG. 23 is a perspective view of an exemplary seventh base 100E with a plurality of first conductors 110, a plurality of diodes 155, a plurality of insulators 135, a plurality of second conductors 140, and a plurality of lenses 150 (suspended in a polymer (resin or other binder) 165) having been deposited for an apparatus 300 embodiment in accordance with the teachings of the present invention. FIG. 24 is a cross-sectional view (through the 80-80' plane) of the seventh exemplary base 100E with a plurality of first conductors 110, a plurality of diodes 155, a plurality of insulators 135, a plurality of second conductors 140, a plurality of third conductors 145, and a plurality of lenses 150 having been deposited for an apparatus 300 embodiment in accordance with the teachings of the present invention. The apparatus 300 differs from the embodiments discussed above insofar as the channels (cavities or grooves) 105 of the base 100E have the form of an off-axis parabola (or paraboloid) 105A, and the ridges (or crests) 115 are substantially angled compared to substantially flat ridges (or crests) 115 of a base 100 (i.e., at a substantial angle (e.g., between about 15 to 60 degrees) to a plane defining or comprising the first or second sides of the base 100E). FIG. 24 also illustrates use of the third conductors 145, as discussed above. A resulting apparatus 300, 300A and/or 300B otherwise functions substantially the same as any of the other apparatus embodiments discussed herein.

As mentioned above, a potential size range for the plurality of substrate particles 120 and resulting plurality of diodes 155 may be in the range of about 10-40 or 25-40 (or more) microns, which is comparatively much smaller than conventional, prior art diodes. As a result, in accordance with the exemplary embodiments, generally there are comparatively many diodes 155 in a given area of an apparatus 200, 300, 400, 500, 600, 700. Such a comparatively high density of diodes 155 has the further result of substantial resiliency and robustness, as the statistical failure of even a high percentage of the diodes 155 nonetheless results in a useable apparatus 200, 300, 400, 500, 600, 700. For example, various devices with different amounts of non-functioning diodes 155 may be "binned' accordingly. Continuing with the example, an apparatus 200, 300, 400, 500, 600, 700 with fewer functioning diodes 155 when implemented as LEDs may simply be binned as a lower output lighting device comparable to the light output of a 60 W light bulb, rather than a 100 W light bulb.

Also as mentioned above, following deposition of the plurality of lenses 150 suspended within the polymer (resin or other binder) 165, various protective coatings may be deposited, also as indicated in the related applications incorporated herein by reference.

Figure 25:
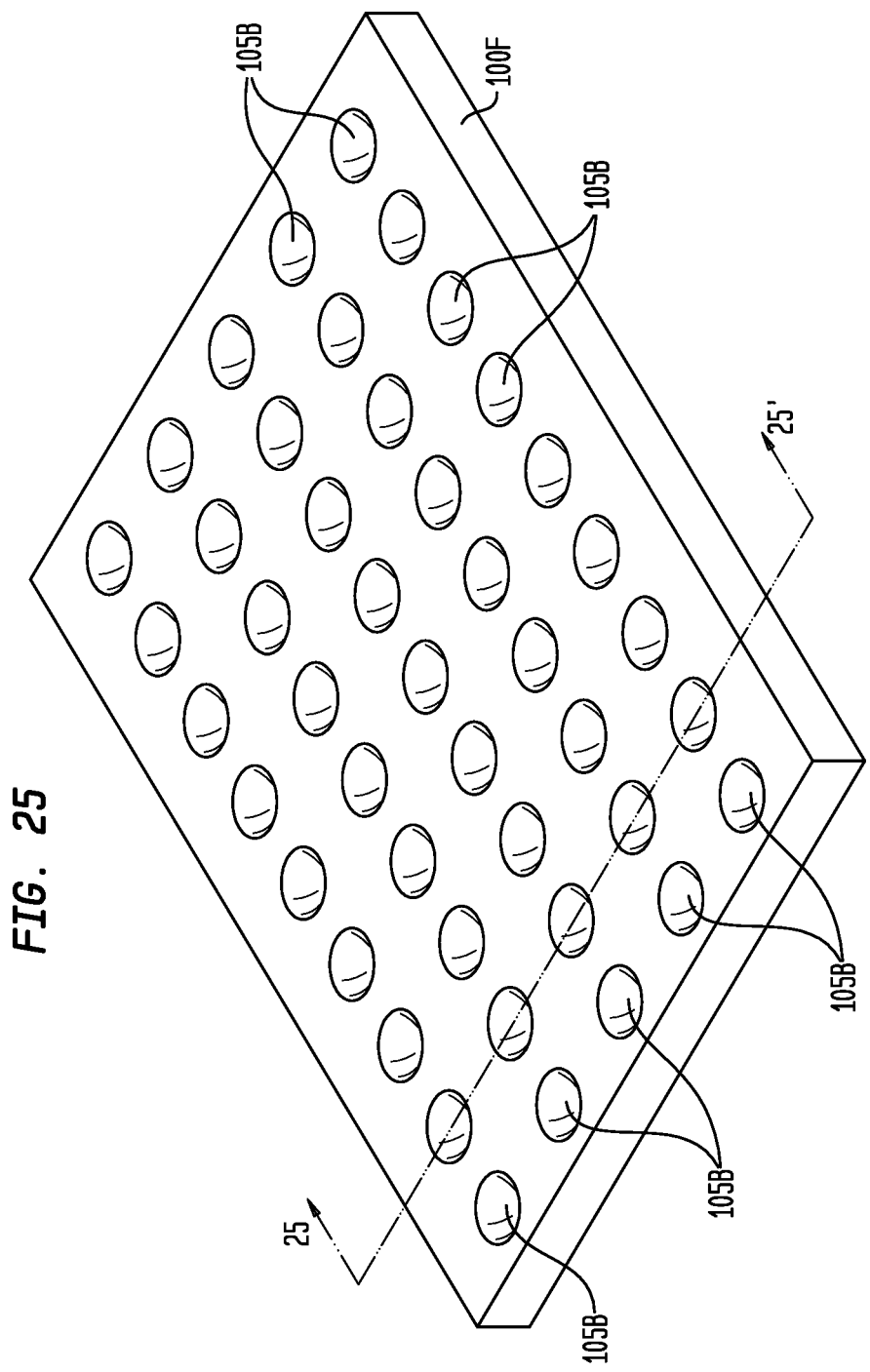
FIG. 25 is a perspective view of an exemplary eighth base for an apparatus embodiment in accordance with the teachings of the present invention.

FIG. 25 is a perspective view of an exemplary eighth base 100F for an apparatus embodiment in accordance with the teachings of the present invention, and differs from those previously discussed insofar as the cavities (channels, trenches or voids) 105 are shaped to be substantially circular (hemispherical) or elliptical depressions or bores 105B, forming a base 100F (which differs from bases 100-100E, 100G only due to the shape of the cavities 105B). A resulting apparatus 200, 300, 400, 500, 600 and/or 700 otherwise functions substantially the same as any of the other apparatus embodiments discussed herein.

Figure 26:
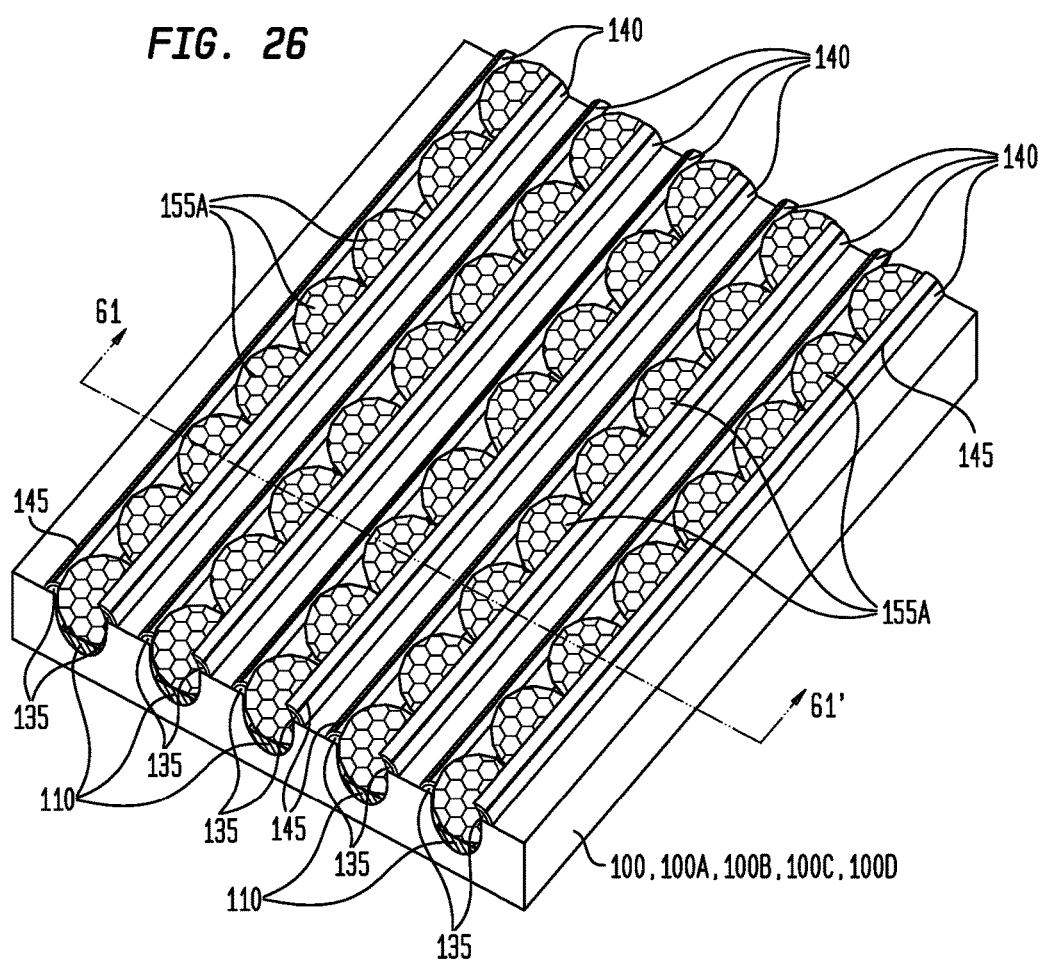
FIG. 26 is a perspective view of an exemplary base with a plurality of first conductors, a plurality of substantially faceted diodes, a plurality of second conductors, and a plurality of third conductors for an apparatus embodiment in accordance with the teachings of the present invention.
Figure 27:
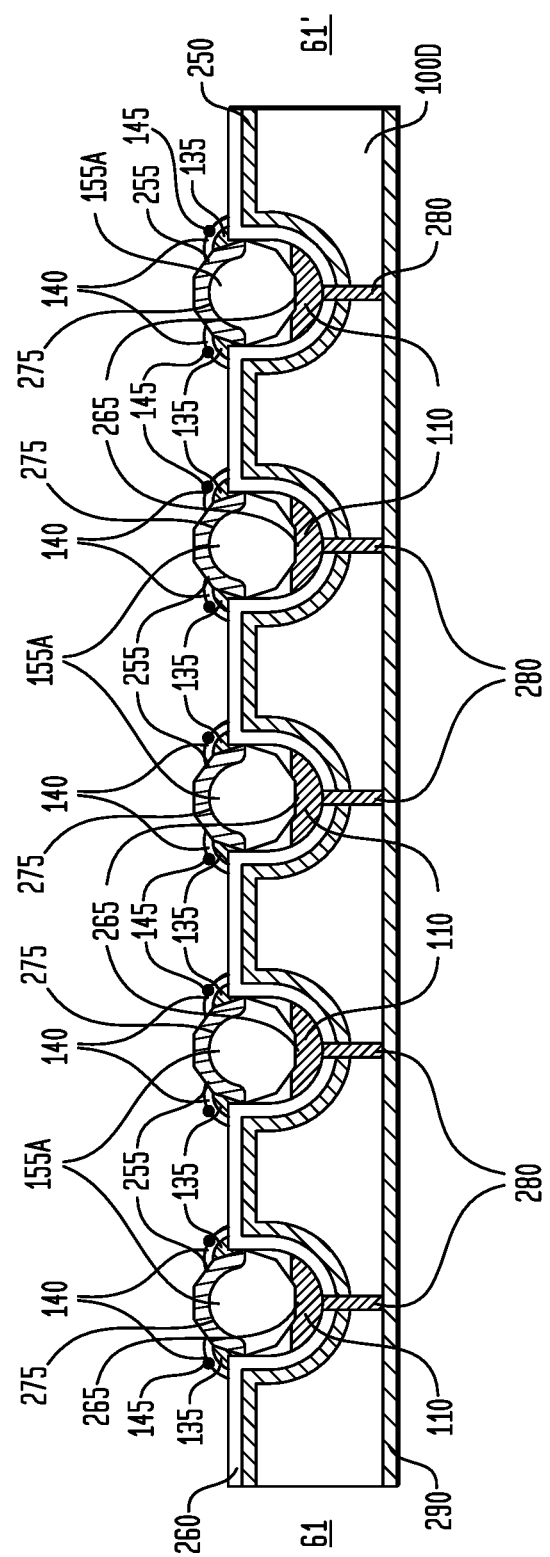
FIG. 27 is a cross-sectional view of the fifth exemplary base with a plurality of first conductors, a plurality of substantially faceted diodes, a plurality of insulators, a plurality of second conductors, and a plurality of third conductors for an apparatus embodiment in accordance with the teachings of the present invention.

FIG. 26 is a perspective view of an exemplary base (100, 100A, 100B, 100C, 100D) with a plurality of first conductors 110, a plurality of substantially faceted substrate particles 120 forming corresponding faceted diodes 155A, a plurality of insulators 135, a plurality of second conductors 140, and a plurality of third conductors 145 having been deposited for an apparatus embodiment in accordance with the teachings of the present invention. FIG. 27 is a cross-sectional view of the fifth exemplary base 100D with a plurality of first conductors 110, a plurality of substantially faceted substrate particles 120 forming corresponding faceted diodes 155A, a plurality of insulators 135, a plurality of second conductors 140 and a plurality of third conductors 145 having been deposited for an apparatus embodiment in accordance with the teachings of the present invention. As mentioned above, FIGS. 26 and 27 serve to illustrate another exemplary shape for a plurality of diodes 155, as faceted diodes 155A (each of which also has a substantially curved, shell-shaped penetration layer or region 255 forming a corresponding pn junction 275), and further illustrate an exemplary pattern for deposition of a plurality of third conductors 145 on or within one or more second conductors 140, such as having a substantially straight line or having a "ladder" shape (not separately illustrated), for example and without limitation. A resulting apparatus otherwise functions substantially the same as any of the other apparatus embodiments discussed herein.

Figure 28:
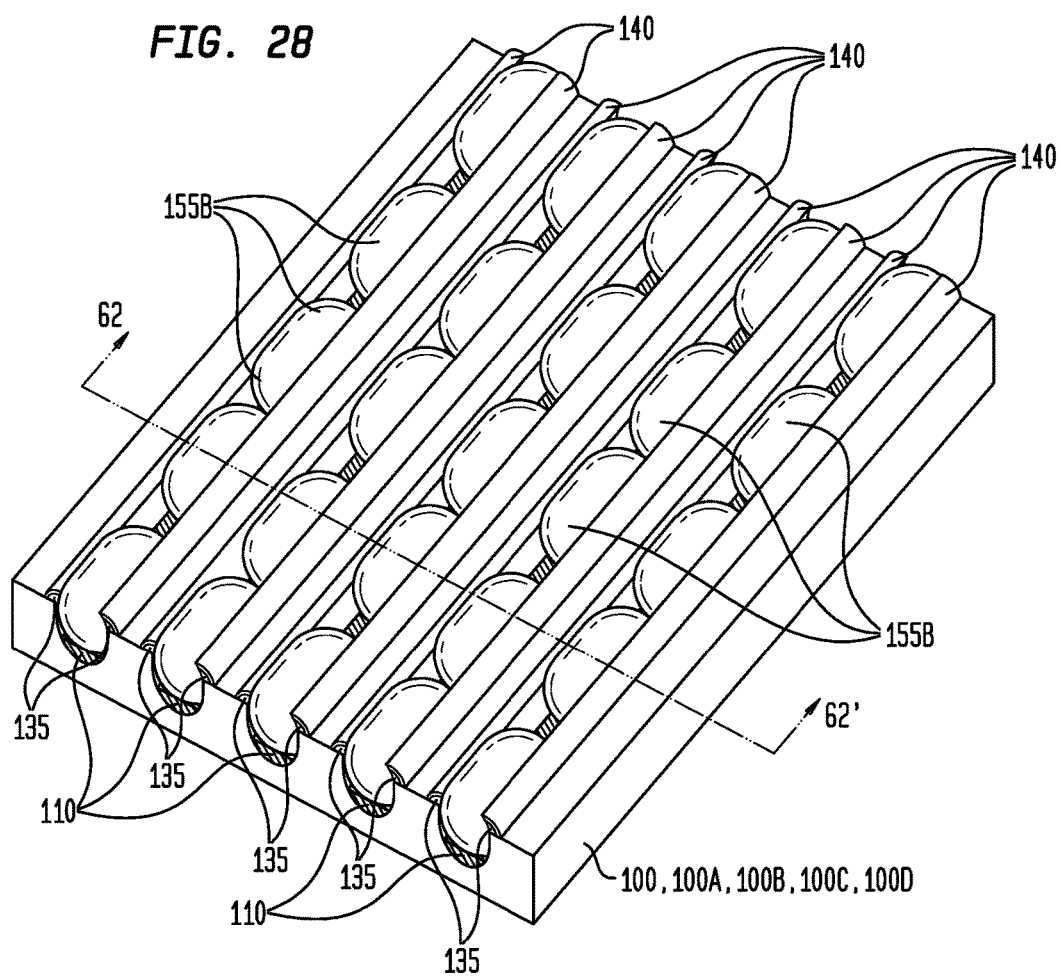
FIG. 28 is a perspective view of an exemplary base with a plurality of first conductors, a plurality of substantially elliptical (or oblong) diodes, and a plurality of second conductors for an apparatus embodiment in accordance with the teachings of the present invention.
Figure 29:
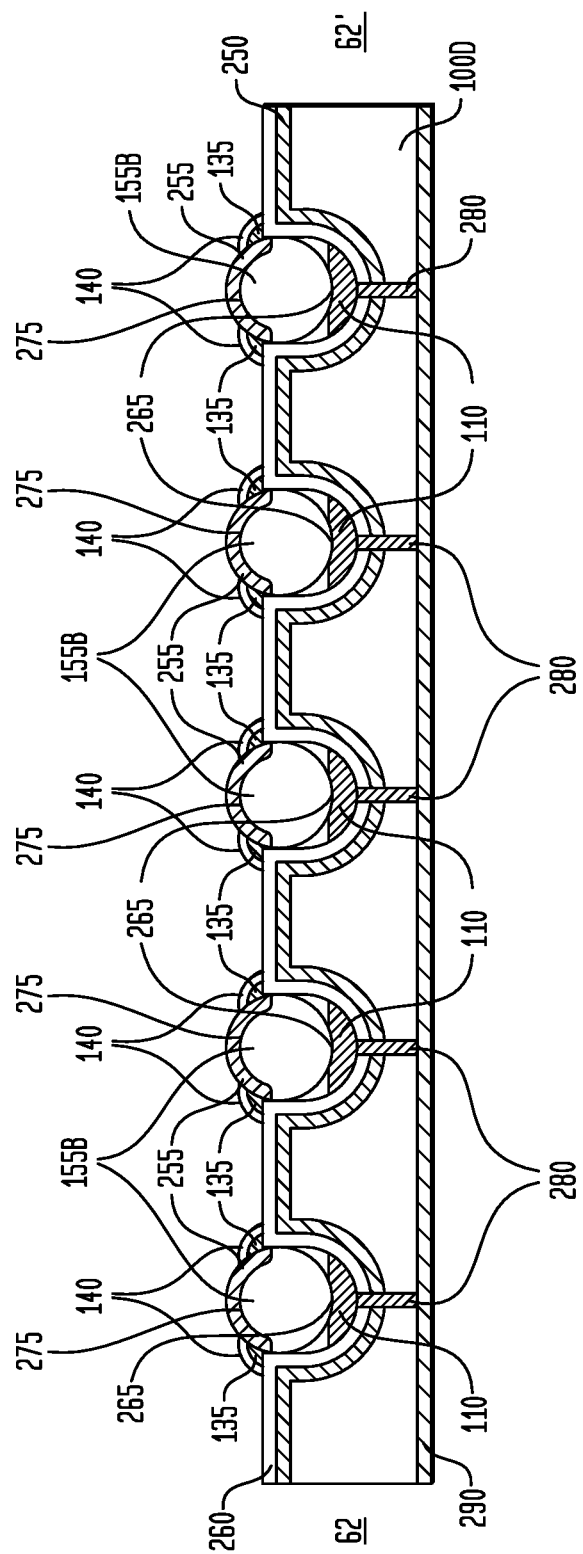
FIG. 29 is a cross-sectional view of the fifth exemplary base with a plurality of first conductors, a plurality of substantially elliptical (or oblong) diodes, a plurality of insulators, and a plurality of second conductors for an apparatus embodiment in accordance with the teachings of the present invention.

FIG. 28 is a perspective view of an exemplary base (100, 100A, 100B, 100C, 100D) with a plurality of first conductors 110, a plurality of substantially elliptical (or oblong) substrate particles 120 forming corresponding elliptical (or oblong) diodes 155B, a plurality of insulators 135, and a plurality of second conductors 140 having been deposited for another apparatus embodiment in accordance with the teachings of the present invention. FIG. 29 is a cross-sectional view of the fifth exemplary base 100D with a plurality of first conductors 110, a plurality of substantially elliptical (or oblong) substrate particles 120 forming corresponding elliptical (or oblong) diodes 155B, a plurality of insulators 135, and a plurality of second conductors 145 having been deposited for an apparatus embodiment in accordance with the teachings of the present invention. As mentioned above, FIGS. 28 and 29 serve to illustrate another exemplary shape for a plurality of diodes 155, as substantially elliptical (or oblong) diodes 155B (each of which also has a substantially curved, shell-shaped penetration layer or region 255 forming a corresponding pn junction 275). A resulting apparatus otherwise functions substantially the same as any of the other apparatus embodiments discussed herein.

FIG. 30 is a perspective view of an exemplary base (100E) with a plurality of first conductors 110, a plurality of substantially irregular substrate particles 120 forming corresponding irregular diodes 155C, a plurality of insulators 135, a plurality of second conductors 140, and a plurality of lenses 150 (suspended in a polymer (resin or other binder) 165) having been deposited for an apparatus 500 embodiment in accordance with the teachings of the present invention. FIG. 31 is a cross-sectional view of the fifth exemplary base 100E with a plurality of first conductors, a plurality of substantially irregular substrate particles 120 forming corresponding irregular diodes 155C, a plurality of insulators 135, a plurality of second conductors 140, and a plurality of lenses 150 suspended in a polymer (resin or other binder) 165 having been deposited for an apparatus 500 embodiment in accordance with the teachings of the present invention. As mentioned above, FIGS. 30 and 31 serve to illustrate another exemplary shape for a plurality of diodes 155, as substantially irregular diodes 155C (each of which also has a substantially curved, irregular shell-shaped penetration layer or region 255 forming a corresponding pn junction 275 (or equivalent)).

FIGS. 30 and 31 further serve to illustrate other exemplary variations considered equivalent and within the scope of the claimed invention, including variations on the relative width of the cavities, channels or grooves 105 compared to the diodes 155, with the cavities, channels or grooves 105 illustrated as significantly wider than the diodes 155C. With the comparatively wider cavities, channels or grooves 105, the locations of the various insulators 135 and second conductors 140 also vary accordingly, as illustrated, and are coupled to or about the sides of the diodes 155C, rather than being coupled more toward the upper or top peripheral portions of the diodes 155C. Also illustrated are penetration layers or regions 255 having a wide variety of shapes while nonetheless being substantially shell-shaped, and with the regions 255 defining corresponding pn junctions 275 which do not fully extend about the diodes 155C, with a diodes 155C continuing to have a significant portion of its substrate exposed and/or coupled to one or more insulators 135 or first conductor(s) 110. Lastly, FIGS. 30 and 31 further illustrate various exemplary locations of the lenses 150 within the scope of the claimed invention, including without limitation abutting a diode 155C, abutting a portion of the base 100E, and spaced-apart. A resulting apparatus 500, 500A and/or 500B otherwise functions substantially the same as any of the other apparatus embodiments discussed herein.

Figure 32:
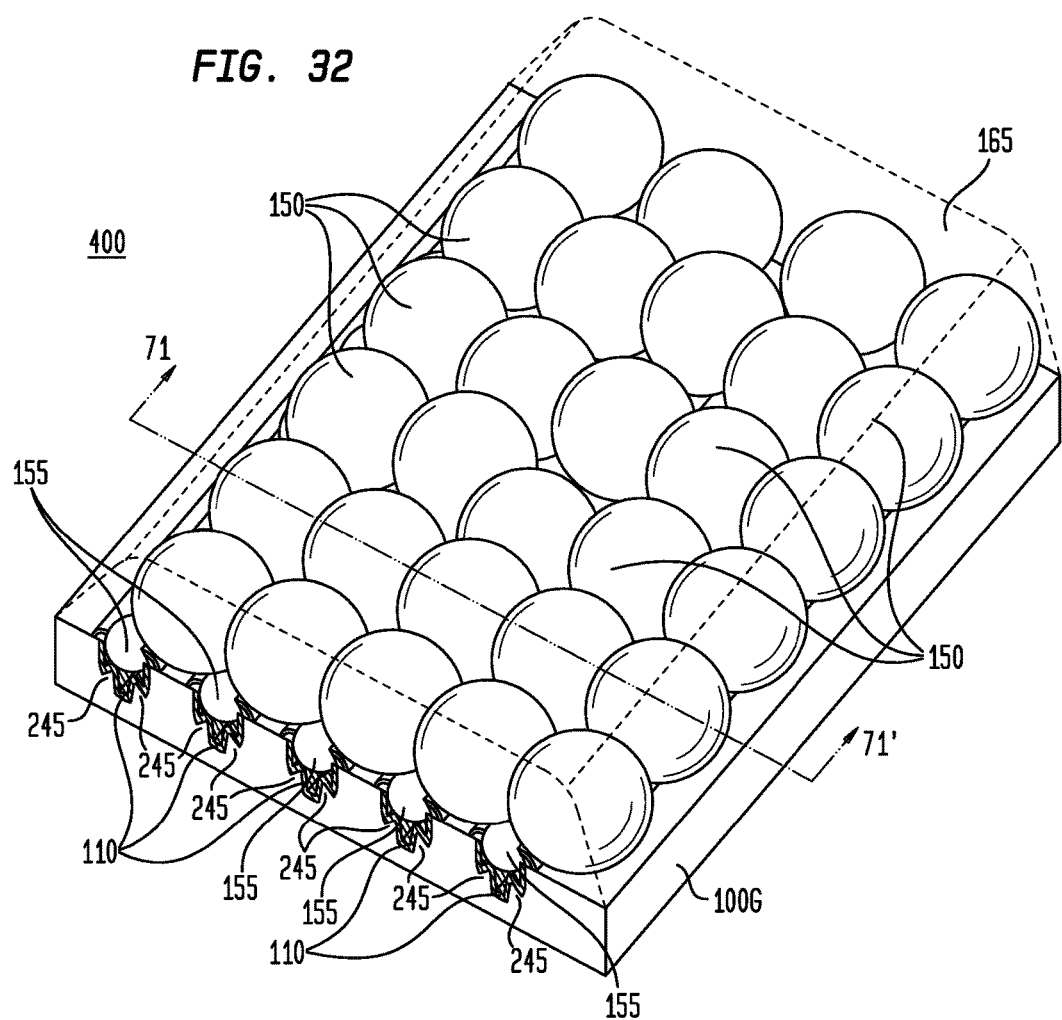
FIG. 32 is a perspective view of a sixth exemplary base with a plurality of first conductors, a plurality of substantially spherical diodes, a plurality of insulators, a plurality of second conductors, a plurality of third conductors, and a plurality of lenses suspended in a polymer for an apparatus embodiment in accordance with the teachings of the present invention.

FIG. 32 is a perspective view of a sixth exemplary base 100G with a plurality of first conductors 110, a plurality of substantially spherical diodes 155, a plurality of insulators 135, a plurality of second conductors 140, a plurality of third conductors 145, and a plurality of lenses 150 (suspended in a polymer (resin or other binder) 165) having been deposited for an apparatus 400 embodiment in accordance with the teachings of the present invention. FIG. 33 is a cross-sectional view (through the 71-71' plane) of the sixth exemplary base 100G with a plurality of first conductors 110, a plurality of substantially spherical diodes 155, a plurality of insulators 135, a plurality of second conductors 140, a plurality of third conductors 145, and a plurality of lenses 150 (suspended in a polymer (resin or other binder) 165) having been deposited for an apparatus 400 embodiment in accordance with the teachings of the present invention. As mentioned above, the apparatus 400 embodiment differs from the other apparatuses insofar as the sixth exemplary base 100G further comprises a plurality of projections (or supports) 245 within the channels 105 (which may be integrally formed with the base 100G), a plurality of first conductors 110 which have a substantially constant or consistent depth conforming to the shape of the channel 105 and the projections 245, and further comprises a plurality of integrally formed conductive vias 285, which in this case, are distributed randomly within the base 100G. The random distribution is further illustrated by one of the first conductors 110 not being in contact with a via 285 in the selected or particular cross-section (through the 71-71' plane), but generally will have contact with a via 285 at some other point along its length (not separately illustrated). Also not separately illustrated in FIGS. 32 and 33, the base 100G may also comprise any of the additional coatings or layers (250, 260, 270) discussed above. FIG. 33 also illustrates that any of the plurality of diodes 155 may have a (variable) gap between its sides and the walls of the channel 105 of the base 100G, which as illustrated has been partially filled in by insulators 135, and variable spacing between and among the lenses 150 and also other apparatus components. A resulting apparatus 400, 400A and/or 400B otherwise functions substantially the same as any of the other apparatus embodiments discussed herein.

Figure 34:
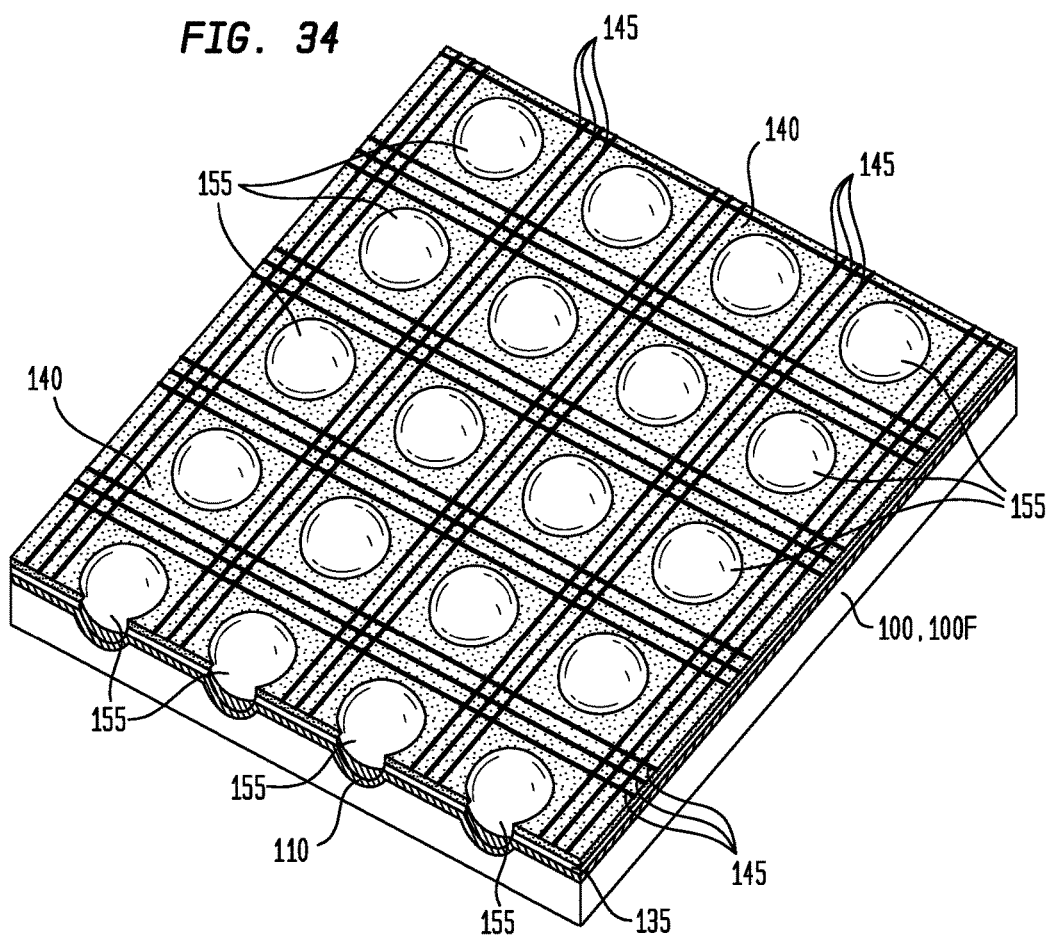
FIG. 34 is a perspective view of an exemplary base with a first conductor, a plurality of substantially spherical diodes, an insulator, a second conductor, and a third conductor for an apparatus embodiment in accordance with the teachings of the present invention.
Figure 35:
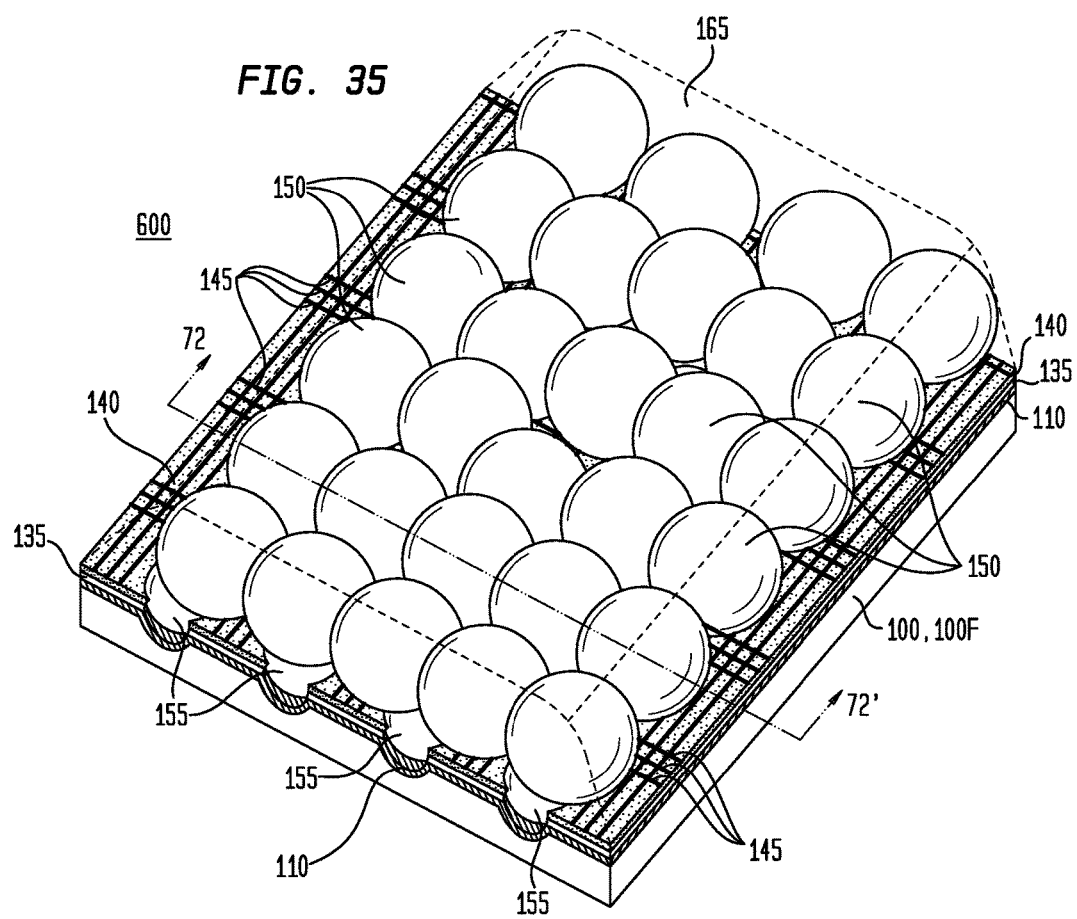
FIG. 35 is a perspective view of an exemplary base with a first conductor, a plurality of substantially spherical diodes, an insulator, a second conductor, a third conductor, and a plurality of lenses suspended in a polymer for an apparatus embodiment in accordance with the teachings of the present invention.
Figure 36:
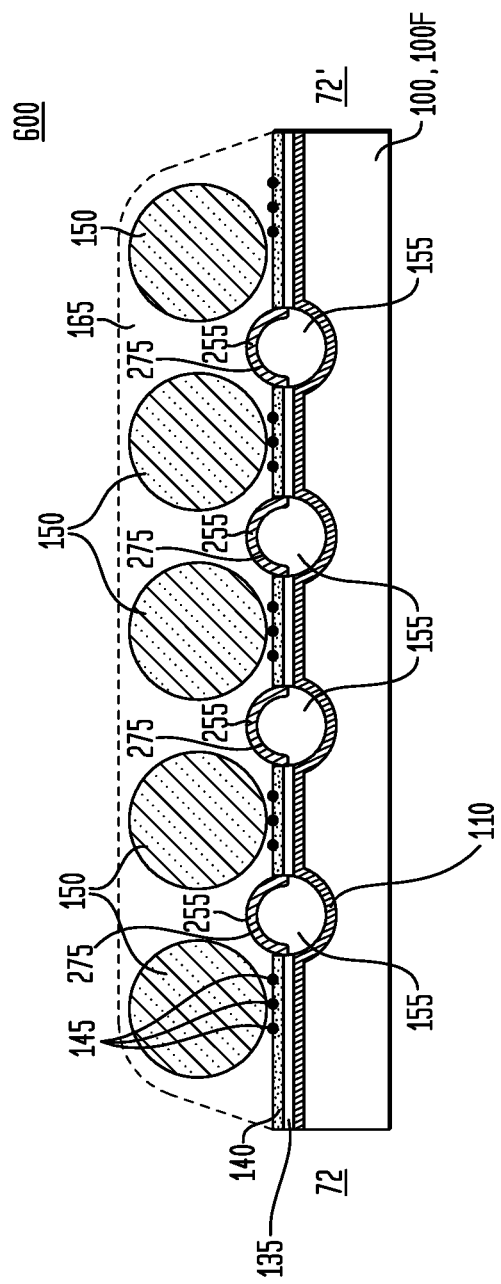
FIG. 36 is a cross-sectional view of the exemplary base with a first conductor, a plurality of substantially spherical diodes, an insulator, a second conductor, a third conductor, and a plurality of lenses suspended in a polymer for an apparatus embodiment in accordance with the teachings of the present invention.

FIG. 34 is a perspective view of an exemplary base 100 or 100F with a first conductor 110, a plurality of substantially spherical diodes 155, an insulator 135, a second conductor 140, and a third conductor having been deposited for an apparatus 600 embodiment in accordance with the teachings of the present invention. FIG. 35 is a perspective view of an exemplary base 100 or 100F with a first conductor 110, a plurality of substantially spherical diodes 155, an insulator 135, a second conductor 140, a third conductor 145, and a plurality of lenses 150 (suspended in a polymer (resin or other binder) 165) having been deposited for an apparatus 600 embodiment in accordance with the teachings of the present invention. FIG. 36 is a cross-sectional view (through the 72-72' plane) of the exemplary base 100 or 100F with a first conductor 110, a plurality of substantially spherical diodes 155, an insulator 135, a second conductor 140, a third conductor 145, and a plurality of lenses 150 (suspended in a polymer (resin or other binder) 165)) having been deposited for an apparatus 600 embodiment in accordance with the teachings of the present invention. As mentioned above, the apparatus 600 embodiment differs from the other apparatuses insofar as each of the first conductor 110, the insulator 135, the second conductor 140 (and also a third conductor 145) are formed as corresponding single layers, rather than as corresponding pluralities of discrete conductors and insulators. Not separately illustrated, the base may be and/or include any of the other features discussed above with respect to bases 100-100G, such as conductive vias 280, 285 or a conductive backplane, or the various coatings or layers 250, 260, 270. As illustrated for this exemplary apparatus 600, a voltage may be applied (for light emitting applications) or may be received (for photovoltaic applications) across any one or more points or regions of the first conductor 110 and second conductor 140 (and/or third conductor 145), such as to and from the sides (lateral) of the apparatus 600, or through the other mechanisms mentioned above for any of the other apparatus embodiments (such as when an apparatus 600 further comprises one or more conductive vias 280, 285 and/or a conductive backplane). As illustrated, an optional third conductor 145 may be formed as a singular conductive trace, such as having a grid pattern over or within the second conductor 140. As discussed above, any of these various layers may be deposited through any deposition, printing, coating, sputtering, spin casting, etc. processes. A resulting apparatus 600, 600A and/or 600B does not provide for individual row, column, or pixel addressability, but is otherwise functions substantially the same as any of the other apparatus embodiments discussed herein.

Figure 37:
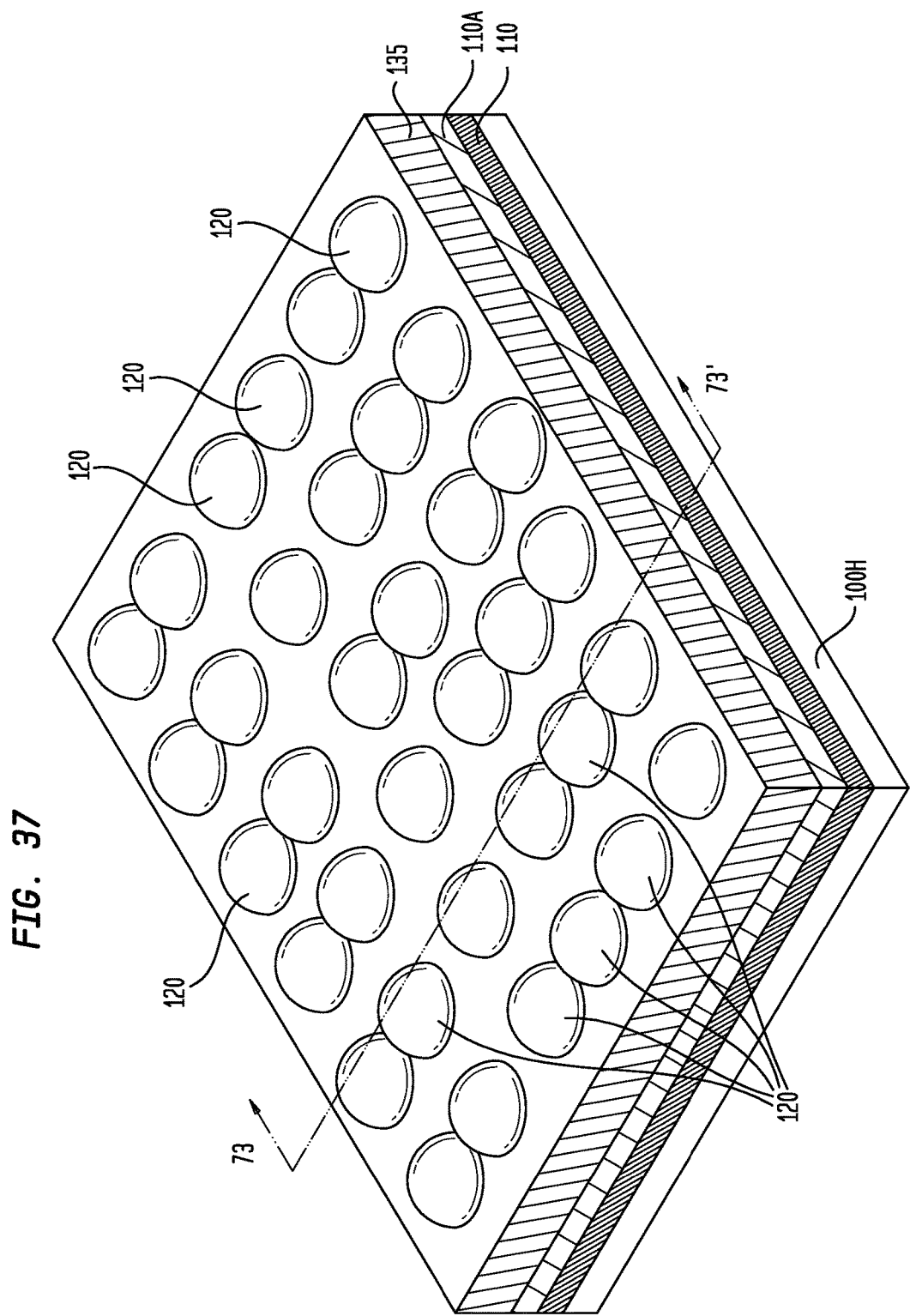
FIG. 37 is a perspective view of a ninth exemplary base with a first conductor, a first conductor (or conductive) adhesive layer, a plurality of substrate particles, and an insulator for an apparatus embodiment in accordance with the teachings of the present invention.
Figure 38:
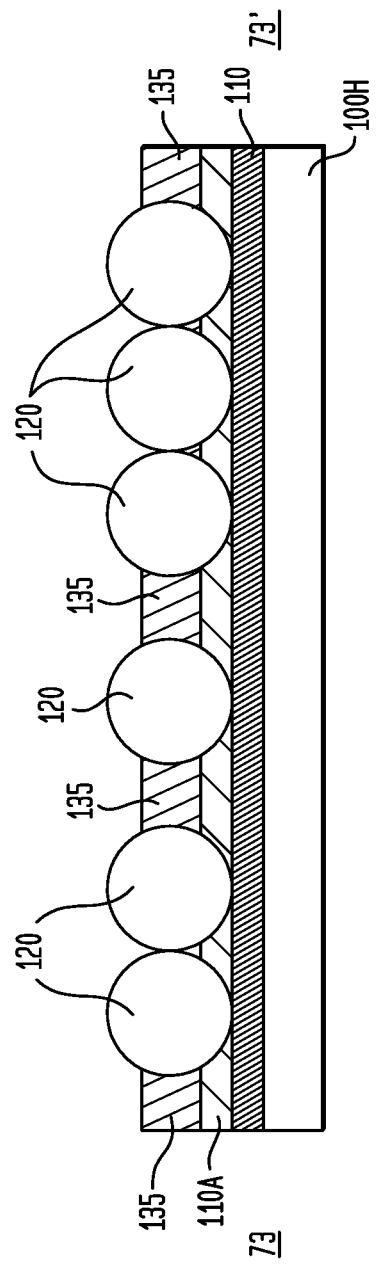
FIG. 38 is a cross-sectional view of the ninth exemplary base with a first conductor, a first conductor adhesive layer, a plurality of substrate particles, and an insulator for an apparatus embodiment in accordance with the teachings of the present invention.

FIG. 37 is a perspective view of a ninth exemplary base 100H with a first conductor 110, a first conductor (or conductive) adhesive layer 110A, a plurality of substrate particles 120, and one or more insulators 135 for an apparatus 700 embodiment in accordance with the teachings of the present invention. FIG. 38 is a cross-sectional view (through the 73-73' plane) of the ninth exemplary base 100H with a first conductor 110, a first conductor (or conductive) adhesive layer 110A, a plurality of substrate particles 120, and one or more insulators 135 for an apparatus 700 embodiment in accordance with the teachings of the present invention. For this exemplary embodiment, the illustrated base 100H has a substantially flat overall form factor and has a substantially smooth first surface or side (a substantially smooth and substantially flat base 100H) within a predetermined tolerance (and does not include cavities, channels or grooves 105, e.g., is not reticulated), and a first conductor 110 is formed as a single, unitary layer, such as a prefabricated aluminum sheet. Depending upon the support provided by the first conductor 110, the base 100H may be optionally included, with electrical insulation of the first conductor provided through other mechanisms, such as a device housing (not separately illustrated). Also in this exemplary embodiment, a first conductor (or conductive) adhesive layer 110A is utilized to adhere a plurality of substrate particles 120 to the first conductor 110 and to create ohmic contacts between the plurality of substrate particles 120 and the first conductor 110, and for example, the first conductor (or conductive) adhesive layer 110A may comprise an anisotropic conductive binder or polymer or another type of conductive polymer, resin, or binder discussed above. Following deposition of a plurality of substrate particles 120, using any of the methods discussed above, an insulating layer is deposited to form insulator 135, using any type of insulating or dielectric material discussed above.

Figure 39:
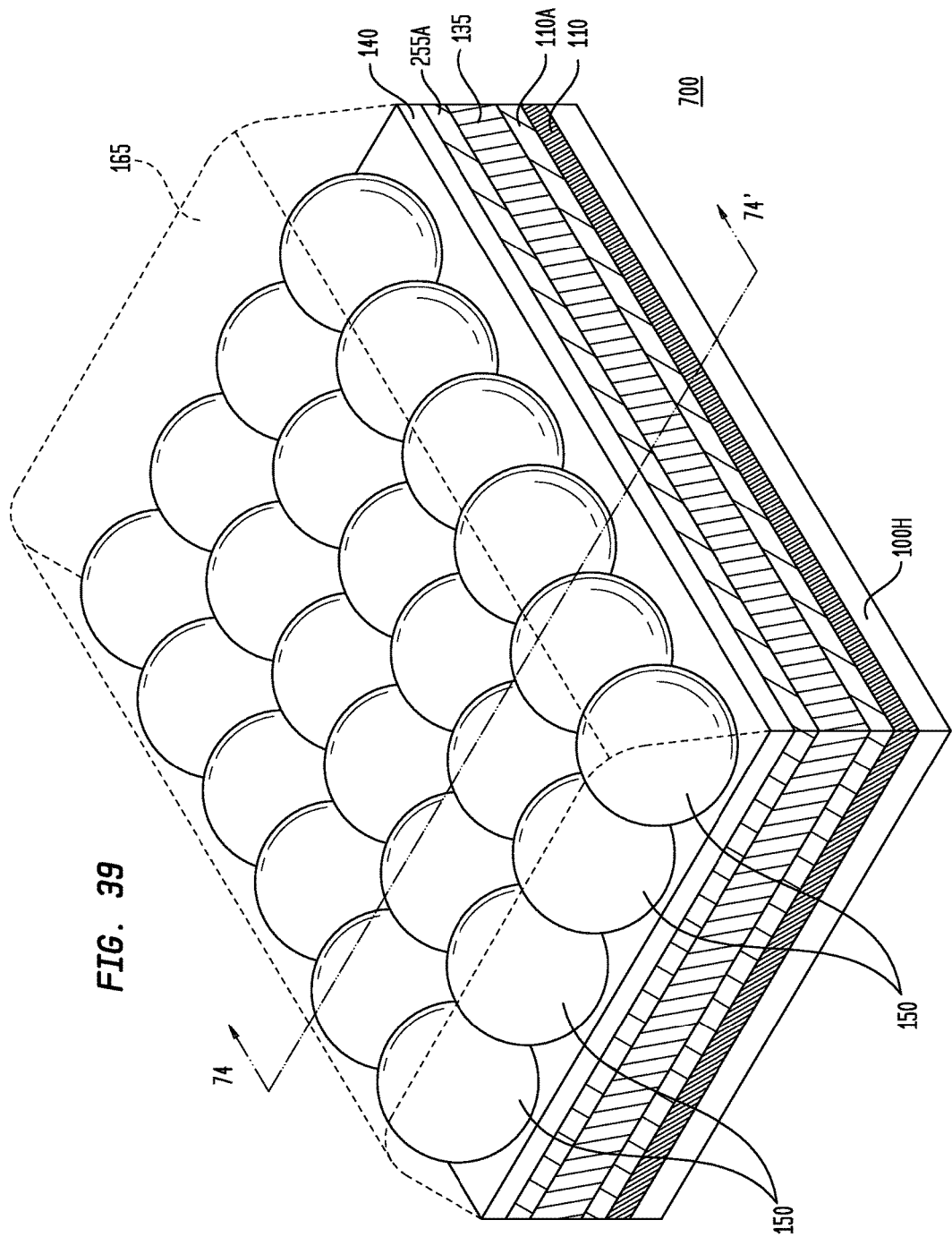
FIG. 39 is a perspective view of a ninth exemplary base with a first conductor, a first conductor (or conductive) adhesive layer, a plurality of diodes formed using a deposited substrate (or semiconductor) layer or region over a plurality of substrate particles, an insulator, a second conductor, and a plurality of lenses (suspended in a polymer (resin or other binder)) having been deposited for an exemplary apparatus embodiment in accordance with the teachings of the present invention.
Figure 40:
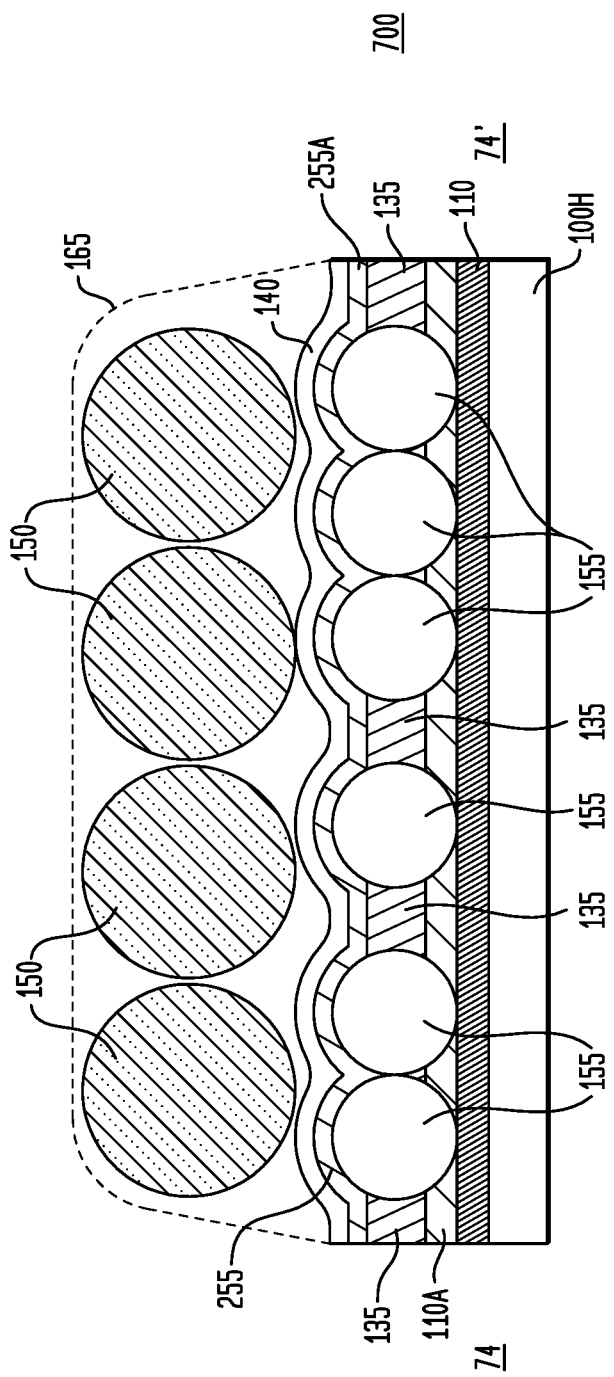
FIG. 40 is a cross-sectional view of the ninth exemplary base with a first conductor, a first conductor (or conductive) adhesive layer, a plurality of diodes formed using a deposited substrate (or semiconductor) layer or region over a plurality of substrate particles, an insulator, a second conductor, and a plurality of lenses (suspended in a polymer (resin or other binder)) having been deposited for an exemplary apparatus embodiment in accordance with the teachings of the present invention.

FIG. 39 is a perspective view of a ninth exemplary base 100H with a first conductor 110, a first conductor (or conductive) adhesive layer 110A, a plurality of diodes 155 formed using a deposited substrate (or semiconductor) layer or region 255A over a plurality of substrate particles 120, an insulator 135, a second conductor 140, and a plurality of lenses 150 (suspended in a polymer (resin or other binder) 165)) having been deposited for an exemplary apparatus 700 embodiment in accordance with the teachings of the present invention. FIG. 40 is a cross-sectional view of the ninth exemplary base 100H with a first conductor 110, a first conductor (or conductive) adhesive layer 110A, a plurality of diodes 155 formed using a deposited substrate (or semiconductor) layer or region 255A over a plurality of substrate particles 120, an insulator 135, a second conductor 140, and a plurality of lenses 150 (suspended in a polymer (resin or other binder) 165)) having been deposited for an exemplary apparatus 700 embodiment in accordance with the teachings of the present invention. As discussed above with reference to FIG. 15, for such an exemplary embodiment, a diode 155 comprises a layer or region 255A coupled to a substrate particle 120 to form a junction 275.

As an example, for a plurality of substrate particles 120 comprising a semiconductor having a first majority carrier (e.g., p+ or n+), a layer or region 255A is created which has a second majority carrier (e.g., correspondingly n+ or p+), also forming junction 275. For semiconductor substrate particles 120, the junction 275 is generally a pn (or PN) junction 275, while for organic or polymer substrate particles 120, the junction 275 may be considered a junction between the organic or polymer layers utilized to create OLEDs or PLEDs, for example and without limitation. For the illustrated exemplary embodiment 700, as part of a deposition process, such as using plasma deposition or sputtering, for semiconductor substrate type having a first majority carrier (e.g. p+ silicon), a semiconductor material having a second majority carrier (e.g., an n-type dopant, such as a phosphorus-doped silicon) is deposited over (on top of) a first or upper portion of the plurality of substrate particles 120 and any one or more insulators 135, forming a substantially continuous, glass-like layer or region 255A, with junctions 275 formed over the portions of the layer or region 255A in contact with the substrate particles 120. The corresponding deposited second majority carrier (n-type) semiconductor material forms a continuous semiconductor body with each of the substrate particles 120, such as forming a continuous crystal or other bond with the upper portion of a substrate particle 120, forming a deposited layer or region 255A which, in this case, is an n-type layer or region 255A which defines a corresponding junction 275 (in this case, a pn junction 275) with a first majority carrier (p-type) semiconductor substrate particle 120. In the illustrated exemplary embodiment, the corresponding pn junction 275 is also formed as a "cap" over the substrate particle 120, and is also substantially curved and shell-shaped, such as hemispherical shell-shaped when the plurality of substrate particles 120 are substantially spherical, and also is in sharp contrast to typical prior art diodes having a substantially planar and flat pn junction or a substantially planar and flat pn junction within a well of a semiconductor substrate. Conversely, a first majority carrier (p-type) layer or region 255A may be formed over a second majority carrier (n-type) semiconductor particle 120, and is considered equivalent and also within the scope of the present invention. Following deposition of a layer or region 255A, one or more second conductors 140 (and, optionally, one or more third conductors 145) and a plurality of lenses 150 (suspended in a polymer (resin or other binder) 165)) may be deposited as discussed above, to form an exemplary apparatus 700 embodiment.

As mentioned above, and similar to the apparatus 600 embodiment, the apparatus 700 embodiment differs from the other apparatuses insofar as each of the first conductor 110, first conductor (or conductive) adhesive layer 110A, the insulator 135, the layer or region 255A, the second conductor 140 (and also an optional third conductor 145) are formed as corresponding single layers, rather than as corresponding pluralities of discrete conductors and insulators. Not separately illustrated, the base may be and/or include any of the other features discussed above with respect to bases 100-100G, such as conductive vias 280, 285 or a conductive backplane, or the various coatings or layers 250, 260, 270. As illustrated for this exemplary apparatus 700, a voltage may be applied (for light emitting applications) or may be received (for photovoltaic applications) across any one or more points or regions of the first conductor 110 and second conductor 140 (and/or third conductor 145), such as to and from the sides (lateral) of the apparatus 700, or through the other mechanisms mentioned above for any of the other apparatus embodiments (such as when an apparatus 700 further comprises one or more conductive vias 280, 285 and/or a conductive backplane). Not separately illustrated, an optional third conductor 145 may be formed as a singular conductive trace, such as having a grid pattern over or within the second conductor 140, as previously discussed and illustrated. Also as discussed above, any of these various layers may be deposited through any deposition, printing, coating, sputtering, spin casting, etc. processes. A resulting apparatus 700, 700A and/or 700B does not provide for individual row, column, or pixel addressability, but is otherwise functions substantially the same as any of the other apparatus embodiments discussed herein.

Those having skill in the art will recognize that any number of first conductors 110, insulators 135, second conductors 140, and/or third conductors 145 may be utilized within the scope of the claimed invention. In addition, there may be a wide variety of orientations and configurations of the plurality of first conductors 110, plurality of insulators 135, and the plurality of second conductor(s) 140 (with any incorporated corresponding and optional one or more third conductors 145) for any of the apparatuses 200, 300, 400, 500, in addition to the substantially parallel orientations illustrated in FIGS. 1-33. For example, the plurality of first conductors 110 and plurality of second conductor(s) 140 may be perpendicular to each other (defining rows and columns), such that their area of overlap may be utilized to define a picture element ("pixel") and may be separately and independently addressable. When either or both the plurality of first conductors 110 and the plurality of second conductor(s) 140 may be implemented as spaced-apart and substantially parallel lines having a predetermined width (both defining rows or both defining columns), they may also be addressable by row and/or column, such as sequential addressing of one row after another, for example and without limitation. In addition, either or both the plurality of first conductors 110 and the plurality of second conductor(s) 140 may be implemented as a layer or sheet as mentioned above.

Figure 41:
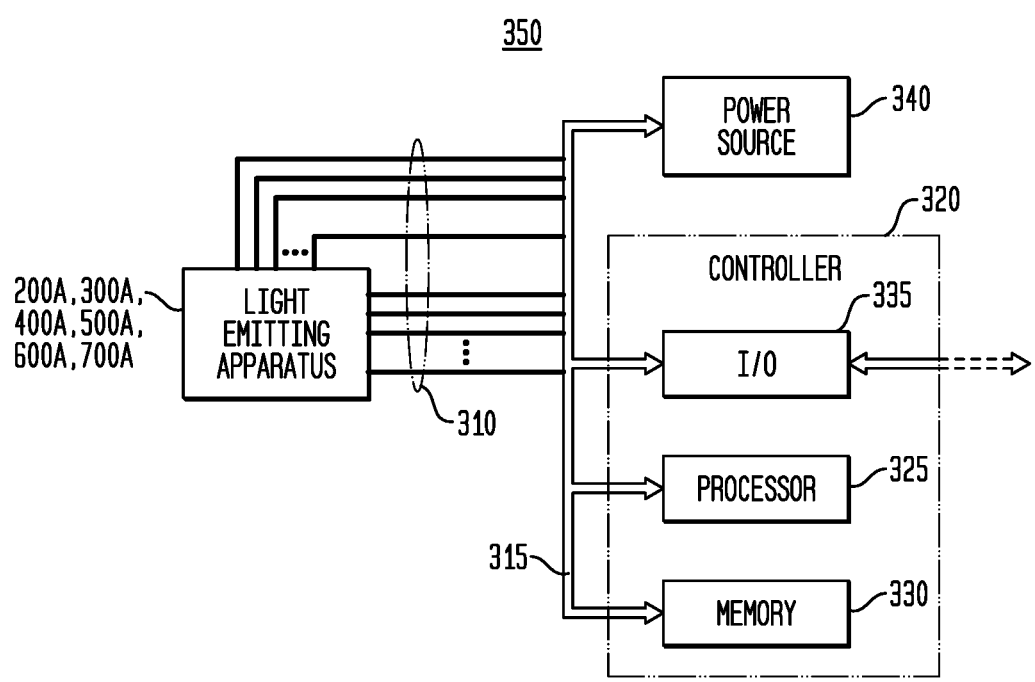
FIG. 41 is a block diagram illustrating a first system embodiment in accordance with the teachings of the present invention.

As indicated above, the plurality of diodes 155 may be configured (through material selection and corresponding doping) to be photovoltaic (PV) diodes 155 or LEDs 155, as examples and without limitation. FIG. 41 is a block diagram illustrating a first system embodiment 350 in accordance with the teachings of the present invention, in which the plurality of diodes 155 are implemented as LEDs, of any type or color. The system 350 comprises an apparatus 200A, 300A, 400A, 500A, 600A, 700A having the plurality of diodes 155 implemented as LEDs, a power source 340, and may also include an optional controller 320. When one or more first conductors 110 and one or more second conductor(s) 140 (and the optional one or more third conductors 145) are energized, such as through the application of a corresponding voltage (e.g., from power source 340), energy will be supplied to one or more of the plurality of LEDs (155), either entirely across the apparatus 600A when the conductors and insulators are each implemented as single layers, or for an apparatus 200A, 300A, 400A, 500A, at the corresponding intersections (overlapping areas) of the energized first conductors 110 and second conductor(s) 140, which depending upon their orientation and configuration, define a pixel, a sheet, or a row/column, for example. Accordingly, by selectively energizing the first conductors 110 and second conductor(s) 140 (and/or third conductors 145), the apparatus 200A, 300A, 400A, 500A (and/or system 350) provides a pixel-addressable, dynamic display, or a lighting device, or signage, etc. For example, the plurality of first conductors 110 may comprise a corresponding plurality of rows, with the plurality of transmissive second conductor(s) 140 (and the optional one or more third conductors 145) comprising a corresponding plurality of columns, with each pixel defined by the intersection or overlapping of a corresponding row and corresponding column. When either or both the plurality of first conductors 110 and the plurality of second conductor(s) 140 (and/or third conductors 145) may be implemented as a unitary sheet such as in apparatus 600A, also for example, energizing of the conductors 110, 140 (and/or 145) will provide power to substantially all (or most) of the plurality of LEDs (155), such as to provide light emission for a lighting device or a static display, such as signage.

Continuing to refer to FIG. 41, the apparatus 200A, 300A, 400A, 500A, 600A, 700A is coupled through lines or connectors 310 (which may be two or more corresponding connectors or may also be in the form of a bus, for example) to control bus 315, for coupling to controller (or, equivalently, control logic block) 320, and/or for coupling to a power source 340, which may be a DC power source (such as a battery or a photovoltaic cell) or an AC power source (such as household or building power). When the controller 320 is implemented, such as for an addressable light emitting display system 350 embodiment and/or a dynamic light emitting display system 350 embodiment, the controller 320 may be utilized to control the energizing of the LEDs (155) (via the various pluralities of first conductors 110 and the plurality of transmissive second conductor(s) 140 (and the optional one or more third conductors 145)) as known or becomes known in the electronic arts, and typically comprises a processor 325, a memory 330, and an input/output (I/O) interface 335. When the controller 320 is not implemented, such as for various lighting system 350 embodiments (which are typically non-addressable and/or a non-dynamic light emitting display system 350 embodiments), the system 350 is typically coupled to an electrical or electronic switch (not separately illustrated), which may comprise any suitable type of switching arrangement, such as for turning on, off, and/or dimming a lighting system.

A "processor" 325 may be any type of controller or processor, and may be embodied as one or more processors 325, to perform the functionality discussed herein. As the term processor is used herein, a processor 325 may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or EPROM. A processor (such as processor 325), with its associated memory, may be adapted or configured (via programming, FPGA interconnection, or hard-wiring) to perform the methodology of the invention, such as selective pixel addressing for a dynamic display embodiment, or row/column addressing, such as for a signage embodiment. For example, the methodology may be programmed and stored, in a processor 325 with its associated memory (and/or memory 330) and other equivalent components, as a set of program instructions or other code (or equivalent configuration or other program) for subsequent execution when the processor is operative (i.e., powered on and functioning). Equivalently, when the processor 325 may implemented in whole or part as FPGAs, custom ICs and/or ASICs, the FPGAs, custom ICs or ASICs also may be designed, configured and/or hard-wired to implement the methodology of the invention. For example, the processor 325 may be implemented as an arrangement of processors, controllers, microprocessors, DSPs and/or ASICs, collectively referred to as a "controller" or "processor", which are respectively programmed, designed, adapted or configured to implement the methodology of the invention, in conjunction with a memory 330.

A processor (such as processor 325), with its associated memory, may be configured (via programming, FPGA interconnection, or hard-wiring) to control the energizing of (applied voltages to) the various pluralities of first conductors 110 and the plurality of transmissive second conductor(s) 140 (and the optional one or more third conductors 145), for corresponding control over what information is being displayed. For example, static or time-varying display information may be programmed and stored, configured and/or hard-wired, in a processor 325 with its associated memory (and/or memory 330) and other equivalent components, as a set of program instructions (or equivalent configuration or other program) for subsequent execution when the processor 325 is operative.

The memory 330, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 325), whether volatile or non-volatile, whether removable or non-removable, including without limitation RAM, FLASH, DRAM, SDRAM, SRAM, MRAM, FeRAM, ROM, EPROM or EPROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The memory 330 may be adapted to store various look up tables, parameters, coefficients, other information and data, programs or instructions (of the software of the present invention), and other types of tables such as database tables.

As indicated above, the processor 325 is programmed, using software and data structures of the invention, for example, to perform the methodology of the present invention. As a consequence, the system and method of the present invention may be embodied as software which provides such programming or other instructions, such as a set of instructions and/or metadata embodied within a computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 325, for example).

The software, metadata, or other source code of the present invention and any resulting bit file (object code, database, or look up table) may be embodied within any tangible storage medium, such as any of the computer or other machine-readable data storage media, as computer-readable instructions, data structures, program modules or other data, such as discussed above with respect to the memory 330, e.g., a floppy disk, a CDROM, a CD-RW, a DVD, a magnetic hard drive, an optical drive, or any other type of data storage apparatus or medium, as mentioned above.

The I/O interface 335 may be implemented as known or may become known in the art, and may include impedance matching capability, voltage translation for a low voltage processor to interface with a higher voltage control bus 315 for example, various switching mechanisms (e.g., transistors) to turn various lines or connectors 310 on or off in response to signaling from the processor 325, and/or physical coupling mechanisms. In addition, the I/O interface 335 may also be adapted to receive and/or transmit signals externally to the system 300, such as through hard-wiring or RF signaling, for example, to receive information in real-time to control a dynamic display, for example.

For example, an exemplary first system embodiment 350 comprises an apparatus 200A, 300A, 400A, 500A, 600A, 700A, in which the plurality of diodes 155 are light emitting diodes, and an I/O interface 335 to fit any of the various standard Edison sockets for light bulbs. Continuing with the example and without limitation, the I/O interface 335 may be sized and shaped to conform to one or more of the standardized screw configurations, such as the E12, E14, E26, and/or E27 screw base standards, such as a medium screw base (E26) or a candelabra screw base (E12), and/or the other various standards promulgated by the American National Standards Institute ("ANSI") and/or the Illuminating Engineering Society, also for example. In other exemplary embodiments, the I/O interface 335 may be sized and shaped to conform to a standard fluorescent bulb socket or a two plug base, such as a GU-10 base, also for example and without limitation. Such an exemplary first system embodiment 350 also may be viewed equivalently as another type of apparatus, particularly when having a form factor compatible for insertion into an Edison or fluorescent socket, for example and without limitation.

In addition to the controller 320 illustrated in FIG. 41, those having skill in the art will recognize that there are innumerable equivalent configurations, layouts, kinds and types of control circuitry known in the art, which are within the scope of the present invention.

Figure 42:
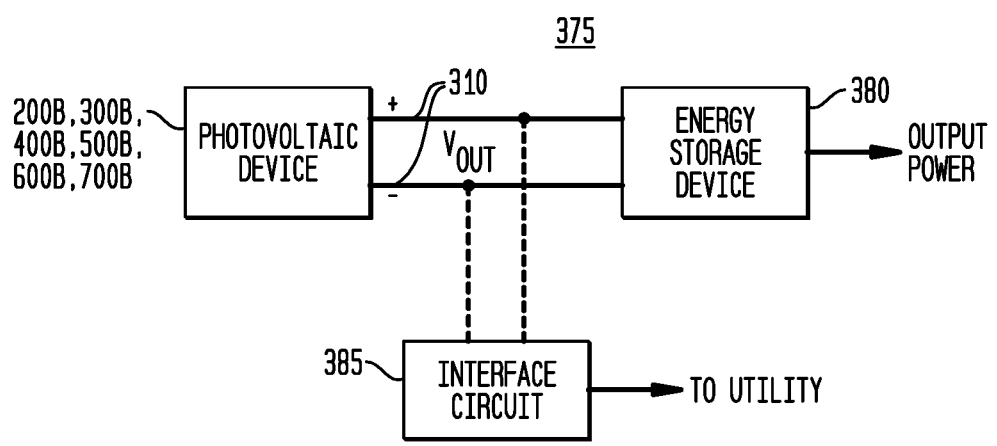
FIG. 42 is a block diagram illustrating a second system embodiment in accordance with the teachings of the present invention.

As indicated above, the plurality of diodes 155 also may be configured (through material selection and corresponding doping) to be photovoltaic (PV) diodes 155. FIG. 42 is a block diagram illustrating a second system embodiment 375 in accordance with the teachings of the present invention, in which the plurality of diodes 155 are implemented as photovoltaic (PV) diodes 155. The system 375 comprises an apparatus 200B, 300B, 400B, 500B, 600B, 700B having the plurality of diodes 155 implemented as photovoltaic (PV) diodes 155 and either or both an energy storage device 380, such as a battery, or an interface circuit 385 to deliver power to an energy using apparatus or system or energy distributing apparatus or system, for example, such as a motorized device or an electric utility. (In other exemplary embodiments which do not comprise an interface circuit 385, other circuit configurations may be utilized to provide energy or power directly to such an energy using apparatus or system or energy distributing apparatus or system.) Within the system 375, the one or more first conductors 110 of an apparatus 200B, 300B, 400B, 500B, 600B, 700B are coupled to form a first terminal (such as a negative or positive terminal), and the one or more second conductor(s) 140 (and/or third conductors 145) of the apparatus 200B, 300B, 400B, 500B, 600B, 700B are coupled to form a second terminal (such as a correspondingly positive or negative terminal), which are then couplable to lines or connectors 310 for connection to either or both an energy storage device 380 or an interface circuit 385. When light (such as sunlight) is incident upon the plurality of spherical lenses 150 of an apparatus 200B, 300B, 400B, 500B, 600B, 700B (from any of a wide range of angles, as discussed above), the light is concentrated on one of more photovoltaic (PV) diodes 155 which, in turn, convert the incident photons to electron-hole pairs, resulting in an output voltage generated across the first and second terminals, and output to either or both an energy storage device 380 or an interface circuit 385.

Figure 43:
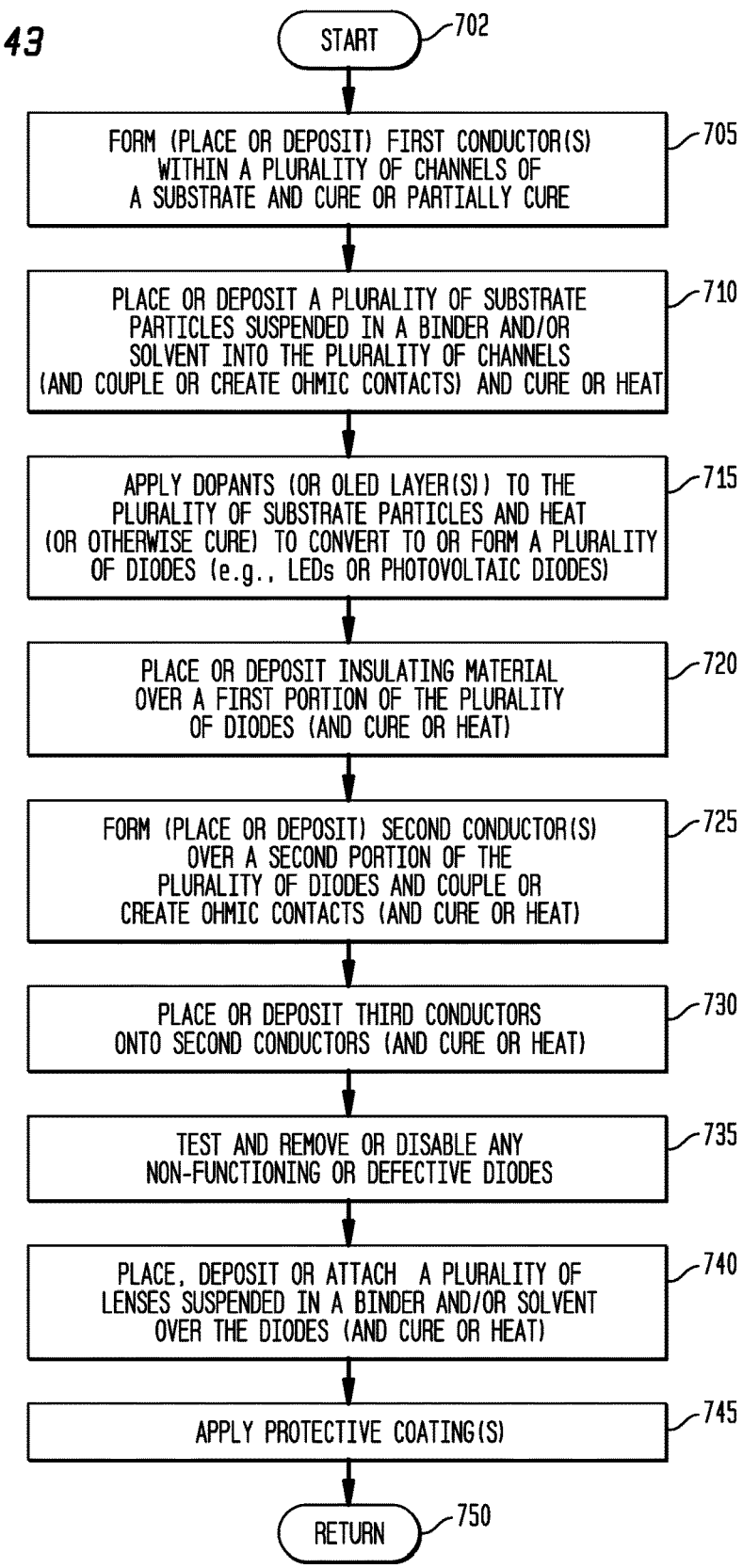
FIG. 43 is a flow chart illustrating a method embodiment in accordance with the teachings of the present invention.

FIG. 43 is a flow chart illustrating a method embodiment in accordance with the teachings of the present invention, for forming or otherwise manufacturing an apparatus 200, 300, 400, 500, 600, 700, and provides a useful summary. Beginning with start step 702, the method deposits a plurality of first conductors (110), typically within a corresponding plurality of channels (cavities, channels or grooves 105) of a base (100-100G), such as by printing a conductive ink or polymer or sputtering or coating the base (100-100G) with one or more metals, followed by curing or partially curing the conductive ink or polymer, or potentially removing a deposited metal from the various ridges or crests 115, depending upon the implementation, step 705. Also depending upon the implementation, additional steps may be utilized to form a base 100, such as fabrication of the base and/or cavities, channels or grooves 105, the addition of a reflective or refractive coating 270, or a reflector, refractor or mirror 250 (e.g., an optical grating, a Bragg reflector) with a coating (260), or the addition of a conductive backplane (290) and vias (280, 285). A plurality of substrate particles 120, having typically been suspended in a binder or other compound or mixture (e.g., suspended in a volatile solvent or reactive agent), such as to form a substrate (e.g., semiconductor) particle ink or suspension, are then deposited over the plurality of first conductors, typically in the corresponding channels 105, step 710, also typically through printing or coating, to form an ohmic contact between the plurality of substrate particles 120 and the one or more first conductors (which may also involve various chemical reactions, compression and/or heating, for example and without limitation).

One or more dopants (also referred to equivalently as dopant compounds) or additional organic light emitting layers for OLED implementations (as discussed above) are deposited on or over the plurality of substrate particles 120, also typically through printing or coating, which are then heated, energized or otherwise cured as needed, such as through laser or thermal annealing or alloying, to form a corresponding plurality of diodes 155, step 715, such as photovoltaic (PV) diodes, LEDs, or OLEDs. An insulating material, such as a particulate dielectric compound suspended in a polymer or binder, is then deposited on or over corresponding first portions of the plurality of diodes 155, such as about the periphery of the diodes 155 (and cured or heated), step 720, to form one or more insulators 135. Next, one or more second conductors (which may or may not be optically transmissive) are then deposited to corresponding second portions of the plurality of diodes 155, such as over the insulators 135 and about the periphery of the diodes 155, and cured (or heated), step 725, also to form ohmic contacts between the one or more second conductors (140) and the plurality of plurality of diodes 155. In exemplary embodiments, such as for an addressable display, the plurality of (transmissive) second conductors 140 are oriented substantially perpendicular to the plurality of first conductors 110. Optionally, one or more third conductors (145) are then deposited (and cured or heated) over the corresponding one or more (transmissive) second conductors, step 730.

As another option, in step 735, testing may be performed, with non-functioning or otherwise defective diodes 155 removed or disabled. For example, for PV diodes, the surface (first side) of the partially completed apparatus may be scanned with a laser or other light source and, when a region (or individual diode 155) does not provide the expected electrical response, it may be removed using a high intensity laser or other removal technique. Also for example, for light emitting diodes which have been powered on, the surface (first side) may be scanned with a photosensor, and, when a region (or individual diode 155) does not provide the expected light output and/or draws excessive current (i.e., current in excess of a predetermined amount), it also may be removed using a high intensity laser or other removal technique. Depending upon the implementation, such as depending upon how non-functioning or defective diodes 155 are removed, the testing step 735 may be performed instead after steps 740 or 745 discussed below. A plurality of lenses (150), also typically having been suspended in a polymer, a binder, or other compound or mixture to form a lensing or lens particle ink or suspension, are then place or deposited over the plurality of spherical diodes 155, step 740, also typically through printing, or a preformed lens panel comprising a plurality of lenses 150 suspended in a polymer is attached to the first side of the partially completed apparatus (such as through a lamination process), followed by any optional deposition (such as through printing) of protective coatings (and/or selected colors), step 745, and the method may end, return step 750.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. One having skill in the art will further recognize that additional or equivalent method steps may be utilized, or may be combined with other steps, or may be performed in different orders, any and all of which are within the scope of the claimed invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

As used herein for purposes of the present invention, the term "LED" and its plural form "LEDs" should be understood to include any electroluminescent diode or other type of carrier injection- or junction-based system which is capable of generating radiation in response to an electrical signal, including without limitation, various semiconductor- or carbon-based structures which emit light in response to a current or voltage, light emitting polymers, organic LEDs, and so on, including within the visible spectrum, or other spectra such as ultraviolet or infrared, of any bandwidth, or of any color or color temperature. Also as used herein for purposes of the present invention, the term "photovoltaic diode" (or PV) and its plural form "PVs" should be understood to include any photovoltaic diode or other type of carrier injection- or junction-based system which is capable of generating an electrical signal (such as a voltage) in response to incident energy (such as light or other electromagnetic waves) including without limitation, various semiconductor- or carbon-based structures which generate of provide an electrical signal in response to light, including within the visible spectrum, or other spectra such as ultraviolet or infrared, of any bandwidth or spectrum.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus, comprising:
    at least one first conductor;
    a plurality of diodes coupled to the at least one first conductor, each diode of the plurality of diodes comprising a diode substrate and having a surface, wherein fifteen percent to fifty-five percent of the surface of each diode of the plurality of diodes has a penetration layer or region extending into the diode substrate and having a first majority carrier or dopant, the remaining diode substrate having a second majority carrier or dopant;
    at least one second conductor coupled to the plurality of diodes; and
    at least one lens coupled over the plurality of diodes and any intervening layers.

2. The apparatus of claim 1, wherein the at least one lens further comprises a plurality of lenses having at least a first index of refraction, the plurality of lenses suspended in a first polymer having at least a second, different index of refraction.

3. The apparatus of claim 1, wherein the at least one first conductor further forms or comprises a base.

4. The apparatus of claim 1, wherein a mean size of the plurality of diodes is between ten microns and forty microns; and wherein the at least one lens further comprises a plurality of spherical lenses, wherein the plurality of diodes are spherical, and wherein a ratio of a mean diameter of the plurality of spherical lenses to a mean diameter of the plurality of diodes is between ten to one (10:1) and two to one (2:1).

5. The apparatus of claim 1, wherein the plurality of diodes are selected from the group consisting of: semiconductor light emitting diodes, organic light emitting diodes, polymer light emitting diodes, photovoltaic diodes, and combinations thereof.

6. The apparatus of claim 1, wherein the plurality of diodes comprise a material selected from the group consisting of: gallium nitride, gallium arsenide, silicon, and combinations thereof.

7. The apparatus of claim 1, further comprising a base coupled to the at least one first conductor, the base having a reflector or a refractor.

8. The apparatus of claim 1, further comprising a base coupled to the at least one first conductor, the base comprising:
    at least one conductive via extending between a first side and a second side of the base and coupled at the first side to the at least one first conductor; and
    a conductive backplane coupled to the at least one conductive via and coupled to or integrated with the second side of the base.

9. The apparatus of claim 1, further comprising:
    at least one insulator coupled to the plurality of diodes and comprising a plurality of inorganic dielectric particles suspended with a photoinitiator in a polymer or resin.

10. The apparatus of claim 1, further comprising a base coupled to the at least one first conductor, the base comprising a material selected from the group consisting of:
    paper, coated paper, plastic coated paper, embossed paper, fiber paper, cardboard, poster paper, poster board, wood, plastic, rubber, fabric, glass, ceramic, and combinations thereof.

11. The apparatus of claim 1, wherein the at least one first conductor comprises a metal foil or a sputtered, coated, vapor deposited or electroplated metal, metal alloy, or combination of metals, and wherein the at least one second conductor comprises an optically transmissive polymer.

12. The apparatus of claim 1, wherein the plurality of diodes are annealed, or alloyed, or chemically coupled to or within the at least one first conductor.

13. The apparatus of claim 1, further comprising:
    an electrical or electronic interface coupled electrically to the at least one first conductor and to the at least one second conductor.

14. The apparatus of claim 1, wherein the plurality of diodes are selected from the group consisting of: spherical, toroidal, cylindrical, faceted, rectangular, flat, elliptical, and combinations thereof.

15. A system, comprising:
    an electrical or electronic interface;
    a base coupled to the electrical or electronic interface;
    at least one first conductor coupled to or forming the base and electrically coupled to the electrical or electronic interface;
    a plurality of diodes coupled to the at least one first conductor, each diode of the plurality of diodes comprising a diode substrate and having a surface, wherein fifteen percent to fifty-five percent of the surface of each diode of the plurality of diodes has a penetration layer or region extending into the diode substrate and having a first majority carrier or dopant, the remaining diode substrate having a second majority carrier or dopant;
    at least one second conductor coupled to the plurality of diodes; and
    at least one lens coupled over the plurality of diodes and any intervening layers.

16. The system of claim 15, wherein the at least one lens comprises a plurality of lenses and wherein the plurality of lenses are sized and spaced relative to the plurality of diodes to the provide a mode coupling to the plurality of diodes.

17. The system of claim 15, wherein the at least one lens comprises:
a plurality of lenses suspended in a first polymer and coupled to the plurality of diodes, the plurality of lenses having at least a first index of refraction and the first polymer having at least a second, different index of refraction.

18. The system of claim 15, wherein the at least one first conductor comprises a metal foil or a sputtered, coated, vapor deposited or electroplated metal, metal alloy, or combination of metals; wherein the at least one second conductor comprises an optically transmissive polymer; and wherein the plurality of diodes are annealed, or alloyed, or chemically coupled to or within the at least one first conductor.

19. The system of claim 15, wherein the base further comprises a reflector or a refractor.

20. A system, comprising:
an electrical or electronic interface;
at least one first conductor coupled electrically to the electrical or electronic interface;
a plurality of diodes coupled to the at least one first conductor, each diode of the plurality of diodes comprising a diode substrate and having a surface, wherein fifteen percent to fifty-five percent of the surface of each diode of the plurality of diodes has a penetration layer or region extending into the diode substrate and having a first majority carrier or dopant, the remaining diode substrate having a second majority carrier or dopant, wherein a mean size of the plurality of diodes is between ten microns and forty microns;
at least one second conductor coupled to the plurality of diodes; and
a plurality of lenses coupled over the plurality of diodes and any intervening layers, the plurality of lenses comparatively sized to the plurality of diodes and spaced apart from the plurality of diodes to the provide a resonant mode coupling to the plurality of diodes.

* * * * *